(12) United States Patent
Asada et al.

(10) Patent No.: US 9,617,468 B2
(45) Date of Patent: Apr. 11, 2017

(54) LUMINESCENT COMPOSITION AND LIGHT-EMITTING ELEMENT USING SAID COMPOSITION

(75) Inventors: Kohei Asada, Tsukuba (JP); Yoshikazu Umemoto, Kawasaki (JP); Shigeru Sasaki, Tsukuba (JP)

(73) Assignee: SUMITOMO CHEMICAL COMPANY, LIMITED, Chuo-ku, Tokyo (JP)

(*) Notice: Subject to any disclaimer, the term of this patent is extended or adjusted under 35 U.S.C. 154(b) by 935 days.

(21) Appl. No.: 13/575,542

(22) PCT Filed: Jan. 27, 2011

(86) PCT No.: PCT/JP2011/051634
§ 371 (c)(1),
(2), (4) Date: Aug. 28, 2012

(87) PCT Pub. No.: WO2011/093392
PCT Pub. Date: Aug. 4, 2011

(65) Prior Publication Data
US 2013/0001534 A1    Jan. 3, 2013

(30) Foreign Application Priority Data
Jan. 29, 2010  (JP) ................ 2010-018823

(51) Int. Cl.
| | | |
|---|---|---|
| H01L 51/54 | (2006.01) | |
| C09K 11/06 | (2006.01) | |
| C08G 61/12 | (2006.01) | |
| H01L 51/00 | (2006.01) | |
| H05B 33/14 | (2006.01) | |
| H01L 51/50 | (2006.01) | |

(52) U.S. Cl.
CPC .......... *C09K 11/06* (2013.01); *C08G 61/12* (2013.01); *H01L 51/0039* (2013.01); *H01L 51/0043* (2013.01); *H05B 33/14* (2013.01); *C08G 2261/3142* (2013.01); *C08G 2261/3162* (2013.01); *C08G 2261/5222* (2013.01); *C08G 2261/95* (2013.01); *C09K 2211/1416* (2013.01); *C09K 2211/1433* (2013.01); *H01L 51/5012* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,708,130 A | 1/1998 | Woo et al. | |
| 6,355,773 B1 | 3/2002 | Weinfurtner et al. | |
| 2003/0143429 A1 | 7/2003 | Suzuki et al. | |
| 2003/0168656 A1 | 9/2003 | Kobayashi et al. | |
| 2004/0002576 A1 | 1/2004 | Oguma et al. | |
| 2004/0135131 A1 | 7/2004 | Treacher et al. | |
| 2006/0058494 A1 | 3/2006 | Busing et al. | |
| 2007/0013294 A1 | 1/2007 | Jen et al. | |
| 2007/0093643 A1* | 4/2007 | You et al. ................. 528/396 |
| 2007/0252141 A1 | 11/2007 | Negishi et al. | |
| 2008/0118773 A1 | 5/2008 | Mikami et al. | |
| 2008/0224603 A1 | 9/2008 | Hashimoto et al. | |
| 2009/0015144 A1* | 1/2009 | Takashima et al. ......... 313/504 |
| 2009/0302748 A1 | 12/2009 | Nakatani et al. | |
| 2010/0176377 A1 | 7/2010 | Fukushima et al. | |

FOREIGN PATENT DOCUMENTS

| | | | |
|---|---|---|---|
| CN | 1764693 A | 4/2006 | |
| EP | 2100940 A2 | 9/2009 | |
| JP | H5-029078 A | 2/1993 | |
| JP | 2002-317033 A | 10/2002 | |
| JP | 2003-231741 A | 8/2003 | |
| JP | 2004-2654 A | 1/2004 | |
| JP | 2004-59899 A | 2/2004 | |
| JP | 2004-206893 A | 7/2004 | |
| JP | 2004-244400 A | 9/2004 | |
| JP | 2004-277377 A | 10/2004 | |
| JP | 2004-292546 A | 10/2004 | |
| JP | 2008-56909 A | 3/2008 | |
| JP | 2008-508727 A | 3/2008 | |

(Continued)

OTHER PUBLICATIONS

Search Report issued Sep. 25, 2014 in counterpart Taiwanese Patent Application No. 100103290 with translation.
Office Action issued in counterpart Japanese Patent Application No. 2011-015468 on Mar. 18, 2014.
First Office Action issued Jun. 26, 2014 in counterpart Chinese Patent Application No. 201180007551.5 with English translation.
Seishi Tokito et al., "Organic EL Display", Ohmsha, Ltd., Aug. 20, 2004, pp. 111-114 with partial translation.
Mitsunori Suzuki and Shizuo Tokito, "Monthly Display", vol. 9, No. 9, 2002, pp. 47-51 with partial translation.
Hiroyuki Sasabe, "Conducting Polymer Materials", CMC Publishing Co., Ltd. 1983, pp. 30-35 with partial translation.

(Continued)

*Primary Examiner* — Andrew K Bohaty
(74) *Attorney, Agent, or Firm* — Sughrue Mion, PLLC

(57) ABSTRACT

A luminescent composition comprising a luminescent organic compound and a conjugated polymer compound having a luminescence maximum further toward the short wavelength end than the luminescence maximum of the luminescent organic compound at 350 nm to 500 nm, and satisfying the following formula (1);

$$f(g,h) \times w \geq 0.04 \tag{1}$$

in the formula,
f(g, h) represents the convolution integral of the emission spectrum of the conjugated polymer compound and the gram absorption coefficient spectrum of the luminescent organic compound (L/g·cm) in the range of 200 nm to 800 nm, in 1 nm steps, and
w represents the content of the luminescent organic compound where the total content of the luminescent organic compound and conjugated polymer compound in the luminescent composition is defined as 1 part by mass.

12 Claims, 2 Drawing Sheets

(56) References Cited

FOREIGN PATENT DOCUMENTS

| WO | 98/33863 A1 | 8/1998 |
|---|---|---|
| WO | 99/54385 A1 | 10/1999 |
| WO | 00/46321 A1 | 8/2000 |
| WO | 01/08230 A1 | 2/2001 |
| WO | 02/26856 A1 | 4/2002 |
| WO | 02/077060 A1 | 10/2002 |
| WO | 2004/037887 A2 | 5/2004 |

OTHER PUBLICATIONS

Yukio Kobayashi, "New Applications of Conducting Polymers", CMC Publishing Co., Ltd. Apr. 30, 2004, pp. 51-57, with partial translation.

Katsumi Yoshino, "Fundamentals and Applications of Conducting Polymers", Industrial Publishing & Consulting, Inc., Jul. 25, 1988, pp. 6-19, with partial translation.

Susumu Yoshimura, "Conducting Polymer", Kyoritsu Shuppan Co., Ltd., Nov. 11, 1987, pp. 10-13 with partial translation.

Toshihiro Oonishi and Tamami Oyama, "Polymer EL materials", Kyoritsu Shuppa N Co., Ltd., Dec. 25, 2004, pp. 33-35 with partial translation.

Seishi Tokito et al., "Organic EL Display", Ohmsha, Ltd., Aug. 20, 2004, p. 107 with partial translation.

Yuichiro Kawamura and Chihaya Adachi, "Monthly Display", vol. 9, No. 9, 2003, pp. 26-30 with partial translation.

A.A. Shoustikov et al., "Electroluminescence Color Tuning by Dye Doping in Organic Light-Emitting Diodes", IEEE Journal of Selected Topics in Quantum Electronics, vol. 4, No. 1, Jan./Feb. 1998, pp. 3-13.

Translation of the International Preliminary Report on Patentability and Written Opinion issued Sep. 27, 2012 in International Appln. No. PCT/JP2011/051634 to Sumitomo Chemical Co., Ltd.

Extended European Search Report issued Jun. 2, 2014 in counterpart European Patent Application No. 11737103.9.

Tae-Ho Kim, et al., "White-Light-Emitting Diodes Based on Iridium Complexes via Efficient Energy Transfer from a Conjugated Polymer", Advanced Functional Materials, Wiley-VCH Verlag GmbH & Co. KGaA, Weinheim, DE, vol. 16, No. 5, 2006, pp. 611-617 (XP-001241747).

Michael D. McGehee, et al., "Narrow Bandwidth Luminescence from Blends with Energy Transfer from Semiconducting Conjugated Polymers to Europium Complexes", Advanced Materials, Wiley-VCH Verlag GmbH, Weinheim, DE, vol. 11, No. 16, 1999, pp. 1349-11354 (XP-55118397).

Jingsong Huang, et al., "Violet-blue electroluminescent diodes utilizing conjugated polymer blends", Synthetic Metals, vol. 87, No. 2, pp. 105-108 (XP55118333), Date Mar. 31, 1997.

Office Action issued May 19, 2016 in counterpart European Patent Application No. 11 737 103.9.

\* cited by examiner

LUMINESCENT COMPOSITION AND LIGHT-EMITTING ELEMENT USING SAID COMPOSITION

CROSS REFERENCE TO RELATED APPLICATIONS

This application is a National Stage of International Application No. PCT/JP2011/051634 filed Jan. 27, 2011, claiming priority based on Japanese Patent Application No. 2010-018823 filed Jan. 29, 2010, the contents of all of which are incorporated herein by reference in their entirety.

TECHNICAL FIELD

The present invention relates to a luminescent composition, and to a liquid composition comprising it, a film, a light-emitting device, a surface light source, a lighting, and a method for producing a light-emitting device.

BACKGROUND ART

Much attention has been focused on organic EL displays employing organic EL elements, as next-generation displays. Such organic EL elements are provided with organic layers such as luminescent layers and charge transport layers. The organic layers of organic EL elements include those composed of low molecular organic materials, those composed of high molecular organic materials, and those composed of compositions comprising both. When a high molecular organic material is used as the main material it is possible to form a homogeneous film by employing a coating method such as ink-jet or spin coating, and this is advantageous for fabrication of large-sized displays (Patent document 1 and Patent document 2).

CITATION LIST

Patent Literature

[Patent document 1] Japanese Unexamined Patent Application Publication No. 2008-56909
[Patent document 2] International Patent Publication No. WO99/54385

SUMMARY OF INVENTION

Technical Problem

The conventional high molecular organic materials, however, and especially materials that emit blue luminescence, have not had adequate luminance life when used in light-emitting devices.

It is therefore an object of the present invention to provide a luminescent composition that can increase the luminance life of a light-emitting device by being included in the luminescent layer of the light-emitting device. It is another object of the invention to provide a liquid composition and a film comprising the luminescent composition, a light-emitting device comprising the film, and a surface light source and lighting comprising the light-emitting device. It is yet another object of the invention to provide a method for producing a light-emitting device with increased luminance life.

Solution to Problem

With the aim of solving the problems mentioned above, the present inventors have conducted research on light-emitting devices with luminescent layers that emit light by recombination of holes and electrons, and have found that, in a luminescent layer comprising a compound that functions for charge transport and recombination between electrons and holes, and a compound that functions for luminescence, a correlation exists between the size of the overlap integral between the emission spectrum of the former compound and the absorption spectrum of the latter compound, and the luminance life of the light-emitting device, and the invention has been completed upon this finding.

The invention provides a luminescent composition comprising a luminescent organic compound and a conjugated polymer compound having a luminescence maximum further toward the short wavelength end than the luminescence maximum of the luminescent organic compound at 350 nm to 500 nm, and satisfying the following formula (1).

$$f(g,h) \times w \geq 0.04 \quad (1)$$

[In the formula, f(g, h) represents the convolution integral of the emission spectrum of the conjugated polymer compound and the gram absorption coefficient spectrum of the luminescent organic compound (L/g·cm) in the range of 200 nm to 800 nm, in 1 nm steps, and w represents the content of the luminescent organic compound where the total content of the luminescent organic compound and conjugated polymer compound in the luminescent composition is defined as 1 part by mass. For the emission spectrum, the emission spectrum obtained by excitation of the conjugated polymer compound with 360 nm light was normalized with the maximum luminescence intensity at 350 nm to 500 nm as 1.]

The luminescent composition of the invention comprises a conjugated polymer compound as the compound functioning for charge transport and recombination of electrons and holes, and a luminescent organic compound as the compound functioning for luminescence. With the luminescent composition of the invention having such a construction, it is possible for a luminescent organic compound to efficiently receive excitation energy formed by holes and electrons recombined in a conjugated polymer compound. Thus, a light-emitting device provided with a luminescent layer comprising the luminescent composition has increased luminance life.

The conjugated polymer compound in the luminescent composition of the invention preferably has a repeating unit represented by the following formula (2). Such a luminescent composition is more suitable as a material to compose a luminescent layer in a light-emitting device, and by adding the luminescent composition to the aforementioned luminescent layer, it is possible to increase the luminous efficiency of the light-emitting device and further increase the luminance life.

[Chemical Formula 1]

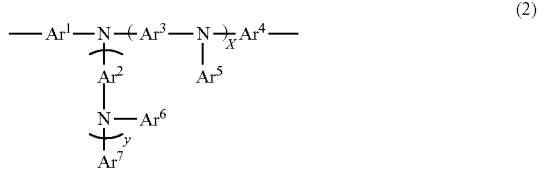

(2)

[In the formula, $Ar^1$, $Ar^2$, $Ar^3$ and $Ar^4$ each independently represent an optionally substituted arylene group or an optionally substituted divalent heterocyclic group, $Ar^5$, $Ar^6$ and $Ar^7$ each independently represent an optionally substituted aryl group or an optionally substituted monovalent heterocyclic group, and x and y each independently represent 0 or 1. This is with the proviso that x+y is 0 or 1.]

The conjugated polymer compound in the luminescent composition of the invention also preferably has a repeating unit represented by the following formula (3). Such a luminescent composition can yield a luminescent layer with high luminescent quantum yield.

[Chemical Formula 2]

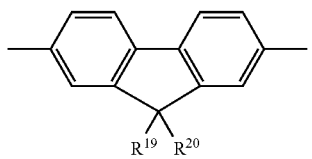

(3)

[In the formula, $R^{19}$ and $R^{20}$ each independently represent an optionally substituted alkyl group, an optionally substituted aryl group or an optionally substituted monovalent heterocyclic group.]

Also, in the luminescent composition of the invention, the luminescence maximum, representing the maximum luminescence intensity of the conjugated polymer compound, is preferably no longer than 440 nm. Such a luminescent composition will allow the excitation energy formed when holes and electrons have been recombined in the conjugated polymer compound to be efficiently delivered to the luminescent organic compound, to provide a luminescent layer with satisfactory energy efficiency.

Also the luminescent organic compound in the luminescent composition of the invention preferably exhibits blue luminescence with a highest luminescence maximum between 420 and 480 nm. A light-emitting device provided with a luminescent layer comprising such a luminescent composition will more easily allow production of blue pixels suitable for full-color display, and will result in satisfactory luminous efficiency.

The blue luminescence of the luminescent composition of the invention is preferably blue fluorescence.

The luminescent organic compound in the luminescent composition of the invention preferably has a fused-ring structure of 3 or more aromatic hydrocarbon rings. Such a luminescent organic compound has excellent luminous efficiency, and therefore a luminescent composition comprising such a luminescent organic compound allows a light-emitting device with excellent luminous efficiency to be provided.

In addition, the luminescent composition of the invention preferably has a luminescent organic compound content of 0.002 to 0.30 part by mass, where the total content of the luminescent organic compound and the conjugated polymer compound is defined as 1 part by mass. Such a luminescent composition will allow the excitation energy produced in the conjugated polymer compound to be efficiently received by the luminescent organic compound. Therefore, adding the luminescent composition to the luminescent layer can increase the luminous efficiency of the light-emitting device and further increase the luminance life.

The invention still further provides a liquid composition comprising the aforementioned luminescent composition and a solvent or dispersing medium for the luminescent composition. Such a liquid composition allows easy production of a film comprising the luminescent composition.

The invention still further provides a film comprising the luminescent composition. Such a film can be suitably used as a luminescent layer comprising the luminescent composition.

The invention still further provides a light-emitting device provided with an anode, a cathode, and a layer comprising the luminescent composition, formed between them. Such a light-emitting device provided with a layer comprising the luminescent composition as a luminescent layer exhibits excellent luminance life.

The invention still provides a surface light source and lighting employing the light-emitting device. Such a surface light source or lighting employing a light-emitting device with excellent luminance life has excellent durability and energy efficiency.

The invention still further provides a method for producing a light-emitting device with increased luminance life, wherein a luminescent composition comprising a luminescent organic compound and a conjugated polymer compound having a luminescence maximum further toward the short wavelength end than the luminescence maximum of the luminescent organic compound at 350 nm to 500 nm, and satisfying the following formula (1), is added to a luminescent layer in the aforementioned light-emitting device.

$$f(g,h) \times w \geq 0.04 \qquad (1)$$

[In the formula, f(g, h) represents the convolution integral of the emission spectrum of the conjugated polymer compound and the gram absorption coefficient spectrum of the luminescent organic compound (L/g·cm) in the range of 200 nm to 800 nm, in 1 nm steps, and w represents the content of the luminescent organic compound where the total content of the luminescent organic compound and conjugated polymer compound in the luminescent composition is defined as 1 part by mass. For the emission spectrum, the emission spectrum obtained by excitation of the conjugated polymer compound with 360 nm light was normalized with the maximum luminescence intensity at 350 nm to 500 nm as 1.]

The invention may also be interpreted as being a method of increasing the luminance life of a light-emitting device, wherein a luminescent composition comprising a luminescent organic compound and a conjugated polymer compound having a luminescence maximum further toward the short wavelength end than the luminescence maximum of the luminescent organic compound at 350 nm to 500 nm, and satisfying formula (1), is added to a luminescent layer in the aforementioned light-emitting device.

The invention may still further be interpreted as being a method of selecting a luminescent composition to obtain a light-emitting device with excellent luminance life, wherein a luminescent composition which comprises a luminescent organic compound and a conjugated polymer compound having a luminescence maximum further toward the short wavelength end than the luminescence maximum of the luminescent organic compound at 350 nm to 500 nm, and satisfying formula (1), is selected as the luminescent composition.

Advantageous Effects of Invention

According to the invention it is possible to provide a luminescent composition that can increase the luminance life of a light-emitting device by being included in the luminescent layer of the light-emitting device. According to the invention it is also possible to provide a liquid composition and a film comprising the luminescent composition, a light-emitting device comprising the film, and a surface light source and lighting comprising the light-emitting device. According to the invention it is also possible to provide a method for producing a light-emitting device with increased luminance life.

DESCRIPTION OF EMBODIMENTS

Figure 1:
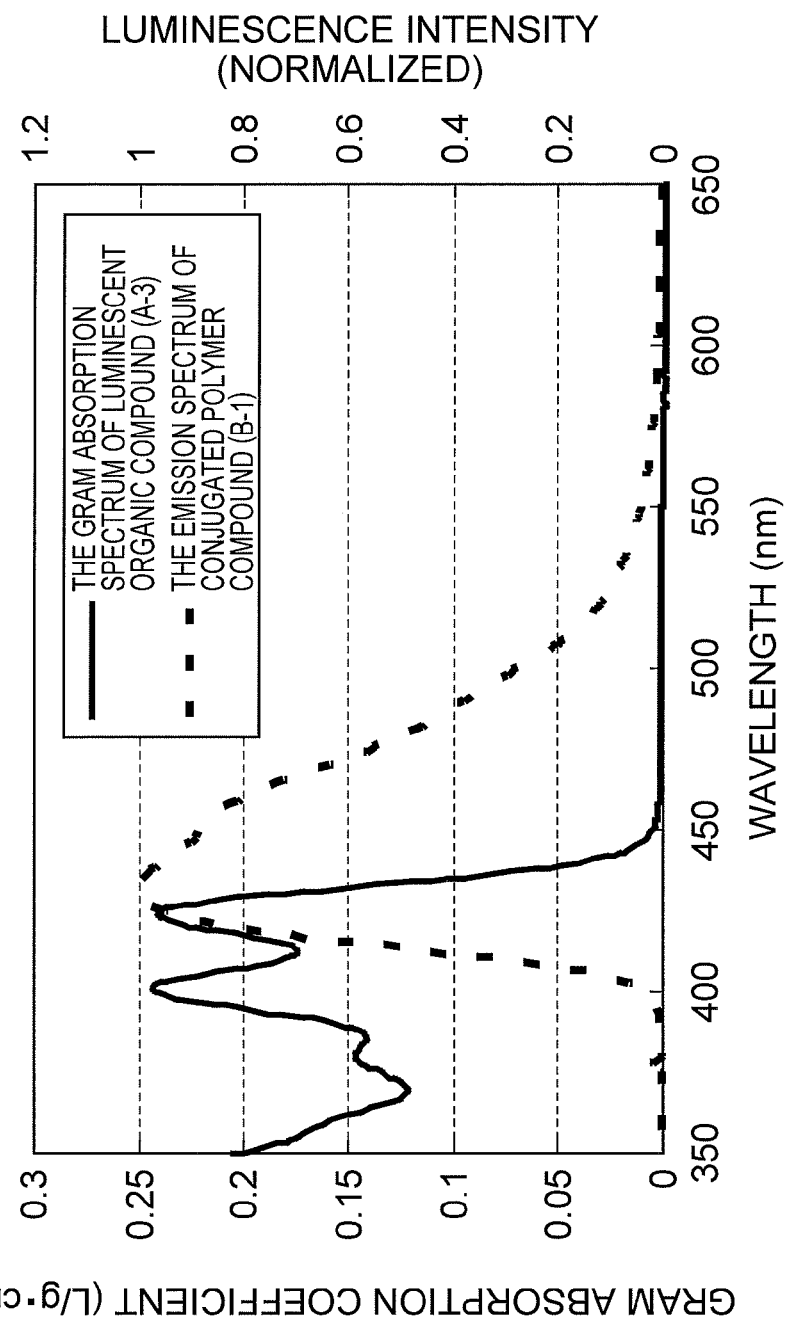
FIG. 1 is graph showing the gram absorption coefficient spectrum of luminescent organic compound (A-3) and the emission spectrum of conjugated polymer compound (B-1), obtained in Example 1.

Preferred embodiments of the invention will now be described in detail. In the following explanation, methyl groups may be indicated by "Me", and phenyl groups may be indicated by "Ph".

<Explanation of Terms>

The terms used throughout the present specification will now be explained with concrete examples where necessary.

Halogen atoms include a fluorine atom, a chlorine atom, a bromine atom and an iodine atom.

The term "$C_x$-$C_y$" (where x and y are positive integers such that x<y) indicates that the number of carbon atoms of the partial structure corresponding to the functional group name immediately following the term is between x and y. When an organic group immediately following "$C_x$-$C_y$" is an organic group named with a combination of multiple functional group names (for example, a $C_x$-$C_y$ alkoxyphenyl group), the number of carbon atoms of the partial structure corresponding to the functional group name among the multiple functional group names that immediately follows "$C_x$-$C_y$" (for example, alkoxy), is between x and y. For example, "$C_1$-$C_{12}$ alkyl group" indicates an alkyl group with 1-12 carbon atoms, and "$C_1$-$C_{12}$ alkoxyphenyl group" indicates a phenyl group having "an alkoxy group with 1-12 carbon atoms".

An alkyl group may have a substituent, and may be a straight-chain alkyl group, a branched alkyl group or a cyclic alkyl group (cycloalkyl group). An alkyl group is preferably a straight-chain alkyl group or a cycloalkyl group, but it is preferably an unsubstituted alkyl group or an alkyl group substituted with a halogen atom or the like.

Substituents include alkyl groups, alkoxy groups, alkylthio groups, aryl groups, aryloxy groups, arylthio groups, alkenyl groups, alkynyl groups, amino groups, silyl groups, halogen atoms, acyl groups, acyloxy groups, monovalent heterocyclic groups, heterocyclothio groups, imine residues, amide groups, acid imide groups, carboxyl groups, a nitro group, a cyano group and the like (hereunder, "substituent" refers to the same groups unless otherwise specified).

Examples of optionally substituted alkyl groups include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group and a perfluorooctyl group.

The number of carbon atoms for an alkyl group is preferably 1-20, more preferably 1-15 and even more preferably 1-12. Examples of $C_1$-$C_{12}$ alkyl groups include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group and a dodecyl group.

An alkoxy group may have a substituent, and may be a straight-chain alkoxy group, a branched alkoxy group or a cyclic alkoxy group (a cycloalkoxy group). An alkoxy group is preferably a straight-chain alkoxy group or a cycloalkoxy group, but it is preferably an unsubstituted alkoxy group or an alkoxy group substituted with a halogen atom, an alkoxy group or the like.

Examples of optionally substituted alkoxy groups include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy group, a perfluorobutoxy group, a perfluorohexyloxy group, a perfluorooctyloxy group, a methoxymethyloxy group and a 2-methoxyethyloxy group.

The number of carbon atoms for an alkoxy group is preferably 1-20, more preferably 1-15 and even more preferably 1-12. Examples $C_1$-$C_{12}$ alkoxy groups include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group and a dodecyloxy group.

An alkylthio group may have a substituent, and may be a straight-chain alkylthio group, a branched alkylthio group or a cyclic alkylthio group (cycloalkylthio group). An alkylthio group is preferably a straight-chain alkylthio group or a cycloalkylthio group, but it is preferably an unsubstituted alkylthio group or an alkylthio group substituted with a halogen atom or the like.

Examples of optionally substituted alkylthio groups include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a dodecylthio group and a trifluoromethylthio group.

The number of carbon atoms for an alkylthio group is preferably 1-20, more preferably 1-15 and even more preferably 1-12. Examples of $C_1$-$C_{12}$ alkylthio groups include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group and a dodecylthio group.

An aryl group is an atomic group remaining after removing 1 hydrogen bonded to a carbon atom composing the aromatic ring of an aromatic hydrocarbon, and it may be optionally substituted. An aryl group is preferably an unsubstituted aryl group or an aryl group substituted with a halogen atom, alkoxy group, alkyl group or the like. Aryl groups include those with fused rings, and those with two or more benzene rings and/or fused rings bonded via a single bond or divalent organic group (for example, an alkylene group such as vinylene). The number of carbon atoms for an aryl group is preferably 6-60, more preferably 6-48 and even more preferably 6-30.

Examples of optionally substituted aryl groups include a phenyl group, $C_1$-$C_{12}$ alkoxyphenyl groups, $C_1$-$C_{12}$ alkylphenyl groups, a 1-naphthyl group, a 2-naphthyl group, a 1-anthracenyl group, a 2-anthracenyl group, a 9-anthracenyl group, a 2-fluorenyl group, a pentafluorophenyl group, a biphenylyl group, $C_1$-$C_{12}$ alkoxybiphenylyl groups and $C_1$-$C_{12}$ alkylbiphenylyl groups, among which a phenyl group, $C_1$-$C_{12}$ alkoxyphenyl groups, $C_1$-$C_{12}$ alkylphenyl groups, a biphenylyl group, $C_1$-$C_{12}$ alkoxybiphenylyl groups and $C_1$-$C_{12}$ alkylbiphenylyl groups are preferred.

Examples of $C_1$-$C_{12}$ alkoxyphenyl groups include a methoxyphenyl group, an ethoxyphenyl group, a propyloxyphenyl group, an isopropyloxyphenyl group, a butyloxyphenyl group, an isobutyloxyphenyl group, a tert-butyloxyphenyl group, a pentyloxyphenyl group, a hexyloxyphenyl group and an octyloxyphenyl group.

Examples of $C_1$-$C_{12}$ alkylphenyl groups include a methylphenyl group, an ethylphenyl group, a dimethylphenyl group, a propylphenyl group, a mesityl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group and a dodecylphenyl group.

An aryloxy group may have a substituent, but it is preferably an unsubstituted aryloxy group or an aryloxy group substituted with a halogen atom, alkoxy group, alkyl group or the like. The number of carbon atoms for an aryloxy group is preferably 6-60, more preferably 6-48 and even more preferably 6-30.

Examples of optionally substituted aryloxy groups include a phenoxy group, $C_1$-$C_{12}$ alkoxyphenoxy groups, $C_1$-$C_{12}$ alkylphenoxy groups, a 1-naphthyloxy group, a 2-naphthyloxy group and a pentafluorophenyloxy group, among which $C_1$-$C_{12}$ alkoxyphenoxy groups and $C_1$-$C_{12}$ alkylphenoxy groups are preferred.

Examples of $C_1$-$C_{12}$ alkoxyphenoxy groups include a methoxyphenoxy group, an ethoxyphenoxy group, a propyloxyphenoxy group, an isopropyloxyphenoxy group, a butyloxyphenoxy group, an isobutyloxyphenoxy group, a tert-butyloxyphenoxy group, a pentyloxyphenoxy group, a hexyloxyphenoxy group and an octyloxyphenoxy group.

Examples of $C_1$-$C_{12}$ alkylphenoxy groups include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group and a dodecylphenoxy group.

An arylthio group may have a substituent, but it is preferably an unsubstituted arylthio group or an arylthio group substituted with a halogen atom, alkoxy group, alkyl group or the like. The number of carbon atoms for an arylthio group is preferably 6-60, more preferably 6-48 and even more preferably 6-30. Examples of optionally substituted arylthio groups include a phenylthio group, $C_1$-$C_{12}$ alkoxyphenylthio groups, $C_1$-$C_{12}$ alkylphenylthio groups, a 1-naphthylthio group, a 2-naphthylthio group and a pentafluorophenylthio group.

An arylalkyl group may have a substituent, but it is preferably an unsubstituted arylalkyl group or an arylalkyl group substituted with a halogen atom, alkoxy group, alkyl group or the like. The number of carbon atoms for an arylalkyl group is preferably 7-60, more preferably 7-48 and even more preferably 7-30. Examples of optionally substituted arylalkyl groups include phenyl-$C_1$-$C_{12}$ alkyl groups, $C_1$-$C_{12}$ alkoxyphenyl-$C_1$-$C_{12}$ alkyl groups, $C_1$-$C_{12}$ alkylphenyl-$C_1$-$C_{12}$ alkyl groups, 1-naphthyl-$C_1$-$C_{12}$ alkyl groups and 2-naphthyl-$C_1$-$C_{12}$ alkyl groups.

An arylalkoxy group may have a substituent, but it is preferably an unsubstituted arylalkoxy group or an arylalkoxy group substituted with a halogen atom, alkoxy group, alkyl group or the like. The number of carbon atoms for an arylalkoxy group is preferably 7-60, more preferably 7-48 and even more preferably 7-30. Examples of optionally substituted arylalkoxy groups include phenyl-$C_1$-$C_{12}$ alkoxy groups, $C_1$-$C_{12}$ alkoxyphenyl-$C_1$-$C_{12}$ alkoxy groups, $C_1$-$C_{12}$ alkylphenyl-$C_1$-$C_{12}$ alkoxy groups, 1-naphthyl-$C_1$-$C_{12}$ alkoxy groups and 2-naphthyl-$C_1$-$C_{12}$ alkoxy groups.

An arylalkylthio group may have a substituent, but it is preferably an unsubstituted arylalkylthio group or an arylalkylthio group substituted with a halogen atom, alkoxy group, alkyl group or the like. The number of carbon atoms for an arylalkylthio group is preferably 7-60, more preferably 7-48 and even more preferably 7-30. Examples of optionally substituted arylalkylthio groups include phenyl-$C_1$-$C_{12}$ alkylthio groups, $C_1$-$C_{12}$ alkoxyphenyl-$C_1$-$C_{12}$ alkylthio groups, $C_1$-$C_{12}$ alkylphenyl-$C_1$-$C_{12}$ alkylthio groups, 1-naphthyl-$C_1$-$C_{12}$ alkylthio groups and 2-naphthyl-$C_1$-$C_{12}$ alkylthio groups.

An alkenyl group may have a substituent, and may be a straight-chain alkenyl group, a branched alkenyl group or a cyclic alkenyl group. The number of carbon atoms for an alkenyl group is preferably 2-20, more preferably 2-15 and even more preferably 2-10. Examples of alkenyl groups include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group and a 1-octenyl group.

An arylalkenyl group may have a substituent, but it is preferably an unsubstituted arylalkenyl group or an arylalkenyl group substituted with a halogen atom, alkoxy group, alkyl group or the like. The number of carbon atoms for an arylalkenyl group is preferably 8-60, more preferably 8-48 and even more preferably 8-30. Examples of optionally substituted arylalkenyl groups include phenyl-$C_2$-$C_{12}$ alkenyl groups, $C_1$-$C_{12}$ alkoxyphenyl-$C_2$-$C_{12}$ alkenyl groups, $C_1$-$C_{12}$ alkylphenyl-$C_2$-$C_{12}$ alkenyl groups, 1-naphthyl-$C_2$-$C_{12}$ alkenyl groups and 2-naphthyl-$C_2$-$C_{12}$ alkenyl groups, among which $C_1$-$C_{12}$ alkoxyphenyl-$C_2$-$C_{12}$ alkenyl groups and $C_1$-$C_{12}$ alkylphenyl-$C_2$-$C_{12}$ alkenyl groups are preferred. Examples of $C_2$-$C_{12}$ alkenyl groups include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group and a 1-octenyl group.

An alkynyl group may have a substituent, and may be a straight-chain alkynyl group, a branched alkynyl group or a cyclic alkynyl group. The number of carbon atoms for an alkynyl group is preferably 2-20, more preferably 2-15 and even more preferably 2-10. Examples of alkynyl groups include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group and a 1-octynyl group.

An arylalkynyl group may have a substituent, but it is preferably an unsubstituted arylalkynyl group or an arylalkynyl group substituted with a halogen atom, alkoxy group, alkyl group or the like. The number of carbon atoms for an arylalkynyl group is preferably 8-60, more preferably 8-48 and even more preferably 8-30. Examples of optionally substituted arylalkynyl groups include phenyl-$C_2$-$C_{12}$ alkynyl groups, $C_1$-$C_{12}$ alkoxyphenyl-$C_2$-$C_{12}$ alkynyl groups, $C_1$-$C_{12}$ alkylphenyl-$C_2$-$C_{12}$ alkynyl groups, 1-naphthyl-$C_2$-$C_{12}$ alkynyl groups and 2-naphthyl-$C_2$-$C_{12}$ alkynyl groups, among which $C_1$-$C_{12}$ alkoxyphenyl-$C_2$-$C_{12}$ alkynyl groups and $C_1$-$C_{12}$ alkylphenyl-$C_2$-$C_{12}$ alkynyl groups are preferred. Examples of $C_2$-$C_{12}$ alkynyl groups include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group and a 1-octynyl group.

A monovalent heterocyclic group is an atomic group remaining after removing one hydrogen from a heterocyclic compound, and it may be optionally substituted. A monovalent heterocyclic group is preferably an unsubstituted monovalent heterocyclic group or a monovalent heterocyclic group substituted with a substituent such as alkyl group. The number of carbon atoms in a monovalent heterocyclic group is preferably 4-60, more preferably 4-30 and even more preferably 4-20, not including the number of carbon atoms of the substituents. A heterocyclic compound is an organic compound having a cyclic structure, wherein the elements composing the ring include not only carbon atoms but also a heteroatom such as an oxygen atom, sulfur atom, nitrogen atom, phosphorus atom, boron atom, silicon atom, selenium atom, tellurium atom or arsenic atom. Examples of optionally substituted monovalent heterocyclic groups include a thienyl group, $C_1$-$C_{12}$ alkylthienyl groups, a pyrrolyl group, a furyl group, a pyridyl group, $C_1$-$C_{12}$ alkylpyridyl groups, a pyridazinyl group, a pyrimidinyl group, a pyrazinyl group, a triazinyl group, a pyrrolidyl group, a piperidyl group, a quinolyl group and an isoquinolyl group, among which a thienyl group, $C_1$-$C_{12}$ alkylthienyl groups, a pyridyl group and $C_1$-$C_{12}$ alkylpyridyl groups are preferred. Monovalent aromatic heterocyclic groups are preferred as monovalent heterocyclic groups.

A heterocyclothio group is a group in which a hydrogen of a mercapto group is substituted with a monovalent heterocyclic group, and it may be optionally substituted. Examples of heterocyclothio groups include heteroarylthio groups such as a pyridylthio group, a pyridazinylthio group, a pyrimidinylthio group, a pyrazinylthio group and a triazinylthio group.

An amino group may have a substituent, but preferably it is an unsubstituted amino group or an amino group substituted with one or more substituents selected from the group consisting of alkyl groups, aryl groups, arylalkyl groups and monovalent heterocyclic groups (hereunder referred to as "substituted amino group"). The substituent may be further substituted (hereunder, substituents that further substitute substituents with organic groups may be referred to as "secondary substituents"). The number of carbon atoms in a substituted amino group is preferably 1-60, more preferably 2-48 and even more preferably 2-40, not including the number of carbon atoms of the secondary substituents.

Examples of substituted amino groups include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, $C_1$-$C_{12}$ alkoxyphenylamino groups, bis($C_1$-$C_{12}$ alkoxyphenyl)amino groups, $C_1$-$C_{12}$ alkylphenylamino groups, bis($C_1$-$C_{12}$ alkylphenyl)amino groups, a 1-naphthylamino group, a 2-naphthylamino group, a pentafluorophenylamino group, a pyridylamino group, a pyridazinylamino group, a pyrimidinylamino group, a pyrazinylamino group, a triazinylamino group, phenyl-$C_1$-$C_{12}$ alkylamino groups, $C_1$-$C_{12}$ alkoxyphenyl-$C_1$-$C_{12}$ alkylamino groups, di($C_1$-$C_{12}$ alkoxyphenyl-$C_1$-$C_{12}$ alkyl)amino groups, $C_1$-$C_{12}$ alkylphenyl-$C_1$-$C_{12}$ alkylamino groups, di($C_1$-$C_{12}$ alkylphenyl-$C_1$-$C_{12}$ alkyl) amino groups, 1-naphthyl-$C_1$-$C_{12}$ alkylamino groups and 2-naphthyl-$C_1$-$C_{12}$ alkylamino groups.

A silyl group may have a substituent, but preferably it is an unsubstituted silyl group or a silyl group substituted with 1 to 3 substituents selected from the group consisting of alkyl groups, aryl groups, arylalkyl groups and monovalent heterocyclic groups (hereunder referred to as "substituted silyl group"). The substituents may have secondary substituents. The number of carbon atoms in a substituted silyl group is preferably 1-60, more preferably 3-48 and even more preferably 3-40, not including the number of carbon atoms of the secondary substituents.

Examples of substituted silyl groups include a trimethylsilyl group, a triethylsilyl group, a tripropylsilyl group, a tri-isopropylsilyl group, a dimethyl-isopropylsilyl group, a diethyl-isopropylsilyl group, a tert-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, a dodecyldimethylsilyl group, phenyl-$C_1$-$C_{12}$ alkylsilyl groups, $C_1$-$C_{12}$ alkoxyphenyl-$C_1$-$C_{12}$ alkylsilyl groups, $C_1$-$C_{12}$ alkylphenyl-$C_1$-$C_{12}$ alkylsilyl groups, 1-naphthyl-$C_1$-$C_{12}$ alkylsilyl groups, 2-naphthyl-$C_1$-$C_{12}$ alkylsilyl groups, phenyl-$C_1$-$C_{12}$ alkyldimethylsilyl groups, a triphenylsilyl group, a tri-p-xylylsilyl group, a tribenzylsilyl group, a diphenylmethylsilyl group, a tert-butyldiphenylsilyl group and a dimethylphenylsilyl group.

An acyl group may have a substituent, but it is preferably an unsubstituted acyl group or an acyl group substituted with a halogen atom or the like. The number of carbon atoms for an acyl group is preferably 2-20, more preferably 2-18 and even more preferably 2-16. Examples of acyl groups include an acetyl group, a propionyl group, a butyryl group, an isobutyryl group, a pivaloyl group, a benzoyl group, a trifluoroacetyl group and a pentafluorobenzoyl group.

An acyloxy group may have a substituent, but it is preferably an unsubstituted acyloxy group or an acyloxy group substituted with a halogen atom or the like. The number of carbon atoms for an acyloxy group is preferably 2-20, more preferably 2-18 and even more preferably 2-16. Examples of acyloxy groups include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

An imine residue is a residue remaining after removing one hydrogen in the structure of an imine compound having a structure represented by the formula H—N=C< or the formula —N=CH—. Examples of such imine compounds include aldimine, ketimine, or compounds in which a hydrogen atom bonded to the nitrogen atom in an aldimine is substituted with an alkyl group, an aryl group, an arylalkyl group, an arylalkenyl group, an arylalkynyl group or the like. The number of carbon atoms for an imine residue is preferably 2-20, more preferably 2-18 and even more preferably 2-16.

Examples of imine residues include groups represented by the formula —CR$^X$=N—R$^Y$ or the formula —N=C(R$^Y$)$_2$ (wherein R$^X$ represents hydrogen atom, an alkyl group, an aryl group, an arylalkyl group, an arylalkenyl group or an arylalkynyl group, R$^Y$ represents an alkyl group, an aryl group, an arylalkyl group, an arylalkenyl group or an arylalkynyl group, with the proviso that when 2 R$^Y$ groups are present they may be the same or different, and two R$^Y$ groups may be bonded together to form a ring as a divalent group such as, for example, a C2-18 alkylene group such as an ethylene group, a trimethylene group, a tetramethylene group, a pentamethylene group or a hexamethylene group). Specific examples of imine residues include groups represented by the following structural formulas.

[Chemical Formula 3]

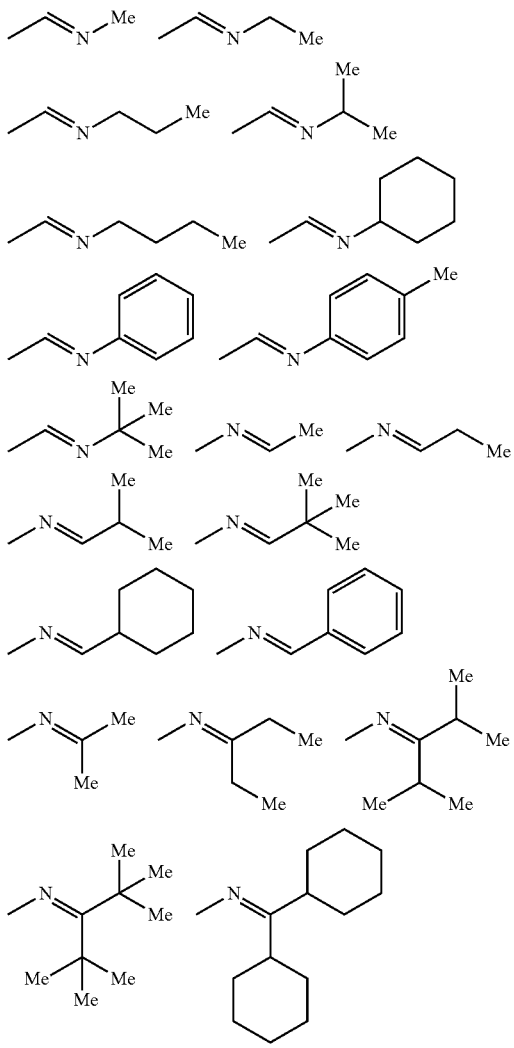

-continued

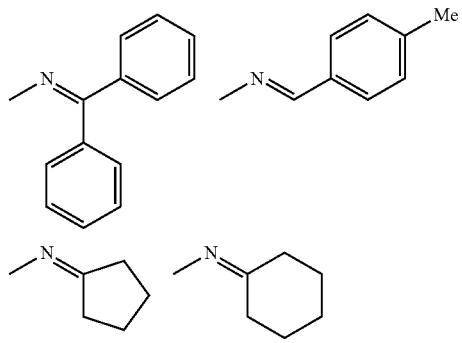

An amide group may have a substituent, but it is preferably an unsubstituted amide group or an amide group substituted with a halogen atom or the like. The number of carbon atoms for an amide group is preferably 2-20, more preferably 2-18 and even more preferably 2-16. Examples of amide groups include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group and a dipentafluorobenzamide group.

An acid imide group is a residue obtained by removing one hydrogen atom bonded to the nitrogen atom of an acid imide. The number of carbon atoms for an acid imide group is preferably 4-20, more preferably 4-18 and even more preferably 4-16. Examples of acid imide groups include the following groups.

[Chemical Formula 4]

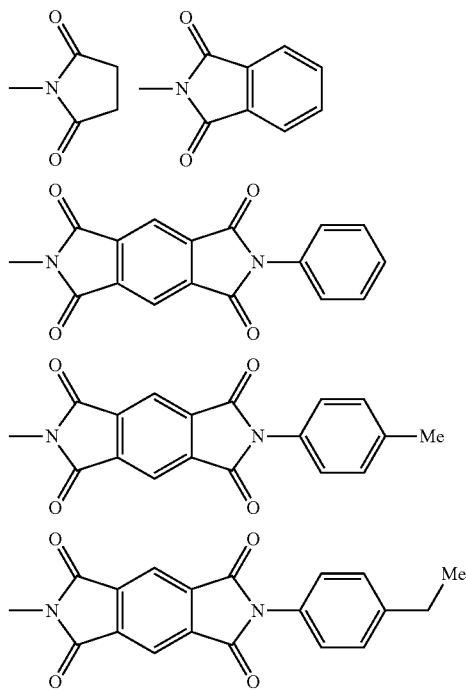

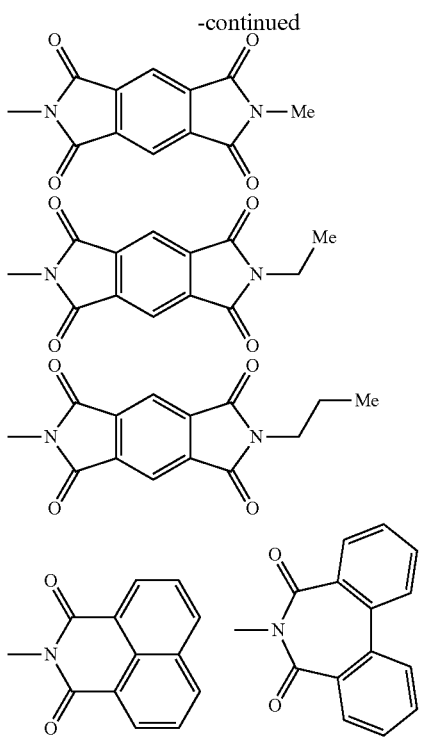

An arylene group is an atomic group resulting from removing 2 hydrogens from an aromatic hydrocarbon, and the term includes groups with independent benzene rings and fused rings. The number of carbon atoms for an arylene group is preferably 6-60, more preferably 6-48, even more preferably 6-30 and most preferably 6-18. This number of carbon atoms does not include the number of carbon atoms of substituents. Arylene groups include phenylene groups such as a 1,4-phenylene group, a 1,3-phenylene group and a 1,2-phenylene group; biphenylylene groups such as a 2,7-biphenylylene group and a 3,6-biphenylylene group; naphthalenediyl groups such as a 1,4-naphthalenediyl group, a 1,5-naphthalenediyl group and a 2,6-naphthalenediyl group; anthracenediyl groups such as a 1,4-anthracenediyl group, a 1,5-anthracenediyl group, a 2,6-anthracenediyl group and a 9,10-anthracenediyl group; phenanthrenediyl groups such as a 2,7-phenanthrenediyl group; naphthacenediyl groups such as a 1,7-naphthacenediyl group, a 2,8-naphthacenediyl group and a 5,12-naphthacenediyl group; fluorenediyl groups such as a 2,7-fluorenediyl group and a 3,6-fluorenediyl group; pyrenediyl groups such as a 1,6-pyrenediyl group, a 1,8-pyrenediyl group, a 2,7-pyrenediyl group and a 4,9-pyrenediyl group; and perylenediyl groups such as a 3,9-perylenediyl group and a 3,10-perylenediyl group; which groups may be optionally substituted. Preferred among these are unsubstituted or substituted phenylene groups, and unsubstituted or substituted fluorenediyl groups.

A divalent heterocyclic group is an atomic group remaining after removing 2 hydrogen atoms from a heterocyclic compound, and it may be optionally substituted. Preferred as divalent heterocyclic groups are unsubstituted divalent heterocyclic groups and divalent heterocyclic groups substituted with alkyl group or the like. The number of carbon atoms in a divalent heterocyclic group is preferably 4-60, more preferably 4-30 and even more preferably 4-12, not including the number of carbon atoms of the substituents.

Examples of divalent heterocyclic groups include pyridinediyl groups such as a 2,5-pyridinediyl group and a 2,6-pyridinediyl group; thiophenediyl groups such as a 2,5-thiophenediyl group; furandiyl groups such as a 2,5-furandiyl group; quinolinediyl groups such as a 2,6-quinolinediyl group; isoquinolinediyl groups such as a 1,4-isoquinolinediyl group and a 1,5-isoquinolinediyl group; quinoxalinediyl groups such as a 5,8-quinoxalinediyl group; benzo-2,1,3-thiadiazolediyl groups such as a benzo-2,1,3-thiadiazole-4,7-diyl group; benzothiazolediyl groups such as a 4,7-benzothiazolediyl group; carbazolediyl groups such as a 2,7-carbazolediyl group and a 3,6-carbazolediyl group; phenoxazinediyl groups such as a 3,7-phenoxazinediyl group; phenothiazinediyl groups such as a 3,7-phenothiazinediyl group; and dibenzosiloldiyl groups such as a 2,7-dibenzosiloldiyl group, which groups may be optionally substituted. Preferred among these are unsubstituted or substituted benzo-2,1,3-thiadiazolediyl groups, unsubstituted or substituted phenoxazinediyl groups and unsubstituted or substituted phenothiazinediyl groups. Divalent aromatic heterocyclic groups are preferred as divalent heterocyclic groups.

Convolution Integral: Definition of f(g, h))

The term f(g, h), for this embodiment, can be determined by separately measuring and analyzing the emission spectrum of a conjugated polymer compound and the gram absorption coefficient spectrum of a luminescent organic compound. Here, the emission spectrum of the conjugated polymer compound is the spectrum obtained upon excitation of the conjugated polymer compound with 360 nm light, normalized with the maximum luminescence intensity at 350 nm to 500 nm set as 1, and it can be obtained by measuring the emission spectrum for a film with a thickness of 30-60 nm composed of the conjugated polymer compound. The gram absorption coefficient spectrum of the luminescent organic compound is obtained by dissolving the luminescent organic compound in a toluene solvent at a concentration of $8 \times 10^{-4}$ mass %, and calculating from the measured absorption spectrum.

The term f(g, h), for this embodiment, is obtained by evaluating the convolution integral of the emission spectrum of the conjugated polymer compound and the gram absorption coefficient spectrum of the luminescent organic compound, in the range of 200 nm to 800 nm. The convolution integral is the value obtained by calculating the products of the luminescence intensity read from the emission spectrum and the gram absorption coefficient read from the gram absorption spectrum (L/g·cm), from 200 nm to 800 nm in 1 nm steps, and adding the products.

<Luminescent Composition>

The luminescent composition of this embodiment comprises a luminescent organic compound and a conjugated polymer compound having a luminescence maximum further toward the short wavelength end than the luminescence maximum of the luminescent organic compound at 350 nm to 500 nm, and satisfying the following formula (1).

$$f(g,h) \times w \geq 0.04 \quad (1)$$

[In the formula, f(g, h) represents the convolution integral of the emission spectrum of the conjugated polymer compound and the gram absorption coefficient spectrum of the luminescent organic compound (L/g·cm) in the range of 200 nm to 800 nm, in 1 nm steps, and w represents the content ratio of the luminescent organic compound with respect to 1 part by mass as the total content of the luminescent organic compound and the conjugated polymer compound in the luminescent composition. For the emission spectrum, the emission spectrum obtained by excitation of the conjugated polymer compound with 360 nm light was normalized with the maximum luminescence intensity at 350 nm to 500 nm as 1.]

The luminescent composition of this embodiment comprises a conjugated polymer compound as the compound functioning for charge transport and recombination of electrons and holes, and a luminescent organic compound as the compound functioning for luminescence. With the luminescent composition of this embodiment having such a construction, it is possible for a luminescent organic compound to efficiently receive excitation energy formed by holes and electrons recombined in a conjugated polymer compound. Thus, a light-emitting device provided with a luminescent layer comprising the luminescent composition has increased luminance life compared to one provided with a luminescent layer using a luminescent material other than the luminescent composition of this embodiment. The reason for the increased luminance life of the light-emitting device is not completely understood, but it is believed that the conjugated polymer compound inhibits chemical degradation from the excited state by the mechanism described above.

In the luminescent composition of this embodiment, the luminescence maximum of the conjugated polymer compound found furthest toward the short wavelength end in the range of 350 nm to 500 nm is further toward the short wavelength end than the luminescence maximum of the luminescent organic compound found furthest toward the short wavelength end. By combination of such a conjugated polymer compound and luminescent organic compound, it is possible for the luminescent organic compound to efficiently receive excitation energy produced by recombination of holes and electrons in the conjugated polymer compound.

When either the conjugated polymer compound or the luminescent organic compound has a bimodal emission spectrum in the range of 350 nm to 500 nm, the following modes are preferred.
(i) When the luminescent organic compound exhibits a bimodal emission spectrum:
The luminescence maximum where the luminescence intensity of the conjugated polymer compound is maximum is located further toward the short wavelength end than the luminescence maximum of the luminescent organic compound at the short wavelength end.
(ii) When the conjugated polymer compound exhibits a bimodal emission spectrum:
The luminescence maximum of the conjugated polymer compound at the short wavelength end is located further toward the short wavelength end than the luminescence maximum of the luminescent organic compound found furthest toward the short wavelength end.

The term "f(g, h)×w" in formula (1) is preferably 0.12 or greater and more preferably 0.20 or greater. When added to the luminescent layer of a light-emitting device, such a luminescent composition can further increase the luminance life of the light-emitting device.

The content of the luminescent organic compound in the luminescent composition of this embodiment is preferably 0.002-0.3 part by mass, more preferably 0.01-0.2 part by mass and even more preferably 0.03-0.1 part by mass, where the total content of the conjugated polymer compound and the luminescent organic compound is defined as 1 part by mass. That is, the compositional ratio of the luminescent organic compound by mass, where the total mass of the conjugated polymer compound and the luminescent organic compound is defined as 1, is preferably 0.002-0.3, more preferably 0.01-0.2 and even more preferably 0.03-0.1. If the content of the luminescent organic compound is above this lower limit, the luminescent organic compound will be able to more efficiently receive the excitation energy produced in the conjugated polymer compound, and the luminance life will be further increased when the composition is added to the luminescent layer of a light-emitting device. Also, if the content of the luminescent organic compound is below the upper limit, concentration quenching will be less likely to occur, and the luminous efficiency will be further increased.

(Luminescent Organic Compound)
The luminescent organic compound of this embodiment preferably exhibits blue luminescence having a highest luminescence maximum between 420 and 480 nm, and more preferably it has a highest luminescence maximum between 440 and 470 nm. If the highest luminescence maximum is further toward the long wavelength end than 480 nm, the color purity may be reduced when used in a displaying device such as a display. If the maximum luminescence intensity is further toward the short wavelength end than 420 nm, a low luminosity factor may effectively lower the luminous efficiency.

The luminescent organic compound may be either fluorescent or phospholuminescent, so long as it satisfies formula (1).

Luminescent organic compounds that are phospholuminescent include complexes containing heavy metals as central metals. The heavy metal is preferably iridium, platinum, gold, europium or terbium. Such luminescent organic compounds include complexes represented by the following formula (4), for example.

[Chemical Formula 5]

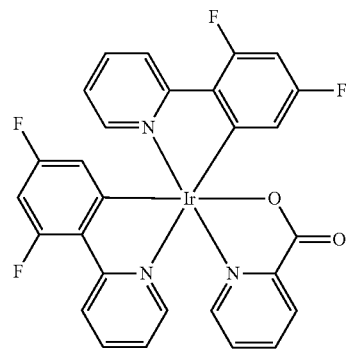

(4)

A luminescent organic compound that is fluorescent is preferably a compound having a fused ring structure of 2 or more aromatic hydrocarbon rings, or a heterocyclic structure, and more preferably it is a compound having a fused ring structure of 2 or more aromatic hydrocarbon rings.

Examples of fused ring structures of 2 or more aromatic hydrocarbon rings include a naphthalene backbone, anthracene backbone, phenanthrene backbone, triphenylene backbone, chrysene backbone, fluoranthene backbone, benzofluoranthene backbone, pyrene backbone and perylene backbone. Preferred among these are anthracene backbone, phenanthrene backbone, fluoranthene backbone, benzofluoranthene backbone, pyrene backbone and perylene backbone, with anthracene backbone, benzofluoranthene backbone, pyrene backbone and perylene backbone being more preferred.

One or more groups may also be bonded to a fused ring structure of 2 or more aromatic hydrocarbon rings, examples of such groups including alkyl groups, alkoxy groups, aryl groups, aryloxy groups, arylalkyl groups, arylalkoxy groups, arylalkenyl groups, arylalkynyl groups, halogen atoms, acyl groups, acyloxy groups, monovalent heterocyclic groups, a carboxyl group, a nitro group and a cyano group. Preferred among these groups are alkyl groups, aryl groups, arylalkyl groups, halogen atoms and a cyano group, with alkyl groups, aryl and arylalkyl groups being more preferred.

Examples of luminescent organic compounds include compounds represented by the following formulas (5-1), (5-2), (5-3), (5-4), (5-5), (5-6), (5-7), (5-8), (5-9), (5-10) and (5-11).

[Chemical Formula 6]

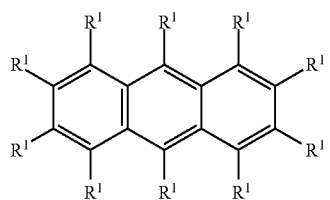
(5-1)

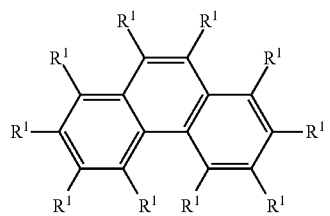
(5-2)

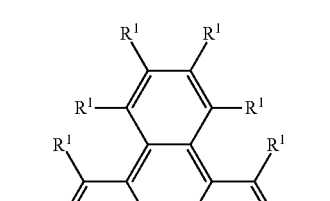
(5-3)

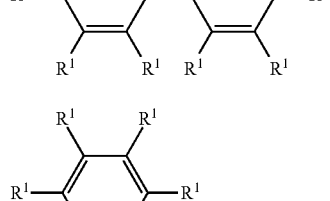
(5-4)

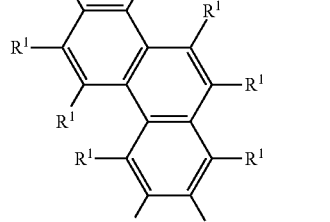
(5-5)

-continued

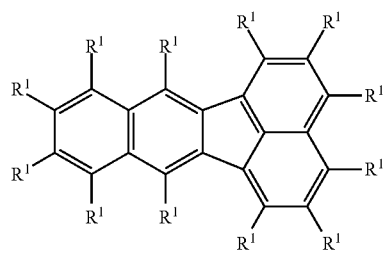
(5-6)

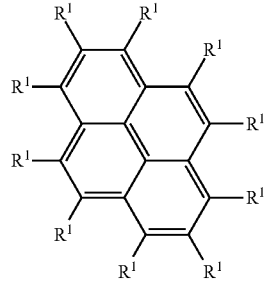
(5-7)

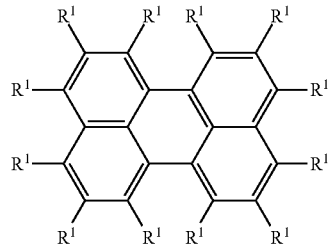
(5-8)

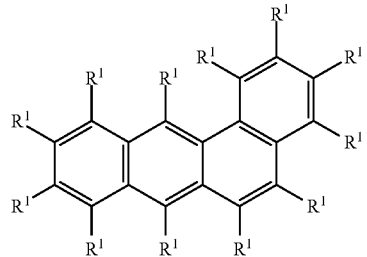
(5-9)

[Chemical Formula 7]

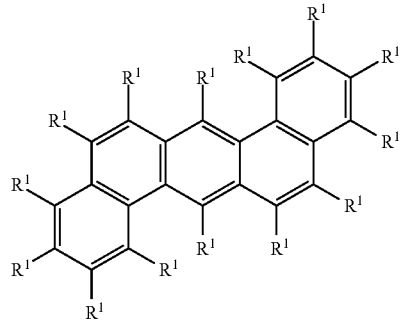
(5-10)

-continued

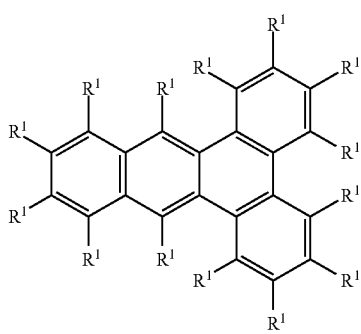
(5-11)

In the formulas, $R^1$ represents a hydrogen atom, an alkyl group, an alkoxy group, an aryl group, an aryloxy group, an arylalkyl group, an arylalkoxy group, an arylalkenyl group, an arylalkynyl group, a halogen atom, an acyl group, an acyloxy group, a monovalent heterocyclic group or a carboxyl group. Multiple $R^1$ groups may be the same or different. Multiple $R^1$ groups bonded to carbon atoms at adjacent positions may together form a ring, so long as the highest luminescence maximum does not exceed 480 nm.

$R^1$ is preferably selected as a suitable group so that the highest luminescence maximum of the luminescent organic compound is between 420 nm and 480 nm. $R^1$ is preferably a phenyl group, a biphenylyl group, a naphthyl group, an anthracenyl group, a fluorenyl group or a styryl group, which groups may have substituents, with alkyl groups and alkoxy groups being preferred as substituents from the viewpoint of increased solubility. Specifically, $R^1$ may be a group represented by the following formula (6-1), (6-2), (6-3), (6-4), (6-5), (6-6), (6-7), (6-8), (6-9), (6-10), (6-11) or (6-12). These groups may have substituents, with alkyl groups and alkoxy groups being preferred as substituents.

[Chemical Formula 8]

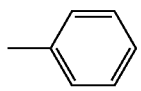
(6-1)

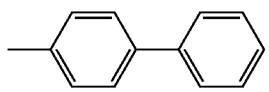
(6-2)

(6-3)

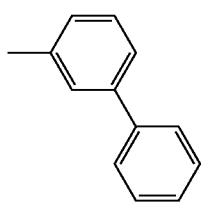

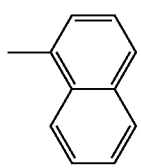
(6-4)

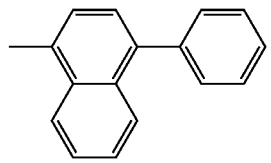
(6-5)

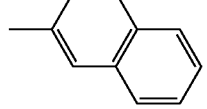
(6-6)

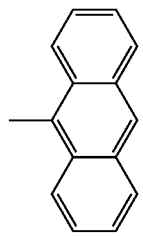
(6-7)

(6-8)

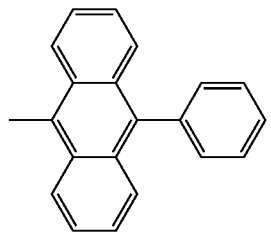
(6-9)

(6-10)

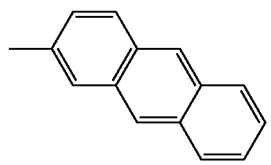

(6-11)

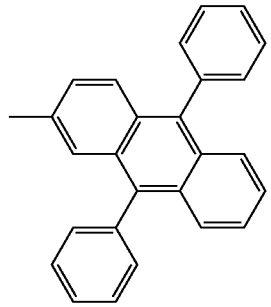

(6-12)

Of the groups represented by formulas (6-1), (6-2), (6-3), (6-4), (6-5), (6-6), (6-7), (6-8), (6-9), (6-10), (6-11) and (6-12), there are more specifically preferred groups represented by the following formulas (7-1), (7-2), (7-3), (7-4), (7-5), (7-6), (7-7), (7-8), (7-9), (7-10), (7-11), (7-12), (7-13), (7-14), (7-15), (7-16), (7-17), (7-18), (7-19), (7-20), (7-21), (7-22) and (7-23).
[Chemical Formula 9]
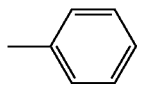
(7-1)
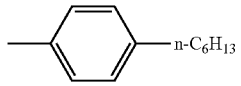
(7-2)
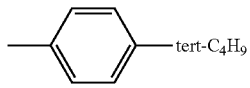
(7-3)
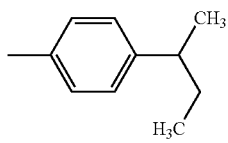
(7-4)
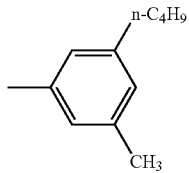
(7-5)
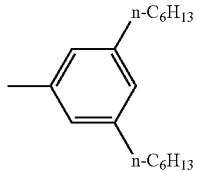
(7-6)
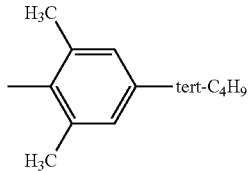
(7-7)
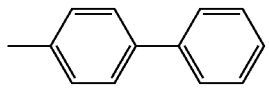
(7-8)
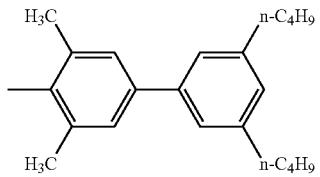
(7-9)
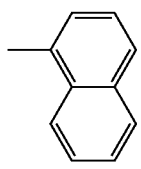
(7-10)
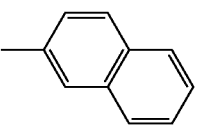
(7-11)
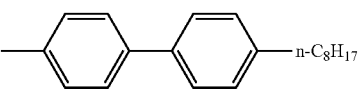
(7-12)
[Chemical Formula 10]
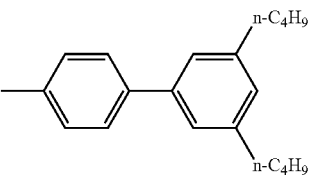
(7-13)
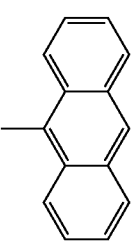
(7-14)
(7-15)
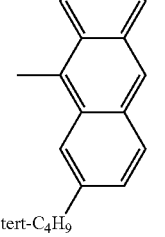
(7-16)
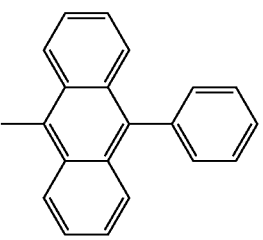
(7-16)
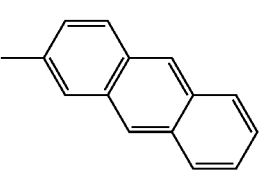
(7-17)

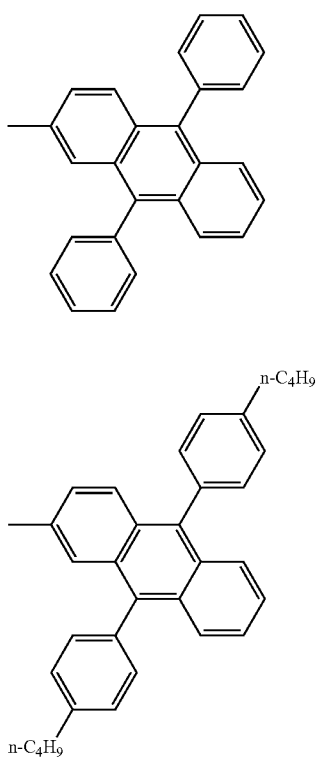

(7-18)

(7-19)

(7-20)

[Chemical Formula 11]

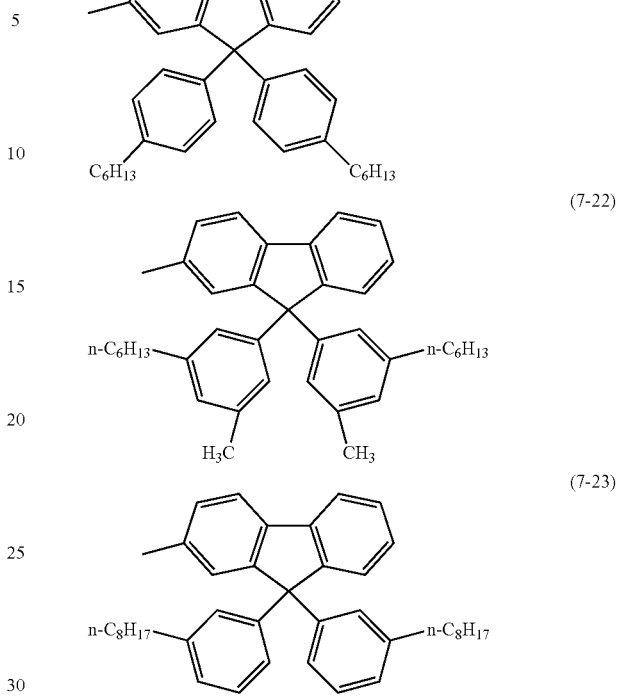

(7-21)

(7-22)

(7-23)

In order to satisfy formula (1), the absorption maximum furthest toward the long wavelength end in the absorption spectrum of the luminescent organic compound is preferably at the long wavelength end. However, since the emission spectrum is generally located further toward the long wavelength end than the absorption spectrum, an absorption maximum with a longer wavelength will also tend to result in a longer wavelength for the highest luminescence maximum. Therefore, a compound with a highest luminescence maximum of no greater than 480 nm and an absorption maximum at the long wavelength end is preferred. Examples of such luminescent organic compounds include compounds represented by the following formulas (8-1), (8-2), (8-3), (8-4), (8-5), (8-6), (8-7), (8-8), (8-9), (8-10), (8-11), (8-12), (8-13), (8-14), (8-15), (8-16) and (8-17).

(8-1)

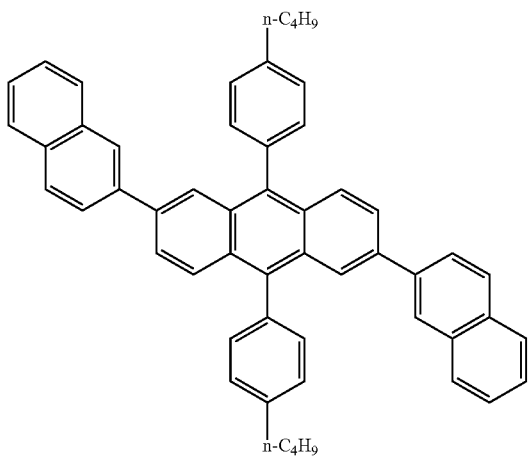

(8-2)

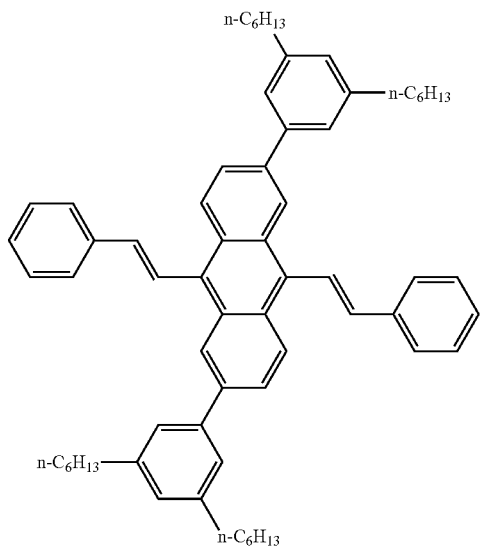

(8-3)
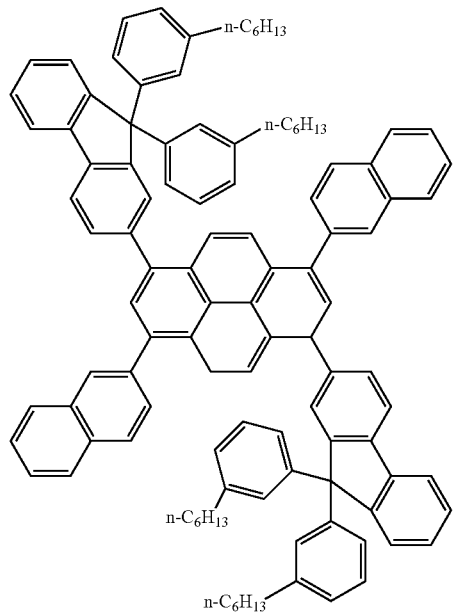
(8-4)
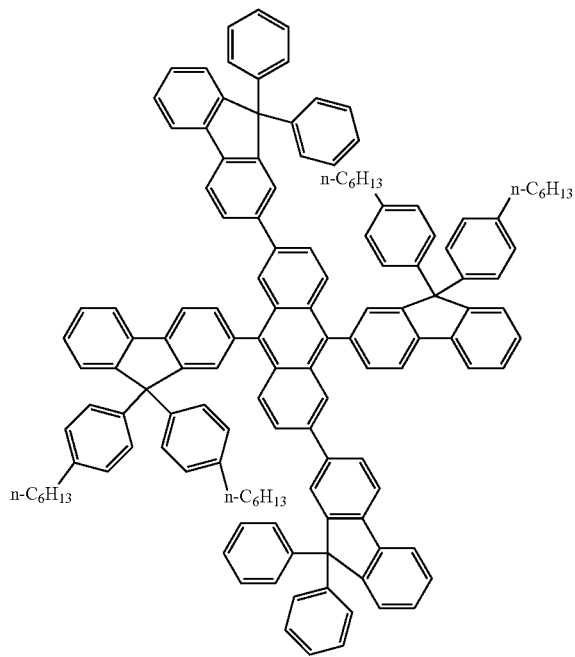

(8-5)
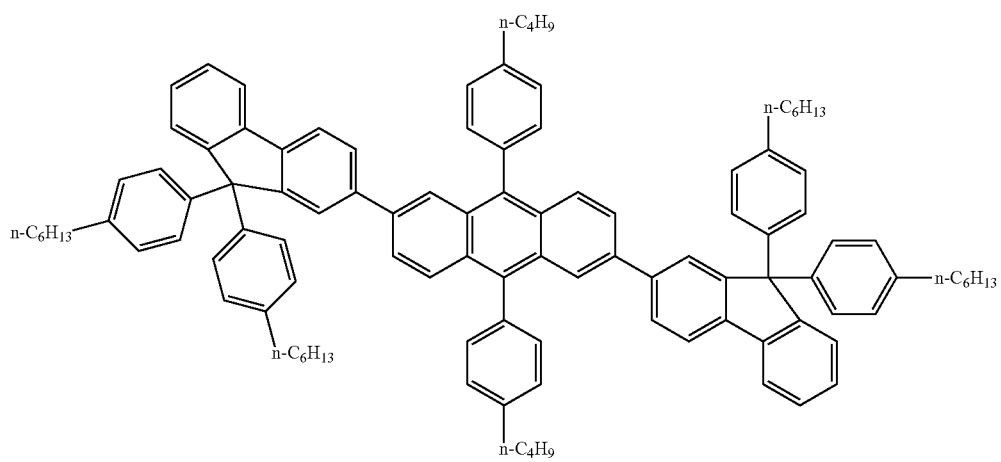
[Chemical Formula 12]
(8-6)
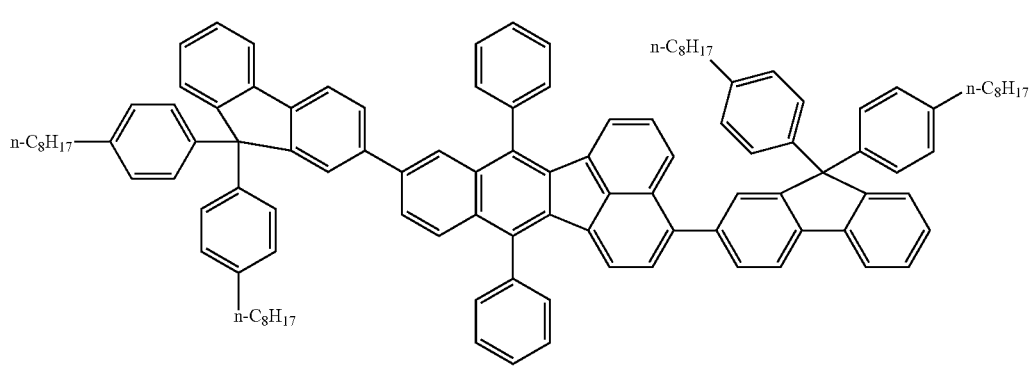
(8-7)
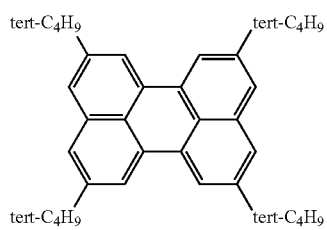
(8-8)
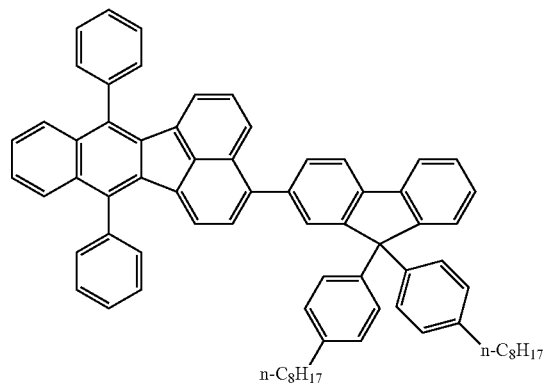
(8-9)
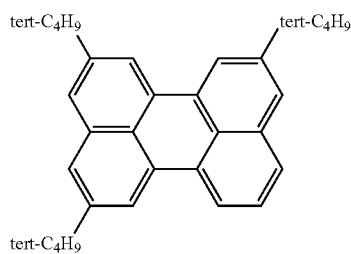
(8-10)
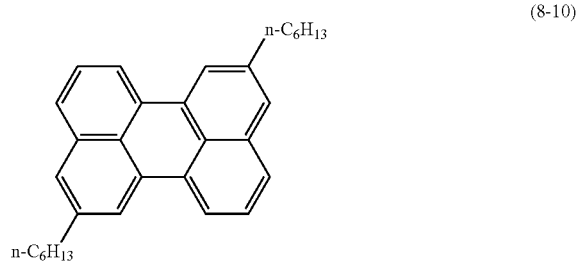

[Chemical Formula 13]
(8-11)
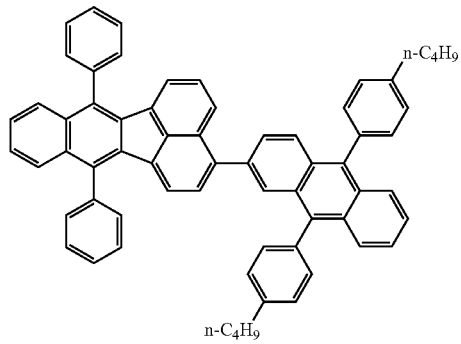
(8-12)
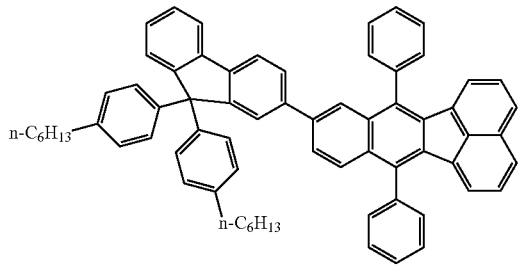
(8-13)
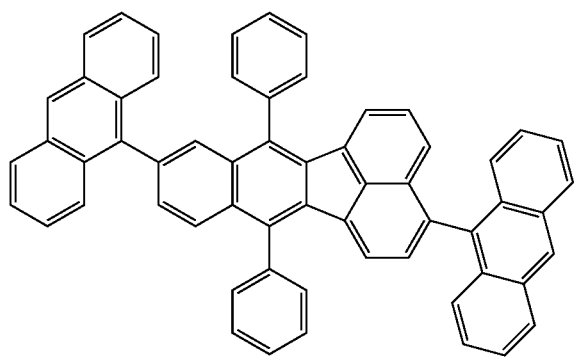
(8-14)
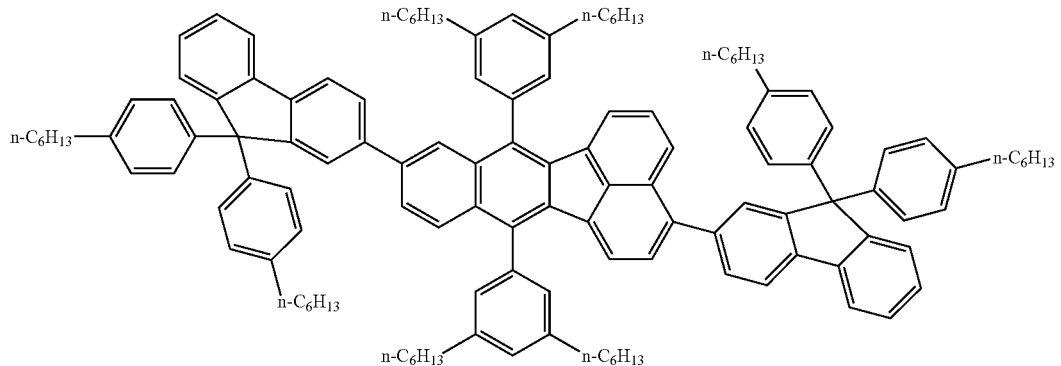
[Chemical Formula 14]
(8-15)
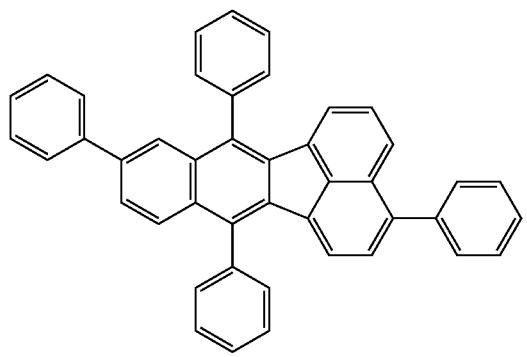

(8-16)

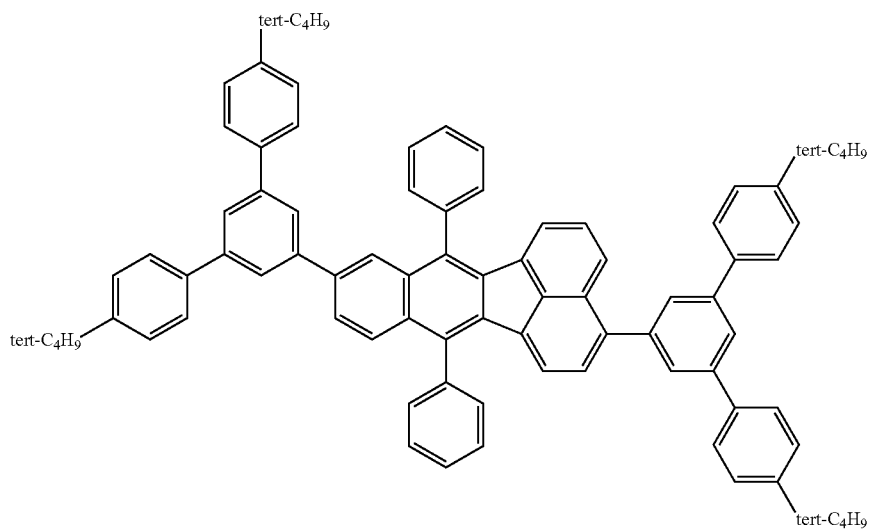

(8-17)

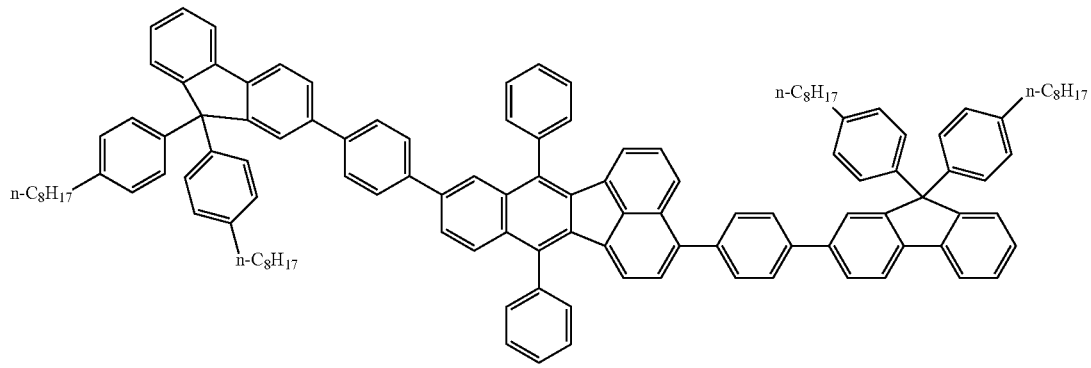

(Conjugated Polymer Compound)

The conjugated polymer compound of this embodiment has a luminescence maximum further toward the short wavelength end than the luminescence maximum of the luminescent organic compound at 350 nm to 500 nm. The conjugated polymer compound may be a conjugated polymer compound having an arylene group as a repeating unit on the main chain, wherein at least 50% of the arylene groups are connected with each other by a direct bond or by a nitrogen atom, a vinylene group or an acetylene group.

Examples of conjugated polymer compounds include the conjugated polymer compounds mentioned in Japanese Unexamined Patent Application Publication No. 2003-231741, Japanese Unexamined Patent Application Publication No. 2004-059899, Japanese Unexamined Patent Application Publication No. 2004-002654, Japanese Unexamined Patent Application Publication No. 2004-292546, U.S. Pat. No. 5,708,130, International Patent Publication No. WO99/54385, International Patent Publication No. WO00/46321, International Patent Publication No. WO02/077060, "Organic EL Displays" (Tokito, S., Adachi, C., Murata, H., co-authors, Ohmsha, Ltd.) p. 111, Gekkan Display (vol. 9, No. 9, 2002) p. 47-51, "Conductive Polymer Materials (CMC Publishing), Recent Applications of Conductive Polymers (CMC Publishing), Fundamentals and Applications of Conductive Polymers (IPC, Inc., Yoshino, K., ed.), Conductive Polymers (The Society of Polymer Science, Japan, Yoshimura, S.) and Polymer EL Materials (The Society of Polymer Science, Japan, Onishi, T., Ogawa, T.).

The conjugated polymer compound has a luminescence maximum, representing the maximum luminescence intensity (highest luminescence maximum), that is preferably located at no greater than 440 nm. Also, preferably the conjugated polymer compound efficiently delivers to the luminescent organic compound the excitation energy formed when holes and electrons have been recombined. Thus, the highest luminescence maximum of the conjugated polymer compound is preferably found further toward the short wavelength end than the highest luminescence maximum of the luminescent organic compound. Also, to adequately maintain electrical charge balance and for excellent chemical stability and efficient delivery of energy to the luminescent organic compound, the conjugated polymer compound preferably has a luminescence maximum between 380 nm and 440 nm.

The conjugated polymer compound has a polystyrene-equivalent number-average molecular weight of preferably $1 \times 10^3$ to $1 \times 10^7$ and more preferably $1 \times 10^4$ to $5 \times 10^6$, and a polystyrene-equivalent weight-average molecular weight of preferably $1 \times 10^4$ to $5 \times 10^7$ and more preferably $5 \times 10^4$ to $1 \times 10^7$.

The conjugated polymer compound may be a random copolymer, block copolymer or graft copolymer, or it may be a copolymer having such intermediate structures (for example, a block-type random copolymer).

The conjugated polymer compound preferably has a hole transport property, from the viewpoint of hole injection and transport. A conjugated polymer compound with a hole transport property is preferably a conjugated polymer compound comprising, as a repeating unit, a unit structure derived from a compound to be used as the hole transport material of an organic EL element, such as an aromatic amine, carbazole derivative or polyparaphenylene derivative. The content of the unit structure in the conjugated polymer compound is preferably 3-30 parts by mass and more preferably 5-20 parts by mass with respect to 100 parts by mass as the total of all of the repeating units. Such a conjugated polymer compound will further increase the luminous efficiency of the luminescent composition.

The conjugated polymer compound preferably has a repeating unit represented by the following formula (2).

[Chemical Formula 15]

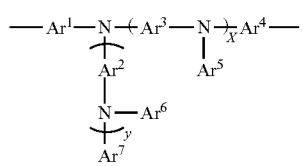

(2)

In the formula, $Ar^1$, $Ar^2$, $Ar^3$ and $Ar^4$ each independently represent an optionally substituted arylene group or an optionally substituted divalent heterocyclic group, $Ar^5$, $Ar^6$ and $Ar^7$ each independently represent an optionally substituted aryl group or an optionally substituted monovalent heterocyclic group, and x and y each independently represent 0 or 1. This is with the proviso that x+y is 0 or 1.

When the groups represented by $Ar^1$, $Ar^2$, $Ar^3$ and $Ar^4$ in formula (2) have substituents, the substituents may be alkyl groups, alkoxy groups, aryl groups, aryloxy groups, arylalkyl groups, arylalkoxy groups, arylalkenyl groups, arylalkynyl groups, amino groups, substituted amino groups, halogen atoms, acyl groups, acyloxy groups, monovalent heterocyclic groups, carboxyl groups, nitro groups or cyano groups, preferably alkyl groups, alkoxy groups, aryl groups, aryloxy groups, arylalkyl groups, arylalkoxy groups, substituted amino groups, acyl groups or cyano groups, and more preferably alkyl groups, alkoxy groups or aryl groups.

"Arylene group" in the definition of $Ar^1$, $Ar^2$, $Ar^3$ and $Ar^4$ in formula (2) is an atomic group obtained by removing 2 hydrogens from an aromatic hydrocarbon, as mentioned above, and it includes those with independent benzene rings or fused rings. The number of carbon atoms of the arylene group is preferably 6-60, more preferably 6-30 and even more preferably 6-18.

An "arylene group" defined for $Ar^1$, $Ar^2$, $Ar^3$ and $Ar^4$ in formula (2) is preferably a 1,3-phenylene group, a 1,4-phenylene group, a 1,4-naphthalenediyl group, a 2,6-naphthalenediyl group, a 9,10-anthracenediyl group, a 2,7-phenanthrenediyl group, a 5,12-naphthacenediyl group, a 2,7-fluorenediyl group or the like.

"Divalent heterocyclic group" in the definition of $Ar^1$, $Ar^2$, $Ar^3$ and $Ar^4$ in formula (2) is as explained above, and its number of carbon atoms is preferably 4-60, more preferably 4-20 and even more preferably 4-9. The "divalent heterocyclic group" is preferably a 2,5-thiophenediyl group, a N-methyl-2,5-pyrrolediyl group, a 2,5-furandiyl group, a benzo[2,1,3]thiadiazole-4,7-diyl group, a 3,7-phenoxazinediyl group, a 3,6-carbazolediyl group or the like.

An "arylene group" in the definition of $Ar^1$, $Ar^2$, $Ar^3$ and $Ar^4$ in formula (2) may also be a divalent group in which 2 aromatic rings are linked by a single bond. Such groups are preferably groups represented by the following formulas (9-1), (9-2) and (9-3).

[Chemical Formula 16]

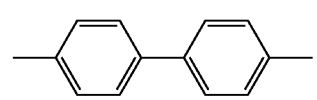

(9-1)

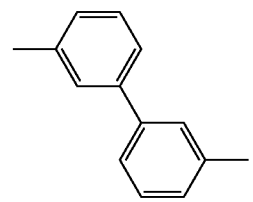

(9-2)

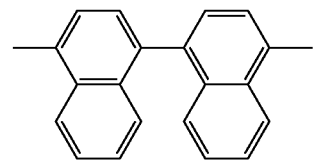

(9-3)

In formula (2), $Ar^1$ and $Ar^4$ are preferably each independently an optionally substituted arylene group, more preferably an optionally substituted 1,3-phenylene group, an optionally substituted 1,4-phenylene group, an optionally substituted 1,4-naphthalenediyl group, a group represented by formula (9-1) above, or an optionally substituted 2,6-naphthalenediyl group, even more preferably an optionally substituted 1,4-phenylene group or an optionally substituted 1,4-naphthalenediyl group, and most preferably an optionally substituted 1,4-phenylene group.

In formula (2), $Ar^a$ is preferably an optionally substituted 1,3-phenylene group, an optionally substituted 1,4-phenylene group, an optionally substituted 1,4-naphthalenediyl group, an optionally substituted 2,7-fluorenediyl group, an optionally substituted benzo-2,1,3-thiadiazole-4,7-diyl group, an optionally substituted 3,7-phenoxazinediyl group or an optionally substituted group represented by formula (9-1) above, more preferably an optionally substituted 1,4-phenylene group, an optionally substituted 1,4-naphthalenediyl group, an optionally substituted 2,7-fluorenediyl group or a group represented by formula (9-1) above, and even more preferably an optionally substituted 1,4-phenylene group or an optionally substituted group represented by formula (9-1) above.

In formula (2), $Ar^5$, $Ar^6$ and $Ar^7$ each independently represent preferably an alkyl group, an aryl group or a monovalent heterocyclic group, more preferably an alkyl group or an aryl group, and even more preferably an aryl group.

Preferred examples of repeating units represented by formula (2) include repeating units represented by the following formulas (10-1), (10-2), (10-3) and (10-4).

[Chemical Formula 17]

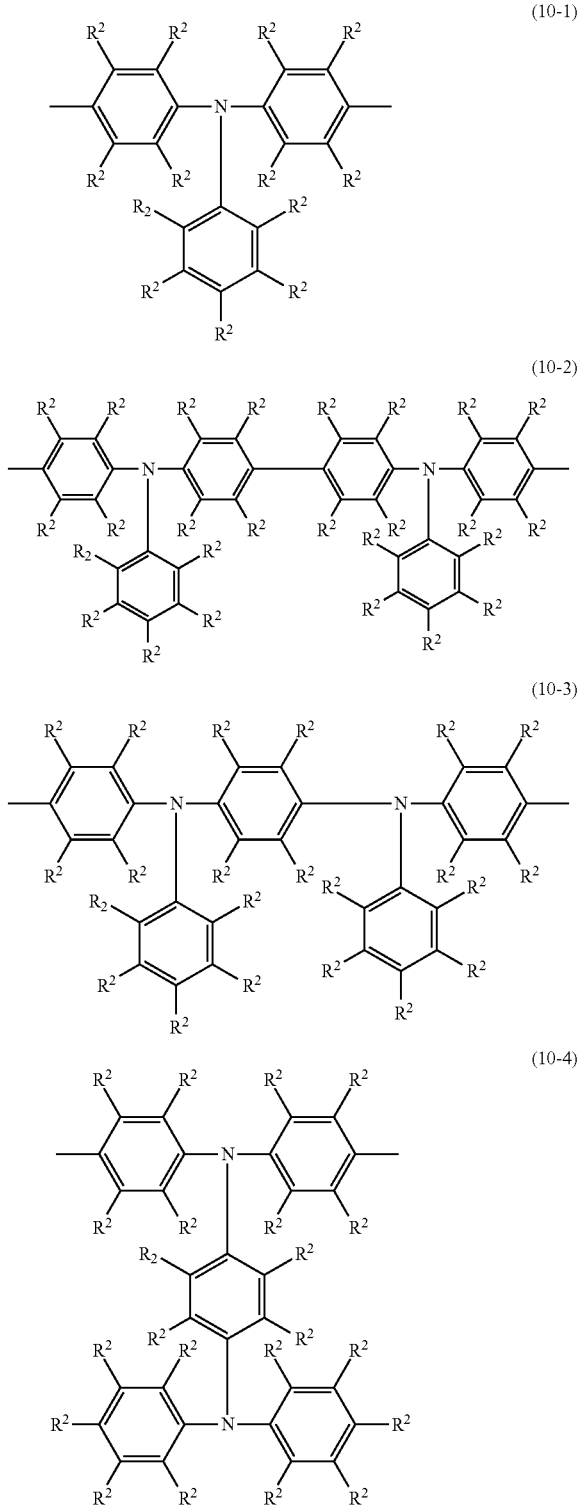

(10-1)

(10-2)

(10-3)

(10-4)

In the formulas, $R^2$ represents a hydrogen atom, an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group or a cyano group. Multiple $R^2$ groups may be the same or different.

Preferred among repeating units represented by formula (2) are repeating units represented by the following formula (11).

[Chemical Formual 18]

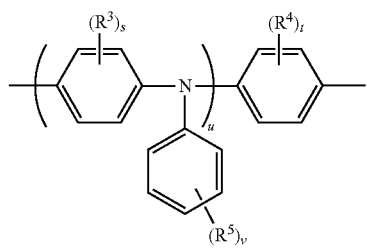

(11)

In the formula, $R^3$, $R^4$ and $R^5$ each independently represent a $C_1$-$C_{20}$ alkyl group, a $C_1$-$C_{20}$ alkoxy group, a phenylalkyl group having 7 to 26 carbon atoms, a phenylalkoxy group having 7 to 26 carbon atoms, a phenyl group, a phenoxy group, an alkyl-substituted phenyl group having 7 to 26 carbon atoms, an alkoxy-substituted phenyl group having 7 to 26 carbon atoms, an alkylcarbonyl group having 2 to 21 carbon atoms, a formyl group, an alkoxycarbonyl group having 2 to 21 carbon atoms or a carboxyl group. Instead of the groups mentioned above, $R^3$ and $R^4$ may together form a ring. The letters s and t each independently represent an integer of 0 to 4, u is 1 or 2, and v is an integer of 0 to 5. In the case of multiple groups for at least one of $R^3$, $R^4$ and $R^5$, the multiple groups may be the same or different from each other.

When $R^3$ and $R^4$ in formula (11) together form a ring, the ring may be, for example, an optionally substituted heterocyclic ring having 5 to 14 carbon atoms. Examples of heterocyclic rings include morpholine ring, thiomorpholine ring, pyrrole ring, piperidine ring and piperazine ring.

Examples of repeating units represented by formula (11) include groups represented by the following formulas (12-1), (12-2), (12-2), (12-3), (12-4), (12-5), (12-6), (12-7), (12-8), (12-9) and (12-10).

[Chemical Formula 19]

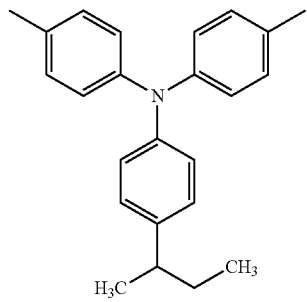

(12-1)

-continued

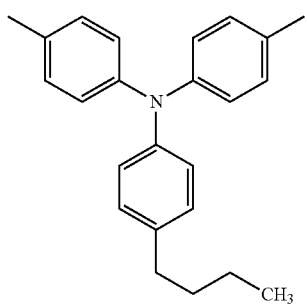
(12-2)

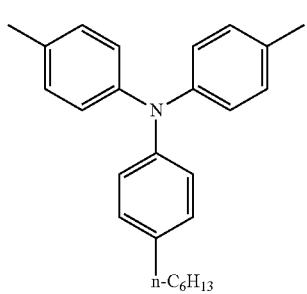
(12-3)

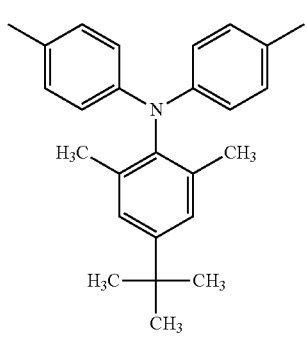
(12-4)

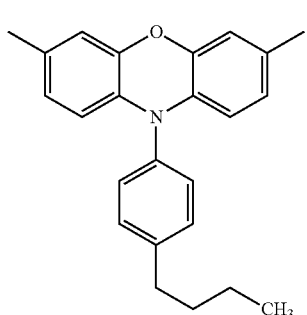
(12-5)

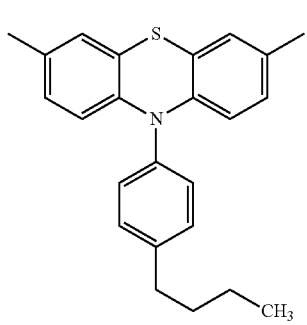
(12-6)

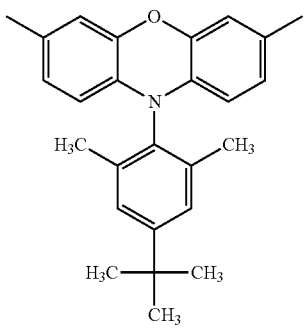
(12-7)

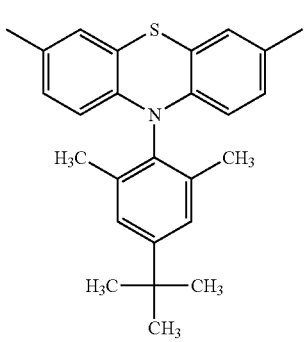
(12-8)

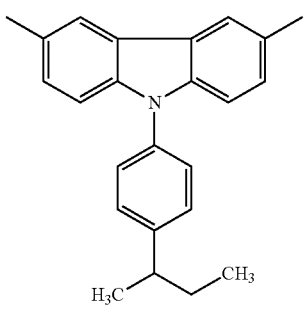
(12-9)

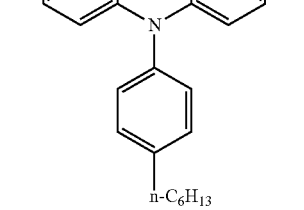
(12-10)

The conjugated compound preferably further includes a repeating unit represented by the following formula (13).

$$—Ar^8—  \quad (13)$$

[In the formula, $Ar^8$ represents an optionally substituted arylene group or an optionally substituted divalent aromatic heterocyclic group other than one represented by formula (2).]

"Arylene group" in the definition of $Ar^8$ in formula (13) is an atomic group obtained by removing 2 hydrogen atoms from an aromatic hydrocarbon, as mentioned above, and it includes those with independent benzene rings or fused rings. The number of carbon atoms of the arylene group is preferably 6-60, more preferably 6-30 and even more preferably 6-18.

An arylene group in the definition of $Ar^8$ in formula (13) may be a 1,4-phenylene group, a 1,3-phenylene group, a 1,4-naphthalenediyl group, a 1,5-naphthalenediyl group, a 2,6-naphthalenediyl group, a 5,12-naphthacenylene group, a 2,7-fluorenediyl group, a 3,6-fluorenediyl group, a 2,6-quinolinediyl group, a 1,4-isoquinolinediyl group, a 1,5-isoquinolinediyl group, a 5,8-quinoxalinediyl group or the like, preferably a 1,4-phenylene group, a 1,4-naphthalenediyl group, a 1,5-naphthalenediyl group, a 2,6-naphthalenediyl group, a 2,7-fluorenediyl group, a 2,6-quinolinediyl group, a 1,4-isoquinolinediyl group or a 5,8-quinoxalinediyl group, more preferably a 1,4-phenylene group, a 1,4-naphthalenediyl group, a 1,5-naphthalenediyl group, a 2,6-naphthalenediyl group, a 2,7-fluorenediyl group or a 5,8-quinoxalinediyl group, even more preferably a 1,4-phenylene group or a 2,7-fluorenediyl group, and most preferably a 2,7-fluorenediyl group.

The "divalent heterocyclic group" in the definition of $Ar^8$ in formula (13) may be a 4,7-benzo[1,2,5]thiadiazolediyl group, and is preferably a 4,7-benzo[1,2,5]thiadiazolediyl group.

$Ar^8$ is preferably an arylene group.

The repeating unit represented by formula (13) may be a repeating unit represented by the following formula (14-1), (14-2) or (14-3).

[Chemical Formula 20]

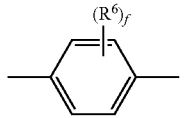

(14-1)

In the formula, $R^6$ represents an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group or a cyano group, and some or all of the hydrogen atoms in these groups may be replaced by fluorine atoms. The letter f represents an integer of 0 to 4. When f is 2 or greater, the multiple $R^6$ groups may be the same or different.

$R^6$ is preferably an alkyl group, an alkoxy group, an aryl group, an aryloxy group, an arylalkyl group, an arylalkoxy group, an arylalkenyl group, an arylalkynyl group, a substituted amino group, an acyl group or a monovalent heterocyclic group, more preferably an alkyl group, an alkoxy group, an aryl group, an aryloxy group, a substituted amino group, an acyl group or a monovalent heterocyclic group, even more preferably an alkyl group, an alkoxy group, an aryl group or a monovalent heterocyclic group, and most preferably an alkyl group, an alkoxy group or an aryl group. The letter f is preferably an integer of 0 to 2.

[Chemical Formula 21]

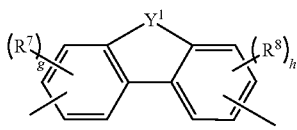

(14-2)

In the formula, $R^7$ and $R^8$ each independently represent an alkyl group, an aryl group, an arylalkyl group or a monovalent heterocyclic group, and g and h each independently represent an integer of 0 to 3. When g is 2 or greater, the multiple $R^7$ groups may be the same or different, and when h is 2 or greater, the multiple $R^8$ groups may be the same or different. $Y^1$ represents $—C(R^9)(R^{10})—$, $—C^{11})(R^{12})—C(R^{13})(R^{14})—$ or $—C(R^{15})=C(R^{16})—$. $R^9$, $R^{10}$, $R^{11}$, $R^{12}$, $R^{13}$, $R^{14}$, $R^{15}$ And $R^{16}$ each independently represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group or a halogen atom. $R^7$ and $R^8$ each independently represent preferably an alkyl group, an aryl group or a monovalent heterocyclic group and more preferably an alkyl group or an aryl group.

[Chemical Formula 22]

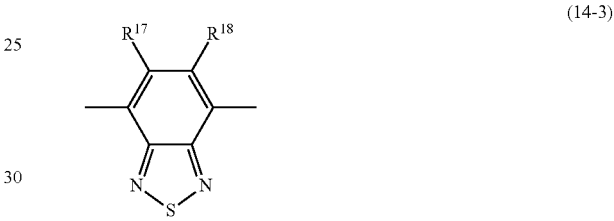

(14-3)

In the formula, $R^{17}$ and $R^{18}$ each independently represent a hydrogen atom, an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group or a cyano group. Some or all of the hydrogen atoms in these groups may be replaced by fluorine atoms. $R^{17}$ and $R^{18}$ each independently represent preferably a hydrogen atome, an alkyl group, an alkoxy group, an aryl group, an aryloxy group, an arylalkyl group, an arylalkoxy group, a substituted amino group, an acyl group or a monovalent heterocyclic group, more preferably a hydrogen atom, an alkyl group, an alkoxy group, an aryl group, an aryloxy group or a monovalent heterocyclic group, even more preferably a hydrogen atom or an alkyl group, and most preferably a hydrogen atom.

Preferred among repeating units represented by formula (14-2) are repeating units represented by the following formula (3).

[Chemical Formula 23]

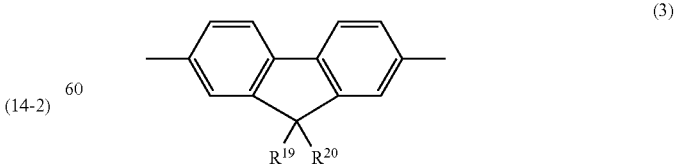

(3)

In the formula, $R^{19}$ and $R^{20}$ each independently represent an optionally substituted alkyl group, an optionally substituted aryl group or an optionally substituted monovalent heterocyclic group. Preferably, $R^{19}$ and $R^{20}$ each independently represent an optionally substituted alkyl group or an optionally substituted aryl group.

The repeating unit represented by formula (3) may be a repeating unit represented by the following formula (15-1), (15-2), (15-3), (15-4), (15-5), (15-6), (15-7) or (15-8).

[Chemical Formula 24]

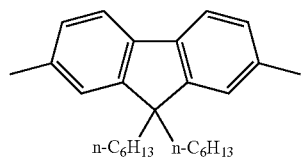
(15-1)

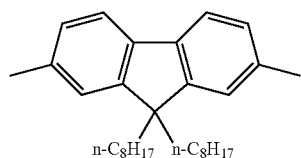
(15-2)

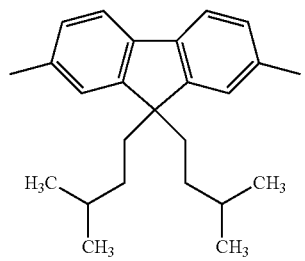
(15-3)

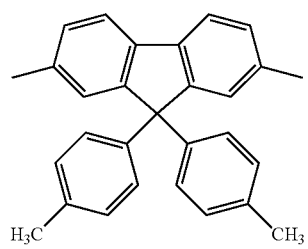
(15-4)

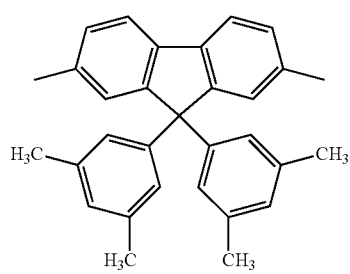
(15-5)

-continued

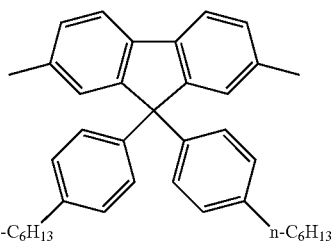
(15-6)

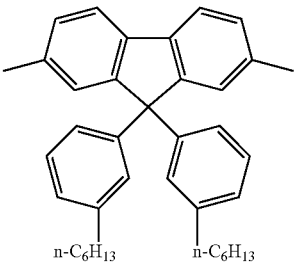
(15-7)

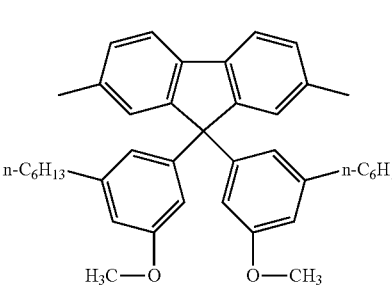
(15-8)

<Composition>

The composition of this embodiment comprises the aforementioned luminescent composition, and a charge transport material comprising a low molecular compound and/or a non-conjugated polymer. Charge transport materials are classified as hole transport materials and electron transport materials. The composition of this embodiment may comprise either a hole transport material or an electron transport material, or it may comprise both.

As hole transport materials there may be used any ones known as hole transport materials for organic EL elements, examples of which include oxadiazole derivatives, quinodimethane and its derivatives, tetracyanoanthraquinodimethane and its derivatives, fluorenone derivatives, diphenyldicyanoethylene and its derivatives, diphenoquinone derivatives, 8-hydroxyquinoline metal complexes, 8-hydroxyquinoline derivative metal complexes, and the like.

Low molecular compounds that may compose charge transport materials include host compounds used in low molecular organic EL elements and compounds used as charge injection transport compounds, and specifically the compounds mentioned in "Organic EL Displays" (Tokito, S., Adachi, C., Murata, H., Ohmsha, Ltd.) p. 107, Gekkan Displays (vol. 9, No. 9, 2003, p. 26-30), Japanese Unexamined Patent Application Publication No. 2004-244400, Japanese Unexamined Patent Application Publication No. 2004-277377, and elsewhere.

More specifically, low molecular compounds for charge transport materials include the following compounds.

[Chemical Formula 25]
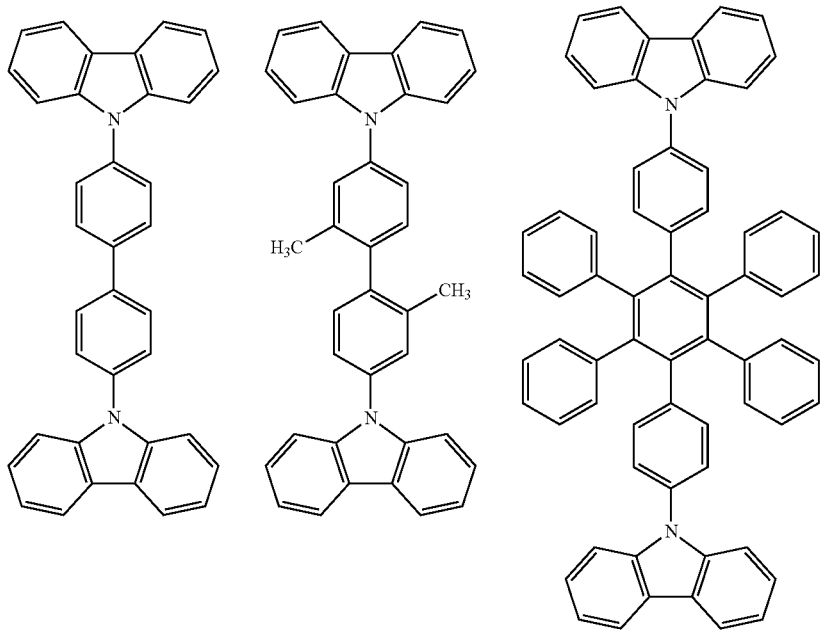
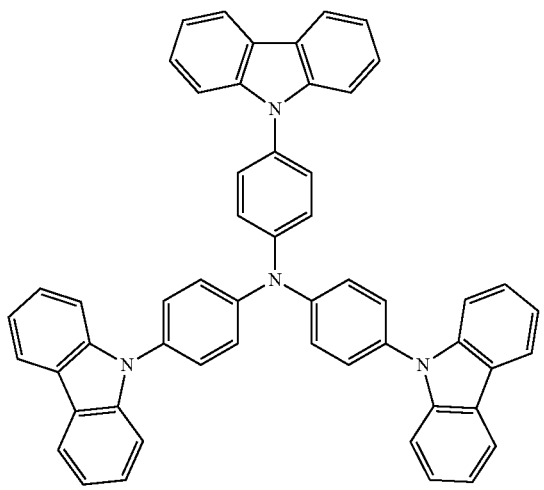
[Chemical Formula 26]
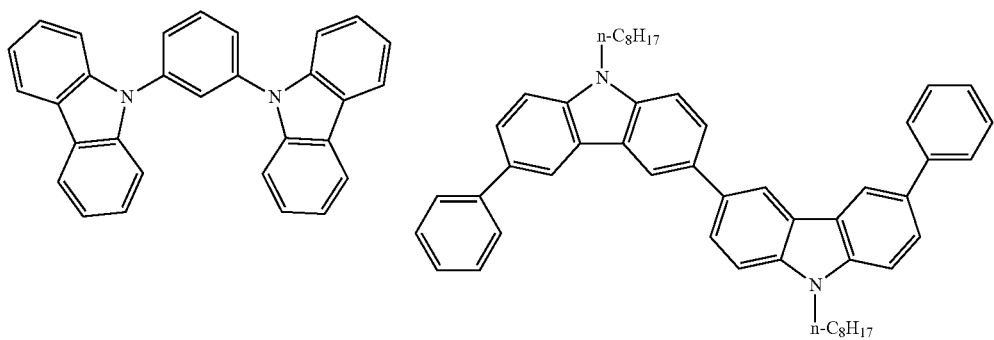

-continued
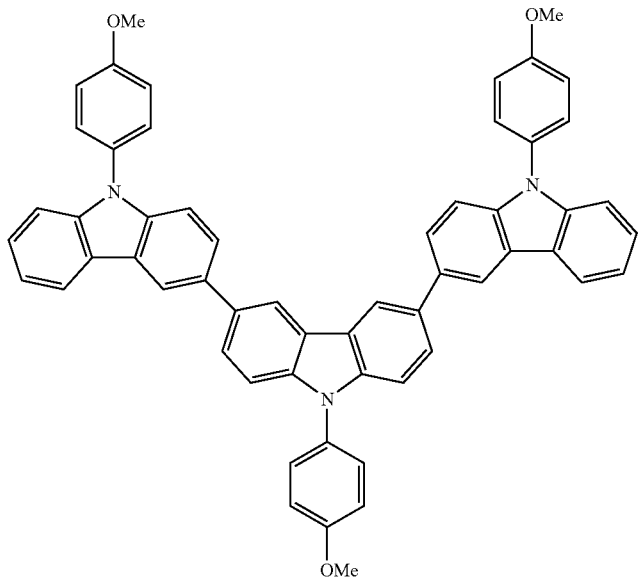
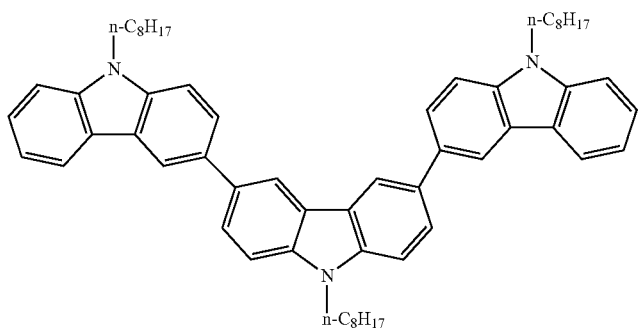
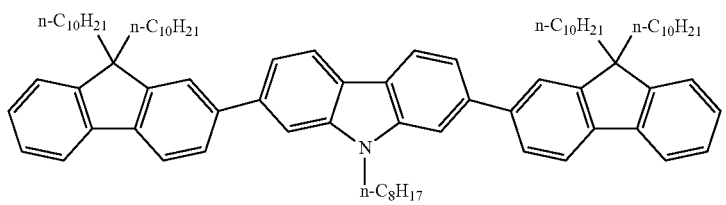
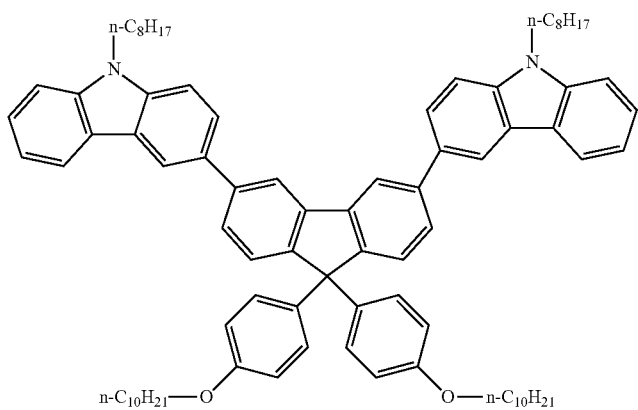

[Chemical Formula 27]
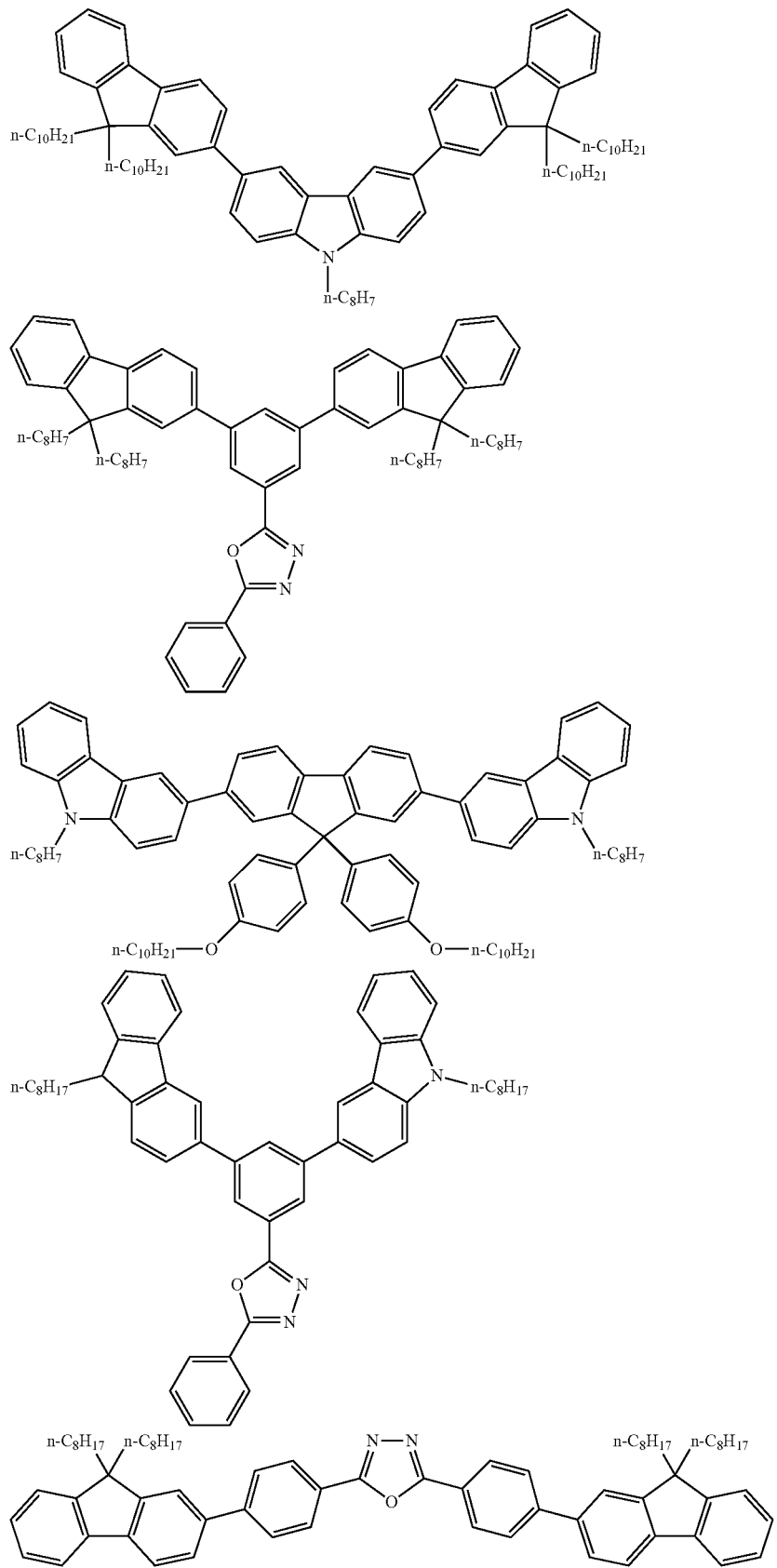

[Chemical Formula 28]

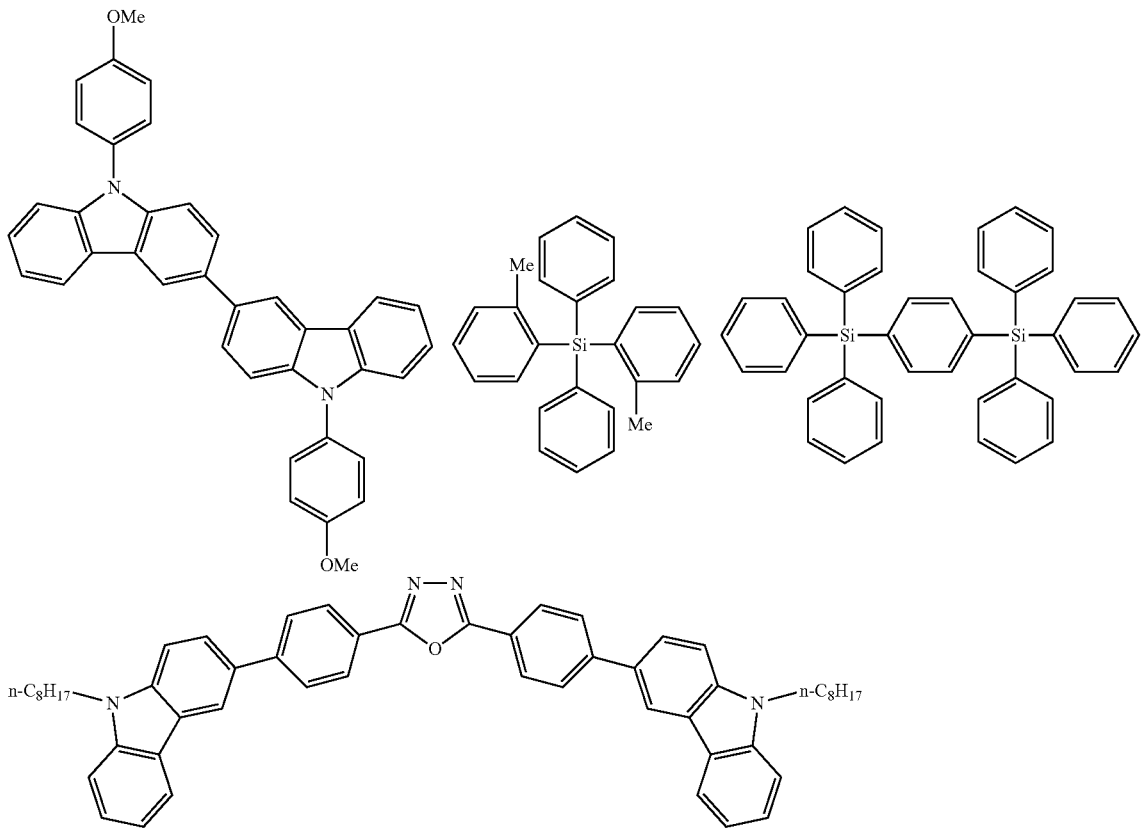

High molecular organic compounds for charge transport materials include non-conjugated polymer compounds. Non-conjugated polymer compounds include polyvinylcarbazole and the like.

<Liquid Composition>

The liquid composition of this embodiment comprises the aforementioned luminescent composition and a solvent or dispersing medium for the luminescent composition. The solvent or dispersing agent to be used in the liquid composition is selected as one that is stable and can uniformly dissolve or disperse the components in the liquid composition. Examples of such solvents include hydrocarbon chlorine-based solvents (chloroform, methylene chloride, 1,2-dichloroethane, 1,1,2-trichloroethane, chlorobenzene, o-dichlorobenzene and the like), ether-based solvents, (tetrahydrofuran, dioxane and the like), aromatic hydrocarbon-based solvents (benzene, toluene, xylene and the like), aliphatic hydrocarbon-based solvents (cyclohexane, methylcyclohexane, n-pentane, n-hexane, n-heptane, n-octane, n-nonane, n-decane and the like), ketone-based solvents (acetone, methyl ethyl ketone, cyclohexanone and the like), ester-based solvents (ethyl acetate, butyl acetate, ethyl cellosolve acetate and the like), polyhydric alcohols and their derivatives (ethylene glycol, ethyleneglycol monobutyl ether, ethyleneglycol monoethyl ether, ethyleneglycol monomethyl ether, dimethoxyethane, propylene glycol, diethoxymethane, triethyleneglycol monoethyl ether, glycerin, 1,2-hexanediol and the like), alcohol-based solvents (methanol, ethanol, propanol, isopropanol, cyclohexanol and the like), sulfoxide-based solvents (dimethyl sulfoxide and the like), and amide-based solvents (N-methyl-2-pyrrolidone, N,N-dimethylformamide and the like). These solvents may be used alone or in combinations of two or more.

When a liquid composition is to be applied in an ink-jet method, the liquid composition may contain known additives to obtain a satisfactory discharge property for the liquid composition, and reproducibility. Known additives include high-boiling-point solvents (anisole, bicyclohexylbenzene and the like) to minimize evaporation from the nozzle. A liquid composition containing such known additives preferably has a viscosity of 1-100 mPa·s at 25° C.

<Light-Emitting Device>

A light-emitting device according to this embodiment is provided with an anode, a cathode, and a layer comprising the luminescent composition, formed between them. The layer comprising the luminescent composition functions at least as a luminescent layer.

The light-emitting device of this embodiment preferably has a pair of electrodes including an anode and cathode, with one (monolayer) or a plurality (multilayer) of film layers comprising at least one luminescent layer sandwiched between the electrodes (between the cathode and anode). At least one of the film layers comprises the luminescent composition.

The content of the luminescent composition in the luminescent layer is preferably 10-100 mass %, more preferably 50-100 mass % and even more preferably 80-100 mass %, with respect to the mass of all of the luminescent layers. In a light-emitting device of this embodiment, the luminescent layer preferably contains the luminescent composition as a luminescent material.

When the light-emitting device is a monolayer, the film is a luminescent layer and the luminescent layer comprises a luminescent composition. When the light-emitting device is a multilayer, it may have any of the following laminar structures, for example.

(a) Anode/hole injection layer (hole transport layer)/luminescent layer/cathode
(b) Anode/luminescent layer/electron injection layer (electron transport layer)/cathode
(c) Anode/hole injection layer (hole transport layer)/luminescent layer/electron injection layer (electron transport layer)/cathode The anode of the light-emitting device supplies holes to the hole injection layer, hole transport layer and luminescent layer, and it is effective for it to have a work function of 4.5 eV or greater. As the anode material there may be used a metal, alloy, metal oxide or electrically conductive compound, or a mixture thereof. Specifically, it may be a conductive metal oxide such as tin oxide, zinc oxide, indium oxide or indium tin oxide (ITO), a metal such as gold, silver, chromium or nickel, or a mixture or laminate of these conductive metal oxides and metals, an inorganic conductive substance such as copper iodide or copper sulfide, an organic conducting material such as a polyaniline, polythiophene (PEDOT or the like) or polypyrrole, or a laminate of these with ITO.

The cathode of the light-emitting device supplies electrons to the electron injection layer, electron transport layer and luminescent layer. As the cathode material there may be used a metal, alloy, metal halide, metal oxide, electrically conductive compound, or a mixture thereof. Specific examples of cathode materials include alkali metals (lithium, sodium, potassium, cesium and the like) and their fluorides and oxides, alkaline earth metals (magnesium, calcium, barium, and the like) and their fluorides and oxides, gold, silver, lead, aluminum, alloys and blend alloys (sodium-potassium alloy, sodium-potassium blend alloy, lithium-aluminum alloy, lithium-aluminum blend alloy, magnesium-silver alloy, magnesium-silver blend alloy, and the like), and rare earth metals (ytterbium and the like), and indium.

The hole injection layer and hole transport layer of the light-emitting device may have a function of injecting holes from the anode, a function of transporting holes, or a function of serving as a barrier to electrons injected from the cathode. A known material may be selected for use as the material for these layers, and examples thereof include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, polysilane-based compounds, poly(N-vinylcarbazole) derivatives, organosilane derivatives, and polymers comprising the same. It may also be a conductive polymer oligomer, such as an aniline-based copolymer, thiophene oligomer or polythiophene. These materials may be used alone as single components, or as multiple components in combination. Also, the hole injection layer and hole transport layer may have a monolayer structure comprising one or more of the aforementioned materials, or they may have a multilayer structure comprising multiple layers of the same composition or different compositions.

The electron injection layer and electron transport layer of the light-emitting device may have a function of injecting electrons from the cathode, a function of transporting electrons, or a function of serving as a barrier to holes injected from the anode. Known materials may be selected for use, specific examples of which include triazole derivatives, oxazole derivatives, oxadiazole derivatives, imidazole derivatives, fluorenone derivatives, quinodimethane derivatives, anthrone derivatives, diphenylquinone derivatives, thiopyran dioxide derivatives, carbodiimide derivatives, fluorenylidenemethane derivatives, distyrylpyrazine derivatives, tetracarboxylic anhydrides of aromatic rings such as naphthalene and perylene, various types of metal complexes including metal complexes of phthalocyanine derivatives or 8-quinolinol derivatives, metal phthalocyanines, and metal complexes whose ligands are benzooxazole or benzothiazole, and organosilane derivatives. Also, the electron injection layer and electron transport layer may have a monolayer structure comprising one or more of the aforementioned materials, or it may have a multilayer structure comprising multiple layers of the same composition or different compositions.

In a light-emitting device of this embodiment, the materials used for the electron injection layer and electron transport layer may also be insulator or semiconductor inorganic compounds. If the electron injection layer and electron transport layer are formed with an insulator or semiconductor, it is possible to effectively prevent leakage of current and increase the electron injection property. Such an insulator may be at least one metal compound selected from the group consisting of alkali metal chalcogenides, alkaline earth metal chalcogenides, alkali metal halides and alkaline earth metal halides. Specific examples of preferred alkali metal chalcogenides include CaO, BaO, SrO, BeO, BaS and CaSe. Semiconductors used to form the electron injection layer and electron transport layer may be oxides, nitrides or oxynitrides comprising at least one element selected from the group consisting of Ba, Ca, Sr, Yb, Al, Ga, In, Li, Na, Cd, Mg, Si, Ta, Sb and Zn. These oxides, nitrides and oxynitrides may be used alone or in combinations of 2 or more.

The light-emitting device of this embodiment may also have a reducing dopant added at the interface region with the film adjacent to the cathode. Preferred as reducing dopants are one or more compounds selected from the group consisting of alkali metals, alkaline earth metal oxides, alkaline earth metals, rare earth metals, alkali metal oxides, alkali metal halides, alkaline earth metal oxides, alkaline earth metal halides, rare earth metal oxides, rare earth metal halides, alkali metal complexes, alkaline earth metal complexes and rare earth metal complexes.

The luminescent layer of the light-emitting device has the function of allowing injection of holes from the anode or hole injection layer and allowing injection of electrons from the cathode or electron injection layer, during application of voltage, the function of causing migration of injected electrical charge (electrons and holes) by electric field force, and the function of providing a site for recombination between electrons and holes, leading to luminescence. The luminescent layer of the light-emitting device preferably contains the aforementioned luminescent composition. The luminescent composition in the luminescent layer is present at preferably 10-100 mass %, more preferably 50-100 mass % and even more preferably 80-100 mass %, with respect to the mass of all of the luminescent layers. In a light-emitting device of this embodiment, the luminescent layer preferably contains the luminescent composition as a luminescent material.

A known method may be used as the method for forming each layer in the light-emitting device. Specifically, this may be vacuum vapor deposition method (resistance heating vapor deposition method, electron beam method and the like), sputtering method, LB method, molecular stacking method, or coating method (casting method, spin coating method, bar coating method, blade coating method, roll coating method, gravure printing method, screen printing method, ink jet printing method or the like).

Film formation is preferably accomplished by a coating method, from the viewpoint of allowing the production process to be simplified. In a coating method, formation may be accomplished by dissolving the luminescent composition in a solvent to prepare a coating solution, and coating and drying the coating solution on the desired layer (or electrode). A resin may also be added as a binder to the coating solution, and the resin may be either dissolved or dispersed in the solvent. The resin used may be a non-conjugated polymer compound (for example, polyvinylcarbazole), or a conjugated polymer compound (for example, a polyolefin-based polymer). More specifically, polyvinyl chloride, polycarbonate, polystyrene, polymethyl methacrylate, polybutyl methacrylate, polyester, polysulfone, polyphenylene oxide, polybutadiene, poly(N-vinylcarbazole), or a hydrocarbon resin, ketone resin, phenoxy resin, polyamide, ethylcellulose, vinyl acetate, ABS resin, polyurethane, melamine resin, unsaturated polyester resin, alkyd resin, epoxy resin or silicon resin, for example, may be selected depending on the purpose. The solution may also contain an antioxidant, viscosity modifier or the like, depending on the purpose.

The preferred thickness of each layer of the light-emitting device of the invention will differ depending on the type of material and the laminar structure, but an excessively small thickness will generally tend to result in defects such as pinholes, while an excessively large thickness will require a high applied voltage and will reduce the luminous efficiency, and it is therefore usually preferred to be between 1 nm and 1 μm.

Examples of usage of the light-emitting device of the invention include surface light sources, lighting sources, sign light sources, backlight light sources, display units and printer heads. A segment-type or dot matrix-type construction may be selected for a display unit, using known driving technology, driving circuits and the like.

<Method for Producing Light-Emitting Device>

The method for producing a light-emitting device according to this embodiment is a method for producing a light-emitting device with increased luminance life, wherein a luminescent composition comprising a luminescent organic compound and a conjugated polymer compound having a luminescence maximum further toward the short wavelength end than the luminescence maximum of the luminescent organic compound at 350 nm to 500 nm, and satisfying the following formula (1), is added to a luminescent layer in the light-emitting device. According to this production method it is possible to produce a light-emitting device with increased luminance life. The luminescent organic compound and conjugated polymer compound used in the method for producing a light-emitting device according to this embodiment may be the same ones described above.

$$f(g,h) \times w \geq 0.04 \quad (1)$$

[In the formula, $f(g, h)$ represents the convolution integral of the emission spectrum of the conjugated polymer compound and the gram absorption coefficient spectrum of the luminescent organic compound (L/g·cm) in the range of 200 nm to 800 nm, in 1 nm steps, and w represents the content ratio of the luminescent organic compound with respect to 1 part by mass as the total content of the luminescent organic compound and the conjugated polymer compound in the luminescent composition. For the emission spectrum, the emission spectrum obtained by excitation of the conjugated polymer compound with 360 nm light was normalized with the maximum luminescence intensity at 350 nm to 500 nm as 1.]

The embodiments described above are preferred embodiments of the invention, but the invention is not limited thereto. For example, this embodiment was described as a method for producing a light-emitting device, but the invention may also be interpreted as being a method of increasing the luminance life of a light-emitting device, wherein a luminescent composition comprising a luminescent organic compound and a conjugated polymer compound having a luminescence maximum further toward the short wavelength end than the luminescence maximum of the luminescent organic compound at 350 nm to 500 nm, and satisfying formula (1), is added to a luminescent layer in the aforementioned light-emitting device.

The invention may also be interpreted as being a method of selecting a luminescent composition to obtain a light-emitting device with excellent luminance life, wherein a luminescent composition which comprises a luminescent organic compound and a conjugated polymer compound having a luminescence maximum further toward the short wavelength end than the luminescence maximum of the luminescent organic compound at 350 nm to 500 nm, and satisfying formula (1), is selected as the luminescent composition.

EXAMPLES

The present invention will now be explained in greater detail based on examples and comparative examples, with the understanding that the invention is in no way limited to the examples.

(Number-Average Molecular Weight and Weight-Average Molecular Weight)

Throughout the examples, the number-average molecular weights and weight-average molecular weights in terms of polystyrene were determined by gel permeation chromatography (GPC, trade name: LC-10Avp by Shimadzu Corp.). The polymer compound to be measured was dissolved in tetrahydrofuran (hereunder referred to as "THF") to a concentration of about 0.5 mass % and 30 μL thereof was injected into the GPC. The GPC mobile phase used was THF, and the flow rate was 0.6 mL/min. The columns used were two TSKgel SuperHM–H (Tosoh Corp.) columns and one TSKgel SuperH2000 (Tosoh Corp.) column, connected in series. The detector used was a differential refractometer (trade name: RID-10A, product of Shimadzu Corp.).

(NMR Measurement)

NMR measurement in the examples was conducted under the following conditions.

Apparatus: Nuclear magnetic resonance apparatus, INOVA300 (trade name), product of Varian, Japan
Measuring solvent: Deuterated chloroform
Sample concentration: Approximately 1 mass %
Measuring temperature: 25° C.

(High-Performance Liquid Chromatography)

The high-performance liquid chromatography (hereunder, "HPLC") in the examples was conducted under the following conditions.
Apparatus: LC-20A (trade name), product of Shimadzu Corp.
Column: Kaseisorb LC ODS-AM 4.6 mm I.D.×100 mm, product of Tokyo Chemical Industry Co., Ltd.
Mobile phase: 0.1 mass % acetic acid-containing water/0.1 mass % acetic acid-containing acetonitrile
Detector: UV detector, detection wavelength: 254 nm (Emission Spectroscopy)

The emission spectra of the luminescent organic compounds and conjugated polymer compounds in the examples were measured under the following conditions.
Apparatus: Fluorescence spectrophotometer, Model FP-6500, product of JASCO Corp.
Measuring solvent: Toluene
Sample concentration: The film was prepared using a 0.8×$10^{-3}$ mass % toluene solution for the luminescent organic compound and a 1.2 mass % toluene solution for the conjugated polymer compound.
Measuring temperature: 25° C.

(Gram Absorption Spectroscopy)

The gram emission spectra of the luminescent organic compounds in the examples were measured under the following conditions.
Apparatus: Ultraviolet and visible spectrophotometer, Cary 5E, product of Varian, Japan Measuring solvent: Toluene
Sample concentration: 8×$10^4$ mass %
Measuring temperature: 25° C.

(Gas Chromatography)

Gas chromatography (hereunder, "GC") in the examples was conducted under the following conditions.
Apparatus: Agilent Technology, 6890N network GC
Column: BPX5 0.25 mm I.D.×30 m, SGE Analytical Science
Mobile phase: Helium
Detector: Flame ionization detector (FID)

Synthesis of Luminescent Organic Compound

Synthesis Example A-1

Synthesis of Luminescent Organic Compound (A-1)

The luminescent organic compound represented by the following formula (A-1) (hereunder referred to as "luminescent organic compound (A-1)" was synthesized according to the following reaction scheme

[Chemical Formula 29]

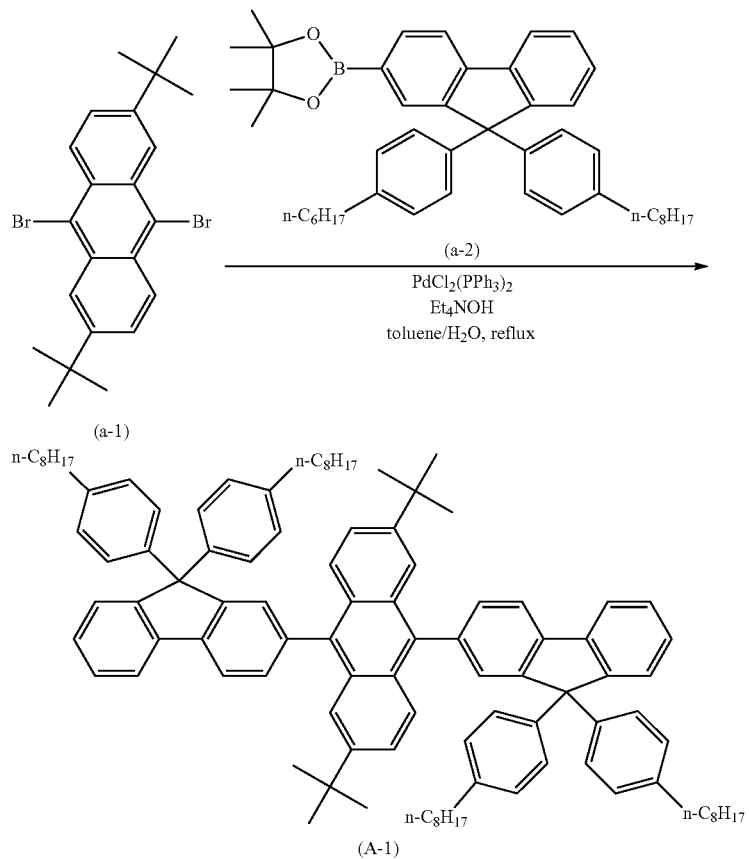

Specifically, 0.97 g (2.16 mmol) of 2,6-di-tert-butyl-9,10-dibromoanthracene (compound represented by formula (a-1)), 3.97 g of a compound represented by formula (a-2) and 4.78 g of an aqueous tetraethylammonium hydroxide solution (20 mass % aqueous solution) were placed in a 100 mL three-necked flask, and the gas in the flask was exchanged with nitrogen. After adding 19.5 mL of toluene and 27 mg of dichlorobis(triphenylphosphine)palladium (PdCl$_2$(PPh$_3$)$_2$), the mixture was heated at 105° C. for 2 hours. The solution that had been allowed to cool was then filtered with a funnel precoated with Celite. The filtrate was separated, the organic layer was rinsed with water, and then the organic layer was dried over anhydrous sodium sulfate, filtered and concentrated. The obtained residue was purified by a silica gel column to obtain 1.7 g of luminescent organic compound (A-1) as a yellow solid.

TLC-MS (DART, positive): [M+H]$^+$ 1371.8

Synthesis Example A-2

Synthesis of Luminescent Organic Compound (A-2)

The luminescent organic compound represented by the following formula (A-2) (hereunder referred to as "luminescent organic compound (A-2)" was synthesized according to the following reaction scheme.

[Chemical Formula 30]

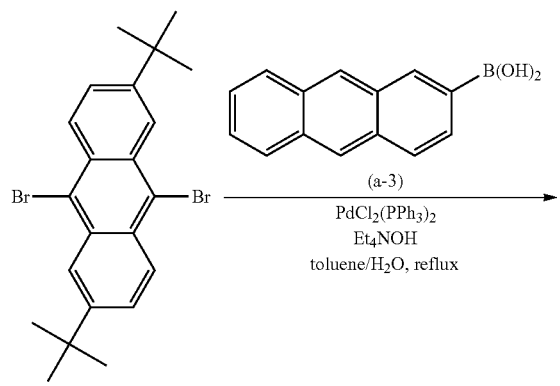

-continued

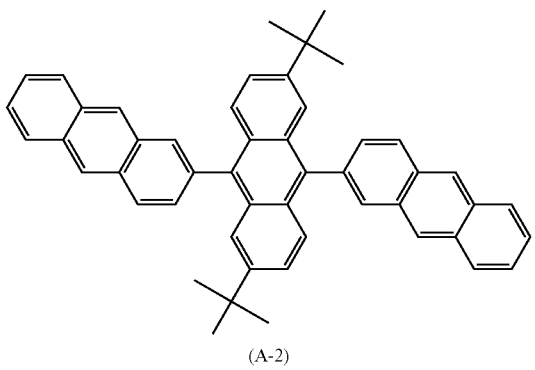

(A-2)

Specifically, 1.21 g (2.70 mmol) of 2,6-di-tert-butyl-9,10-dibromoanthracene (compound represented by formula (a-1)), 1.26 g of 2-anthraceneboronic acid (compound represented by formula (a-3)) and 5.96 g of an aqueous tetraethylammonium hydroxide solution (20 mass % aqueous solution) were placed in a 500 mL three-necked flask, and the gas in the flask was exchanged with nitrogen. After adding 300 mL of toluene and 160 mg of tetrakis(triphenylphosphine)palladium (Pd(PPh$_3$)$_4$), the mixture was heated at 105° C. for 7 hours. When subsequently allowed to cool, a solid precipitated. The solid was filtered and recrystallized from toluene to obtain 1.1 g of luminescent organic compound (A-2) as a yellow solid.

TLC-MS (DART, positive): [M+H]$^+$ 643.3

Synthesis Example A-3

Synthesis of Luminescent Organic Compound (A-3)

The luminescent organic compound represented by the following formula (A-3) (hereunder referred to as "luminescent organic compound (A-3)" was synthesized according to the following reaction scheme.

[Chemical Formula 31]

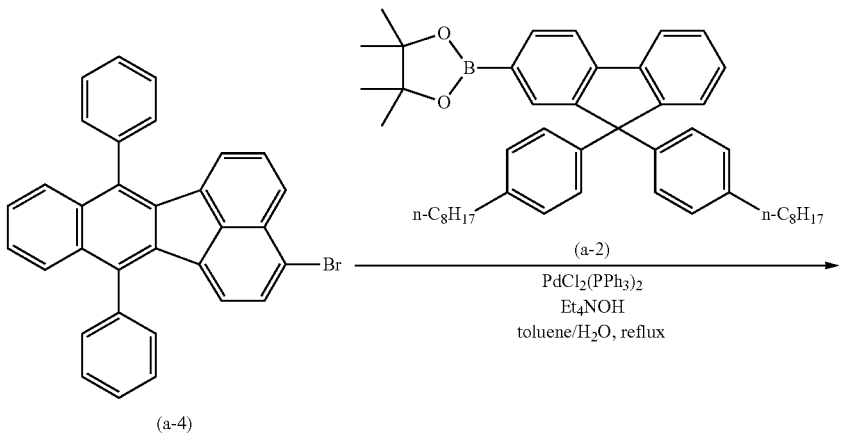

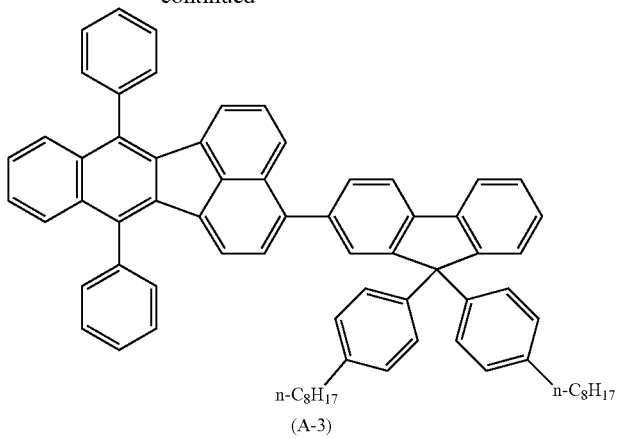

(A-3)

Specifically, 0.38 g (0.79 mmol) of 3-bromo-7,12-diphenylbenzo[k]fluoranthene (compound represented by formula (a-4)), 0.57 g of a compound represented by formula (a-2) and 4.39 g of an aqueous tetraethylammonium hydroxide solution (20 mass % aqueous solution) were placed in a 100 mL three-necked flask, and the gas in the flask was exchanged with nitrogen. After adding 11.5 mL of toluene and 27 mg of dichlorobis(triphenylphosphine)palladium ($PdCl_2(PPh_3)_2$), the mixture was heated at 105° C. for 2 hours. The solution that had been allowed to cool was then filtered with a funnel precoated with Celite. The filtrate was separated, the organic layer was rinsed with water, and then the organic layer was dried over anhydrous sodium sulfate, filtered and concentrated. The obtained residue was purified by a silica gel column to obtain 0.60 g of luminescent organic compound (A-3) as a yellow solid.

LC-MS (APPI, positive): [M+H]$^+$ 945.5

Synthesis Example A-6

Synthesis of Luminescent Organic Compound (A-6)

The luminescent organic compound represented by the following formula (A-6) (hereunder referred to as "luminescent organic compound (A-6)" was synthesized according to the following reaction scheme.

[Chemical Formula 32]

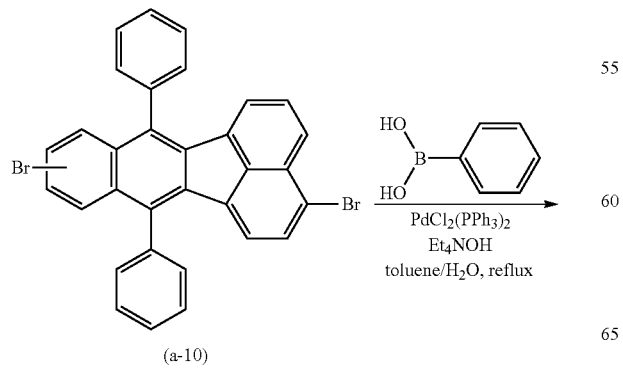

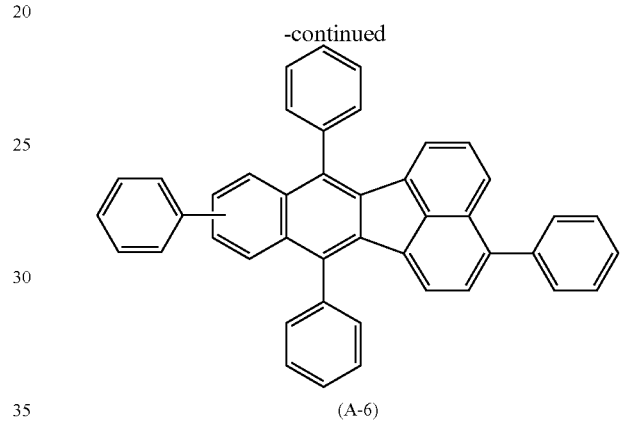

(A-6)

Specifically, 0.20 g (0.36 mmol) of compound (a-10), 0.21 g of phenylboronic acid and 1.56 g of an aqueous tetraethylammonium hydroxide solution (20 mass % aqueous solution) were placed in a 100 mL three-necked flask, and the gas in the flask was exchanged with nitrogen. After adding 2 mL of toluene and 2 mg of dichlorobis(triphenylphosphine)palladium ($PdCl_2(PPh_3)_2$), the mixture was stirred for 8 hours while heating at 105° C. The obtained solution was cooled to room temperature, and then filtered with a funnel precoated with Celite. The filtrate was separated, the organic layer was rinsed with water, and then the organic layer was dried over anhydrous sodium sulfate, filtered and concentrated. The obtained residue was purified by a silica gel column to obtain 67 mg of luminescent organic compound (A-6) as a yellow solid.

TLC-MS (DART, positive): [M+H]$^+$ 557.2

Synthesis Example A-7

Synthesis of Luminescent Organic Compound (A-7)

The luminescent organic compound represented by the following formula (A-7) (hereunder referred to as "luminescent organic compound (A-7)" was synthesized according to the following reaction scheme.

[Chemical Formula 33]

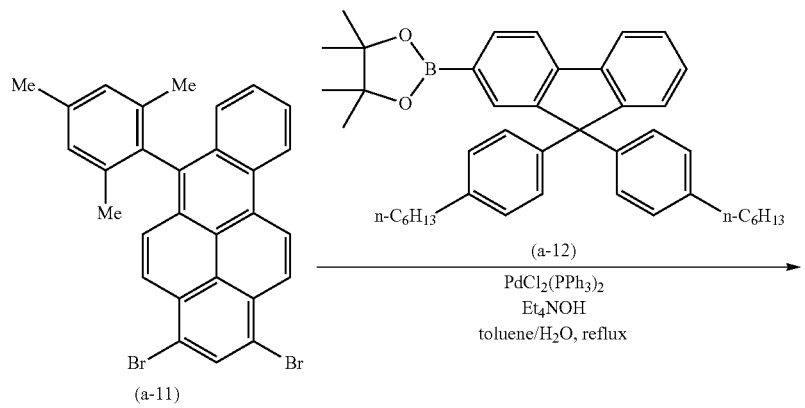

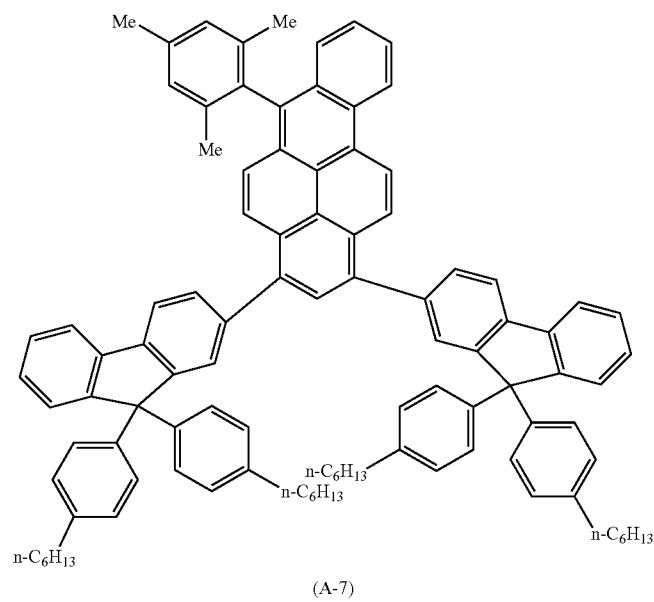

Specifically, 0.37 g (0.70 mmol) of compound (a-11), 0.90 g of compound (a-12) and 1.55 g of an aqueous tetraethylammonium hydroxide solution (20 mass % aqueous solution) were placed in a 50 mL three-necked flask, and the gas in the flask was exchanged with nitrogen. After adding 15 mL of toluene and 25 mg of dichlorobis(triphenylphosphine)palladium (PdCl$_2$(PPh$_3$)$_2$), the mixture was stirred at 105° C. for 8 hours. The obtained solution was cooled to room temperature, and then filtered with a funnel precoated with Celite. The filtrate was separated, the organic layer was rinsed with water, and then the organic layer was dried over anhydrous sodium sulfate, filtered and concentrated. The obtained residue was purified by a silica gel column to obtain 0.45 g of luminescent organic compound (A-7) as a yellow solid.

Synthesis Example A-8

Synthesis of Luminescent Organic Compound (A-8)

The luminescent organic compound represented by the following formula (A-8) (hereunder referred to as "luminescent organic compound (A-8)" was synthesized according to the following reaction scheme.

[Chemical Formula 34]

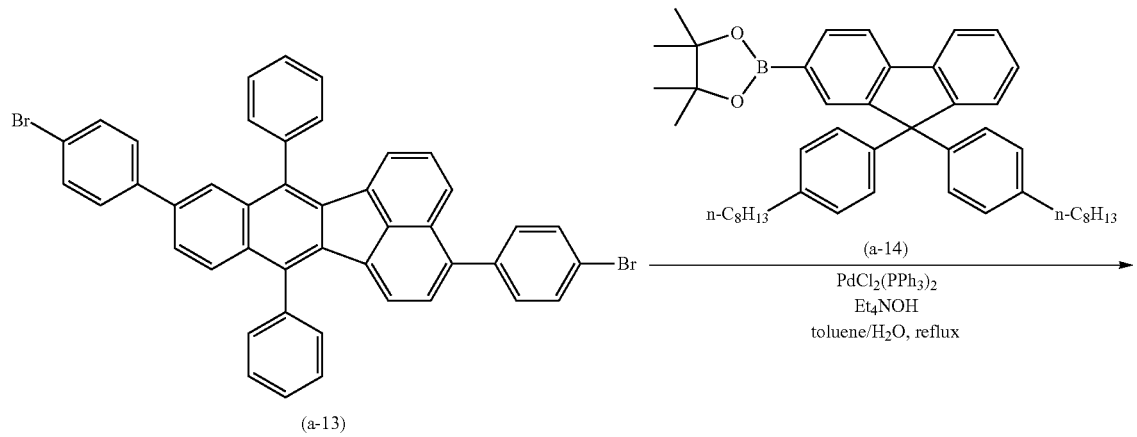

(a-13)

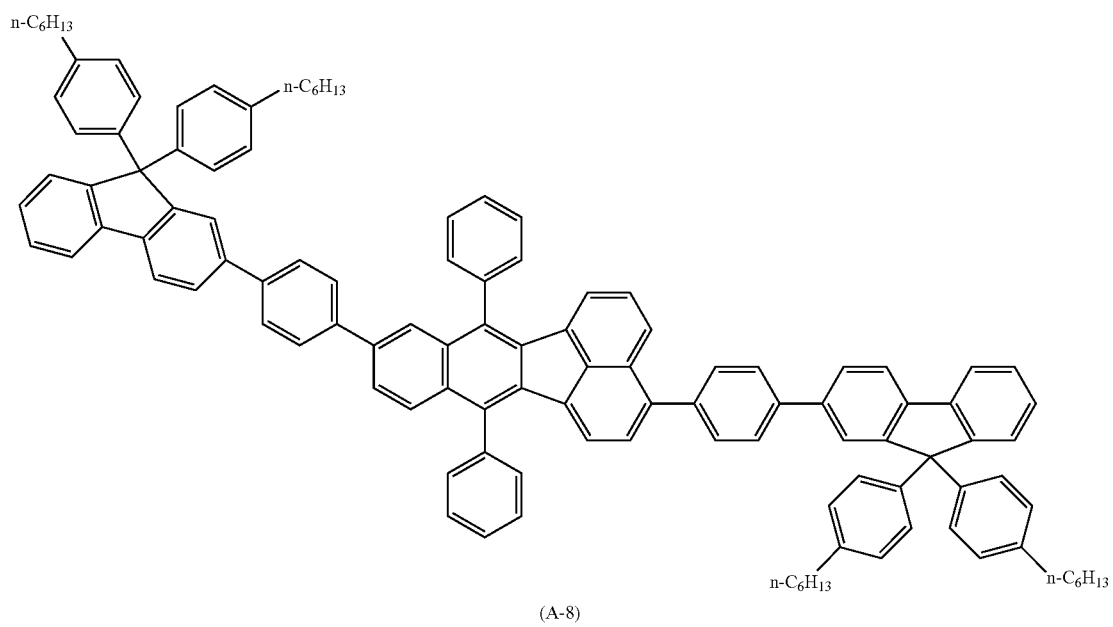

(A-8)

Specifically, 0.20 g (0.28 mmol) of compound (a-13), 0.45 g of compound (a-14) and 1.46 g of an aqueous tetraethylammonium hydroxide solution (20 mass % aqueous solution) were placed in a 100 mL three-necked flask, and the gas in the flask was exchanged with nitrogen. After adding 3 mL of toluene and 17 mg of dichlorobis(triphenylphosphine)palladium ($PdCl_2(PPh_3)_2$), the mixture was stirred at 105° C. for 11 hours. The obtained solution was cooled to room temperature, and then filtered with a funnel precoated with Celite. The filtrate was separated, the organic layer was rinsed with water, and then the organic layer was dried over anhydrous sodium sulfate, filtered and concentrated. The obtained residue was purified by a silica gel column to obtain 0.21 g of luminescent organic compound (A-8) as a yellow solid.

LC-MS (APPI, positive): $[M+H]^+$ 1525.5

Synthesis Example A-9

Synthesis of Luminescent Organic Compound (A-9)

The luminescent organic compound represented by the following formula (A-9) (hereunder referred to as "luminescent organic compound (A-9)" was synthesized according to the following reaction scheme.

[Chemical Formula 35]

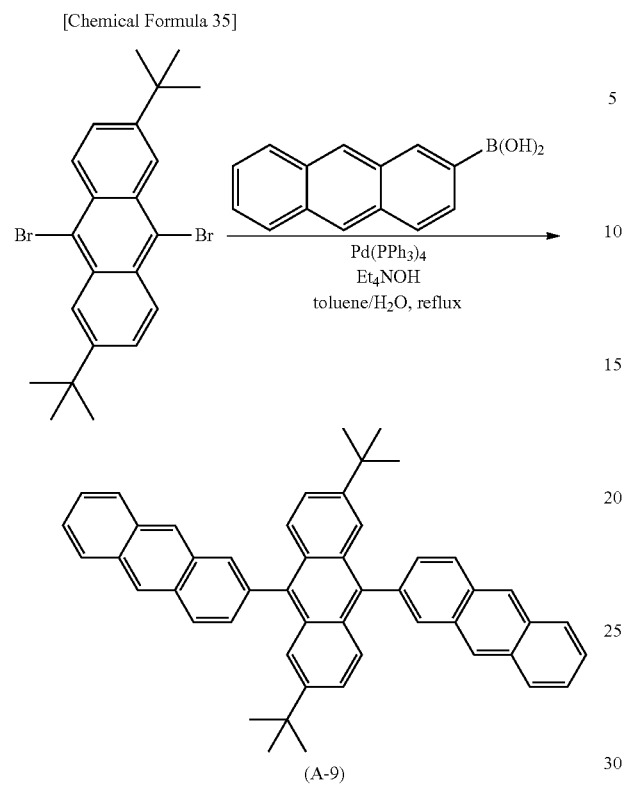

[Chemical Formula 36]

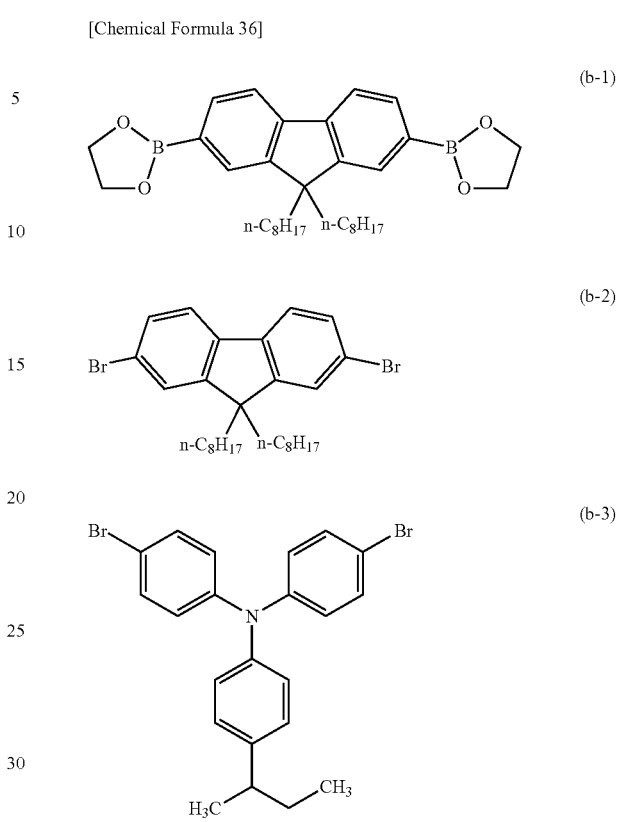

Specifically, 1.21 g (2.70 mmol) of 2,6-di-tert-butyl-9,10-dibromoanthracene, 1.26 g of 2-anthraceneboronic acid and 5.96 g of an aqueous tetraethylammonium hydroxide solution (20 mass % aqueous solution) were placed in a 500 mL three-necked flask, and the gas in the flask was exchanged with nitrogen. After adding 300 mL of toluene and 160 mg of tetrakis(triphenylphosphine)palladium (Pd(PPh$_3$)$_4$), the mixture was heated at 105° C. for 7 hours. When allowed to cool, a solid precipitated. The solid was filtered and recrystallized from toluene to obtain 1.1 g of luminescent organic compound (A-9) as a yellow solid.

TLC-MS (DART, positive): [M+H]$^+$643.3

Synthesis of Conjugated Polymer Compound

Synthesis Example B-1

Synthesis of Conjugated Polymer Compound (B-1)

To a 200 mL separable flask there were added 3.182 g (6.0 mmol) of 9,9-dioctylfluorene-2,7-diboric acid ethyleneglycol ester (compound represented by the following formula (b-1)), 2.632 g (4.8 mmol) of 9,9-dioctyl-2,7-dibromofluorene (compound represented by the following formula (b-2)), 0.551 g (1.2 mmol) of N,N-bis(4-bromophenyl)-4-sec-butylaniline (compound represented by the following formula (b-3)), 0.78 g of methyltrioctylammonium chloride (trade name: Aliquat336 by Aldrich Co.) and 60 mL of toluene. A 4.3 mg portion of bistriphenylphosphinepalladium dichloride was added under a nitrogen atmosphere, and the mixture was heated to 95° C.

The obtained solution was heated to 105° C. while adding dropwise 16.5 mL of 17.5 mass % aqueous sodium carbonate, and the mixture was stirred for 3 hours. Next, 0.732 g of phenylboric acid, 4.2 mg of bistriphenylphosphinepalladium dichloride (PdCl$_2$(PPh$_3$)$_2$) and 60 mL of toluene were added, and the mixture was stirred at 105° C. for 18 hours. After removing the aqueous layer, 3.65 g of sodium N,N-diethyldithiocarbamate trihydrate and 36 mL of ion-exchanged water were added, and the mixture was stirred at 85° C. for 2 hours. After separating the organic layer from the aqueous layer, the organic layer was rinsed with 78 mL of ion-exchanged water (2 times), 78 mL of 3 mass % aqueous acetic acid (2 times) and 78 mL of ion-exchanged water (2 times) in that order.

The organic layer was dropped into methanol to precipitate a polymer, and the precipitate was filtered and then dried to obtain a solid. The solid was dissolved in toluene, and the solution was passed through a silica gel/alumina column that had been previously passed through with toluene, the eluate that passed through was dropped into methanol to precipitate a polymer, and the precipitate was filtered and then dried to obtain 3.23 g of a polymer (hereunder referred to as "conjugated polymer compound (B-1)"). The polystyrene-equivalent number-average molecular weight Mn of conjugated polymer compound (B-1) was $1.3 \times 10^5$, and the polystyrene-equivalent weight-average molecular weight Mw was $3.1 \times 10^5$.

Conjugated polymer compound (B-1) is a polymer comprising a repeating unit represented by the following formula (b-4) and a repeating unit represented by the following formula (b-5) in a molar ratio of 90:10.

[Chemical Formula 37]

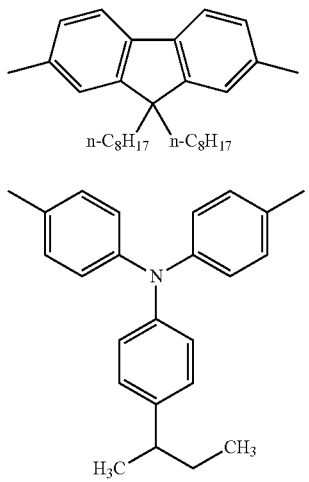

(b-4)

(b-5)

[Chemical Formula 40]

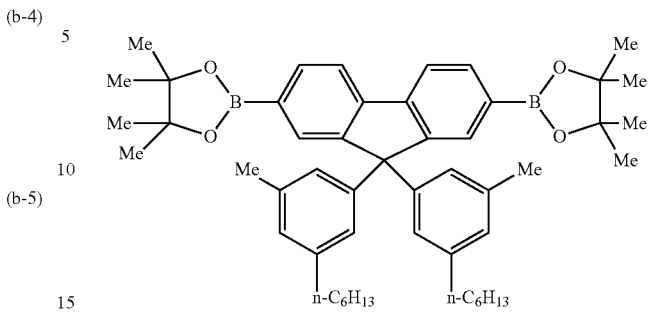

(3.284 g, 4.27 mmol), a compound represented by the following formula:

[Chemical Formula 41]

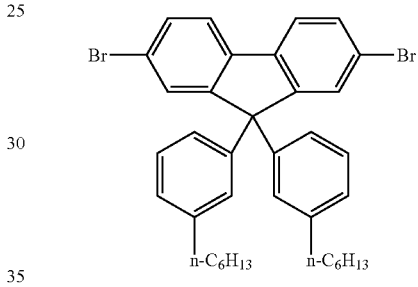

Synthesis Example B-2

Synthesis of Conjugated Polymer Compound (B-2)

After mixing a compound represented by the following formula:

[Chemical Formula 38]

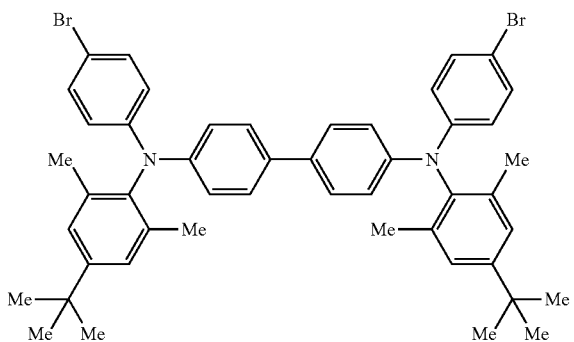

(0.987 g, 1.20 mmol), a compound represented by the following formula:

[Chemical Formula 39]

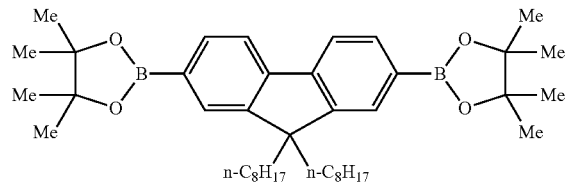

(1.082 g, 1.68 mmol), a compound represented by the following formula:

(3.107 g, 4.80 mmol), dichlorobis(triphenylphosphine)palladium ($PdCl_2(PPh_3)_2$) (4.21 mg) and toluene (145 ml) under an argon atmosphere, the mixture was heated to 105° C. A 20 mass % aqueous tetraethylammonium hydroxide solution (22 ml) was added dropwise to the reaction mixture, which was then refluxed for 3 hours and 30 minutes. Following the reaction, phenylboric acid (74 mg) and an aqueous 20 mass % tetraethylammonium hydroxide solution (22 ml) were added, and reflux was continued for 17 hours. Next, an aqueous sodium diethyldithiacarbamate solution was added and the mixture was stirred at 80° C. for 2 hours. After cooling, the organic layer was rinsed twice with water (78 ml), twice with a 3 mass % acetic acid aqueous solution (78 ml) and twice with water (78 ml), and the obtained solution was added dropwise to methanol (1000 mL) and filtered to obtain a precipitate. The precipitate was dissolved in toluene (188 ml) and passed through an alumina column and a silica gel column in that order for purification. The obtained solution was added dropwise to methanol (1000 ml) and stirred, and then the resulting precipitate was filtered out and dried to obtain 4.50 g of a polymer compound (hereunder referred to as "conjugated polymer compound (B-2)"). The polystyrene-equivalent number-average molecular weight of conjugated polymer compound (B-2) was $9.38 \times 10^4$, and the polystyrene-equivalent weight-average molecular weight was $2.70 \times 10^5$.

Conjugated polymer compound (B-2) is a random copolymer composed of a constitutional unit represented by the following formula:

[Chemical Formula 42]

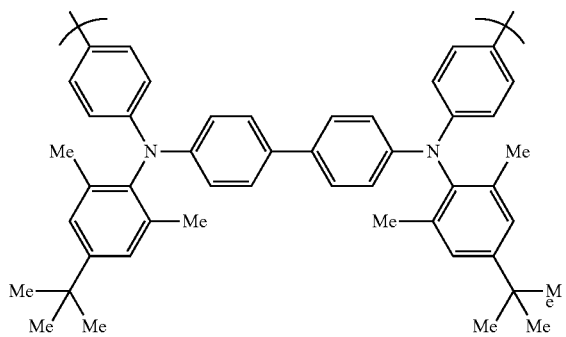

a constitutional unit represented by the following formula:

[Chemical Formula 43]

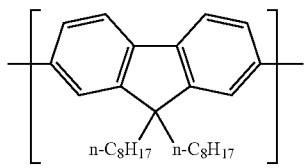

a constitutional unit represented by the following formula:

[Chemical Formula 44]

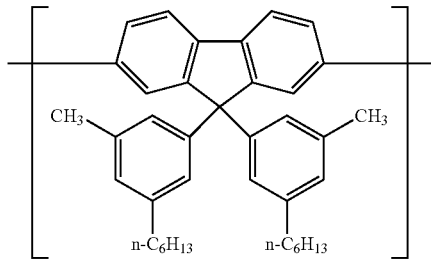

and a constitutional unit represented by the following formula:

[Chemical Formula 45]

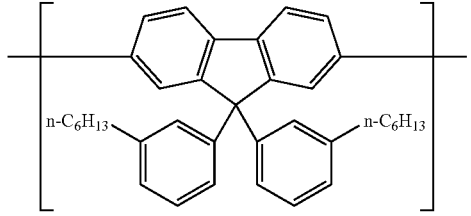

in a molar ratio of 10:14:36:40, based on the theoretical values calculated from the charged starting materials.

Synthesis of Hole Transporting Polymer Compound

Synthesis Example C-1

Synthesis of Hole Transporting Polymer Compound (C-1)

To a Dimroth-connected flask there were added 5.25 g (9.9 mmol) of a compound represented by the following formula (c-1), 4.55 g (9.9 mmol) of a compound represented by the following formula (c-2), 0.91 g of methyltrioctylammonium chloride (trade name: Aliquat 336, product of Aldrich Co.) and 69 ml of toluene, to obtain a monomer solution. The monomer solution was heated under a nitrogen atmosphere, and then 2 mg of palladium acetate and 15 mg of tris(2-methylphenyl)phosphine were added at 80° C. After then pouring 9.8 g of 17.5 mass % aqueous sodium carbonate into the obtained monomer solution, the mixture was stirred at 110° C. for 19 hours. Next, 121 mg of phenylboric acid dissolved in 1.6 ml of toluene was added thereto and the mixture was stirred at 105° C. for 1 hour.

[Chemical Formula 46]

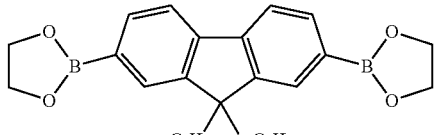

(c-1)

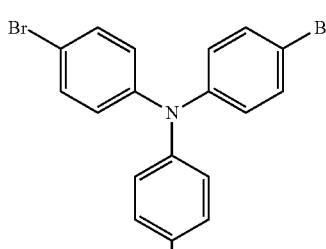

(c-2)

The organic layer and aqueous layer were separated, and then 300 ml of toluene was added to the organic layer. The organic layer was rinsed with 40 ml of 3 mass % aqueous acetic acid (2 times) and 100 ml of ion-exchanged water (once) in that order, and separated from the aqueous layer. Next, 0.44 g of sodium N,N-diethyldithiocarbamate trihydrate and 12 ml of toluene were added to the organic layer, and the mixture was stirred at 65° C. for 4 hours.

The obtained toluene solution of the reaction product was passed through a silica gel/alumina column that had been previously passed through with toluene, and the obtained solution was dropped into 1400 ml of methanol, producing a precipitate, and the precipitate was filtered and dried to obtain a solid. The solid was dissolved in 400 ml of toluene and dropped into 1400 ml of methanol, producing a precipitate, and the precipitate was filtered and dried to obtain 6.33 g of a polymer (hereunder referred to as "hole transporting polymer compound (C-1)"). The polystyrene-equivalent number-average molecular weight Mn of hole transporting polymer compound (C-1) was $8.8 \times 10^4$, and the polystyrene-equivalent weight-average molecular weight Mw was $3.2 \times 10^5$.

Hole transporting polymer compound (C-1) is inferred to be a polymer comprising a repeating unit represented by the following formula (c-3) and a repeating unit represented by the following formula (c-4) in a molar ratio of 1:1.

[Chemical Formula 47]

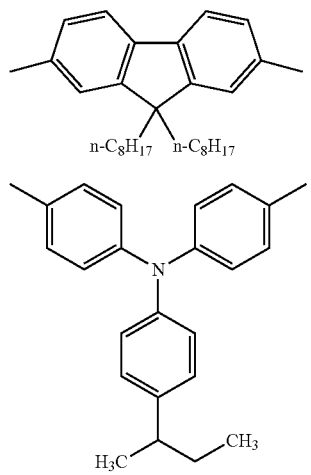

(c-3)

(c-4)

Fabrication of Organic EL Element

Example 1

A solution of poly(ethylenedioxythiophene)/polystyrenesulfonic acid (Bayer Ltd., trade name: AI4083) was used for film formation by spin coating to a thickness of 65 nm on a glass panel which had an ITO film with a thickness of 45 nm formed thereon by sputtering, and the film was dried for 10 minutes at 200° C. on a hot plate.

Next, hole transporting polymer compound (C-1) was spin coated as a 0.7 mass % xylene solution, to form a film with a thickness of approximately 20 nm. It was then heat treated for 60 minutes on a hot plate at 180° C.

A solution of conjugated polymer compound (B-1) dissolved in a xylene solvent to a concentration of 1.2 mass %, and a solution of luminescent organic compound (A-3) dissolved in a xylene solvent to a concentration of 1.2 mass %, were then combined at a mass ratio of 97:3 to prepare luminescent composition 1. The convolution integral f(g, h) of luminescent composition 1 was 4.747, and f(g, h)×w was 0.142. FIG. 1 shows the gram absorption coefficient spectrum for luminescent organic compound (A-3) dissolved in a toluene solution to $8 \times 10^{-4}$ mass %, and the emission spectrum for conjugated polymer compound (B-1) in the film, normalized with the highest luminescence maximum as 1.

Luminescent composition 1 was spin coated to form a film, at a rotational speed of 2400 rpm. The thickness was approximately 60 nm. This was dried for 10 minutes at 130° C. under a nitrogen gas atmosphere, and then subjected to vapor deposition of sodium fluoride to about 3 nm and then aluminum to about 80 nm, as the cathode, to fabricate an organic EL element. Vapor deposition of the metals was initiated after the degree of vacuum reached at least $1 \times 10^{-4}$ Pa.

When a voltage was applied to the obtained organic EL element, EL luminescence with a peak at 450 nm due to luminescent organic compound (A-3) was obtained from the element. Luminescence from the element began from 3.0 V, and luminescence of 1000 cd/m² was exhibited at 4.8 V, with a maximum luminous efficiency of 1.65 cd/A.

After setting the current value of the obtained organic EL element for an initial brightness of 100 cd/m², it was driven at constant current and the time-dependent change in brightness was measured. As a result, the brightness was reduced by half after 58.5 hours.

Example 2

A solution of conjugated polymer compound (B-1) dissolved in a xylene solvent to a concentration of 1.2 mass %, and a solution of luminescent organic compound (A-3) dissolved in a xylene solvent to a concentration of 1.2 mass %, were combined at a mass ratio of 95:5 to prepare luminescent composition 2. An organic EL element was fabricated in the same manner as Example 1, except that luminescent composition 2 was used instead of luminescent composition 1. The convolution integral f(g, h) of luminescent composition 2 was 4.747, and f(g, h)×w was 0.237.

When a voltage was applied to the obtained organic EL element, EL luminescence with a peak at 450 nm due to luminescent organic compound (A-3) was obtained. Luminescence from the element began from 3.0 V, and luminescence of 1000 cd/m² was exhibited at 5.0 V, with a maximum luminous efficiency of 1.39 cd/A.

After setting the current value of the obtained organic EL element for an initial brightness of 100 cd/m², it was driven at constant current and the time-dependent change in brightness was measured. As a result, the brightness was reduced by half after 82.65 hours.

Example 3

A solution of conjugated polymer compound (B-1) dissolved in a xylene solvent to a concentration of 1.2 mass %, and a solution of luminescent organic compound (A-6) dissolved in a xylene solvent to a concentration of 1.2 mass %, were combined at a mass ratio of 97:3 to prepare luminescent composition 3. An organic EL element was fabricated in the same manner as Example 1, except that luminescent composition 3 was used instead of luminescent composition 1. The convolution integral f(g, h) of luminescent composition 3 was 7.719, and f(g, h)×w was 0.232.

When a voltage was applied to the obtained organic EL element, EL luminescence with a peak at 445 nm due to luminescent organic compound (A-6) was obtained. Luminescence from the element began from 3.1 V, and luminescence of 1000 cd/m² was exhibited at 5.5 V, with a maximum luminous efficiency of 1.33 cd/A.

After setting the current value of the obtained organic EL element for an initial brightness of 100 cd/m², it was driven at constant current and the time-dependent change in brightness was measured. As a result, the brightness was reduced by half after 76.3 hours.

Example 4

A solution of conjugated polymer compound (B-1) dissolved in a xylene solvent to a concentration of 1.2 mass %, and a solution of luminescent organic compound (A-6) dissolved in a xylene solvent to a concentration of 1.2 mass %, were combined at a mass ratio of 99:1 to prepare luminescent composition 4. An organic EL element was fabricated in the same manner as Example 1, except that luminescent composition 4 was used instead of luminescent composition 1. The convolution integral f(g, h) of luminescent composition 4 was 7.719, and f(g, h)×w was 0.0772.

When a voltage was applied to the obtained organic EL element, organic EL luminescence with a peak at 445 nm was obtained. Luminescence from the element began from 3.0 V, and luminescence of 1000 cd/m$^2$ was exhibited at 5.3 V, with a maximum luminous efficiency of 1.49 cd/A.

After setting the current value of the obtained organic EL element for an initial brightness of 100 cd/m$^2$, it was driven at constant current and the time-dependent change in brightness was measured. As a result, the brightness was reduced by half after 16.7 hours.

Example 5

A solution of conjugated polymer compound (B-1) dissolved in a xylene solvent to a concentration of 1.2 mass %, and a solution of luminescent organic compound (A-7) dissolved in a xylene solvent to a concentration of 1.2 mass %, were combined at a mass ratio of 97:3 to prepare luminescent composition 5. An organic EL element was fabricated in the same manner as Example 1, except that luminescent composition 5 was used instead of luminescent composition 1. The convolution integral f(g, h) of luminescent composition 5 was 8.733, and f(g, h)×w was 0.262.

When a voltage was applied to the obtained organic EL element, organic EL luminescence with a peak at 455 nm was obtained. Luminescence from the element began from 3.0 V, and luminescence of 1000 cd/m$^2$ was exhibited at 4.8 V, with a maximum luminous efficiency of 1.97 cd/A.

After setting the current value of the obtained organic EL element for an initial brightness of 100 cd/m$^2$, it was driven at constant current and the time-dependent change in brightness was measured. As a result, the brightness was reduced by half after 194.0 hours.

Example 6

A solution of conjugated polymer compound (B-1) dissolved in a xylene solvent to a concentration of 1.2 mass %, and a solution of luminescent organic compound (A-7) dissolved in a xylene solvent to a concentration of 1.2 mass %, were combined at a mass ratio of 95:5 to prepare luminescent composition 6. An organic EL element was fabricated in the same manner as Example 1, except that luminescent composition 6 was used instead of luminescent composition 1. The convolution integral f(g, h) of luminescent composition 6 was 8.740, and f(g, h)×w was 0.437.

When a voltage was applied to the obtained organic EL element, organic EL luminescence with a peak at 455 nm was obtained. Luminescence from the element began from 3.0 V, and luminescence of 1000 cd/m$^2$ was exhibited at 5.4 V, with a maximum luminous efficiency of 1.74 cd/A.

After setting the current value of the obtained organic EL element for an initial brightness of 100 cd/m$^2$, it was driven at constant current and the time-dependent change in brightness was measured. As a result, the brightness was reduced by half after 354.4 hours.

Example 7

A solution of conjugated polymer compound (B-1) dissolved in a xylene solvent to a concentration of 1.2 mass %, and a solution of luminescent organic compound (A-7) dissolved in a xylene solvent to a concentration of 1.2 mass %, were combined at a mass ratio of 98:2 to prepare luminescent composition 7. An organic EL element was fabricated in the same manner as Example 1, except that luminescent composition 7 was used instead of luminescent composition 1. The convolution integral f(g, h) of luminescent composition 7 was 8.738, and f(g, h)×w was 0.175.

When a voltage was applied to the obtained organic EL element, organic EL luminescence with a peak at 455 nm was obtained. Luminescence from the element began from 3.0 V, and luminescence of 1000 cd/m$^2$ was exhibited at 5.4 V, with a maximum luminous efficiency of 1.74 cd/A.

After setting the current value of the obtained organic EL element for an initial brightness of 100 cd/m$^2$, it was driven at constant current and the time-dependent change in brightness was measured. As a result, the brightness was reduced by half after 111.0 hours.

Example 8

A solution of conjugated polymer compound (B-1) dissolved in a xylene solvent to a concentration of 1.2 mass %, and a solution of luminescent organic compound (A-7) dissolved in a xylene solvent to a concentration of 1.2 mass %, were combined at a mass ratio of 70:30 to prepare luminescent composition 8. An organic EL element was fabricated in the same manner as Example 1, except that luminescent composition 8 was used instead of luminescent composition 1. The convolution integral f(g, h) of luminescent composition 8 was 8.738, and f(g, h)×w was 2.621.

When a voltage was applied to the obtained organic EL element, organic EL luminescence with a peak at 450 nm was obtained. Luminescence from the element began from 3.0 V, and luminescence of 1000 cd/m$^2$ was exhibited at 6.3 V, with a maximum luminous efficiency of 0.72 cd/A.

After setting the current value of the obtained organic EL element for an initial brightness of 100 cd/m$^2$, it was driven at constant current and the time-dependent change in brightness was measured. As a result, the brightness was reduced by half after 797.24 hours.

Example 9

A solution of conjugated polymer compound (B-1) dissolved in a xylene solvent to a concentration of 1.2 mass %, and a solution of luminescent organic compound (A-8) dissolved in a xylene solvent to a concentration of 1.2 mass %, were combined at a mass ratio of 99:1 to prepare luminescent composition 9. An organic EL element was fabricated in the same manner as Example 1, except that luminescent composition 9 was used instead of luminescent composition 1. The convolution integral f(g, h) of luminescent composition 9 was 13.240, and f(g, h)×w was 0.132.

When a voltage was applied to the obtained organic EL element, organic EL luminescence with a peak at 455 nm was obtained. Luminescence from the element began from 2.9 V, and luminescence of 1000 cd/m$^2$ was exhibited at 4.5 V, with a maximum luminous efficiency of 3.45 cd/A.

After setting the current value of the obtained organic EL element for an initial brightness of 100 cd/m$^2$, it was driven at constant current and the time-dependent change in brightness was measured. As a result, the brightness was reduced by half after 120.58 hours.

Example 10

A solution of conjugated polymer compound (B-1) dissolved in a xylene solvent to a concentration of 1.2 mass %, and a solution of luminescent organic compound (A-8)

dissolved in a xylene solvent to a concentration of 1.2 mass %, were combined at a mass ratio of 97:3 to prepare luminescent composition 10. An organic EL element was fabricated in the same manner as Example 1, except that luminescent composition 10 was used instead of luminescent composition 1. The convolution integral f(g, h) of luminescent composition 10 was 13.240, and f(g, h)×w was 0.397.

When a voltage was applied to the obtained organic EL element, organic EL luminescence with a peak at 455 nm was obtained. Luminescence from the element began from 2.8 V, and luminescence of 1000 cd/m² was exhibited at 4.4 V, with a maximum luminous efficiency of 4.35 cd/A.

After setting the current value of the obtained organic EL element for an initial brightness of 100 cd/m², it was driven at constant current and the time-dependent change in brightness was measured. As a result, the brightness was reduced by half after 477.9 hours.

Example 11

A solution of conjugated polymer compound (B-1) dissolved in a xylene solvent to a concentration of 1.2 mass %, and a solution of luminescent organic compound (A-9) dissolved in a xylene solvent to a concentration of 1.2 mass %, were combined at a mass ratio of 97:3 to prepare luminescent composition 11. An organic EL element was fabricated in the same manner as Example 1, except that luminescent composition 11 was used instead of luminescent composition 1. The convolution integral f(g, h) of luminescent composition 11 was 2.467, and f(g, h)×w was 0.0740.

When a voltage was applied to the obtained organic EL element, organic EL luminescence with a peak at 455 nm was obtained. Luminescence from the element began from 3.0 V, and luminescence of 1000 cd/m² was exhibited at 5.4 V, with a maximum luminous efficiency of 0.95 cd/A.

After setting the current value of the obtained organic EL element for an initial brightness of 100 cd/m², it was driven at constant current and the time-dependent change in brightness was measured. As a result, the brightness was reduced by half after 15.33 hours.

Example 12

A solution of conjugated polymer compound (B-1) dissolved in a xylene solvent to a concentration of 1.2 mass %, and a solution of luminescent organic compound (A-9) dissolved in a xylene solvent to a concentration of 1.2 mass %, were combined at a mass ratio of 98:2 to prepare luminescent composition 12. An organic EL element was fabricated in the same manner as Example 1, except that luminescent composition 12 was used instead of luminescent composition 1. The convolution integral f(g, h) of luminescent composition 12 was 2.467, and f(g, h)×w was 0.0493.

When a voltage was applied to the obtained organic EL element, organic EL luminescence with a peak at 460 nm was obtained. Luminescence from the element began from 3.0 V, and luminescence of 1000 cd/m² was exhibited at 5.4 V, with a maximum luminous efficiency of 1.02 cd/A.

After setting the current value of the obtained organic EL element for an initial brightness of 100 cd/m², it was driven at constant current and the time-dependent change in brightness was measured. As a result, the brightness was reduced by half after 16.0 hours.

Example 13

A solution of conjugated polymer compound (B-1) dissolved in a xylene solvent to a concentration of 1.2 mass %, and a solution of luminescent organic compound (A-6) dissolved in a xylene solvent to a concentration of 1.2 mass %, were combined at a mass ratio of 60:40 to prepare luminescent composition 13. An organic EL element was fabricated in the same manner as Example 1, except that luminescent composition 13 was used instead of luminescent composition 1. The convolution integral f(g, h) of luminescent composition 13 was 7.719, and f(g, h)×w was 3.088.

When a voltage was applied to the obtained organic EL element, organic EL luminescence with a peak at 475 nm was obtained. Luminescence from the element began from 2.9 V, and luminescence of 1000 cd/m² was exhibited at 6.4 V, with a maximum luminous efficiency of 0.88 cd/A.

After setting the current value of the obtained organic EL element for an initial brightness of 100 cd/m², it was driven at constant current and the time-dependent change in brightness was measured. As a result, the brightness was reduced by half after 231.3 hours.

Example 14

A solution of conjugated polymer compound (B-1) dissolved in a xylene solvent to a concentration of 1.2 mass %, and a solution of luminescent organic compound (A-3) dissolved in a xylene solvent to a concentration of 1.2 mass %, were combined at a mass ratio of 80:20 to prepare luminescent composition 14. An organic EL element was fabricated in the same manner as Example 1, except that luminescent composition 14 was used instead of luminescent composition 1. The convolution integral f(g, h) of luminescent composition 14 was 4.747, and f(g, h)×w was 0.949.

When a voltage was applied to the obtained organic EL element, organic EL luminescence with a peak at 450 nm was obtained. Luminescence from the element began from 3.0 V, and luminescence of 1000 cd/m² was exhibited at 5.7 V, with a maximum luminous efficiency of 1.03 cd/A.

After setting the current value of the obtained organic EL element for an initial brightness of 100 cd/m², it was driven at constant current and the time-dependent change in brightness was measured. As a result, the brightness was reduced by half after 324.1 hours.

Example 15

A solution of conjugated polymer compound (B-1) dissolved in a xylene solvent to a concentration of 1.2 mass %, and a solution of luminescent organic compound (A-3) dissolved in a xylene solvent to a concentration of 1.2 mass %, were combined at a mass ratio of 90:10 to prepare luminescent composition 15. An organic EL element was fabricated in the same manner as Example 1, except that luminescent composition 15 was used instead of luminescent composition 1. The convolution integral f(g, h) of luminescent composition 15 was 4.747, and f(g, h)×w was 0.475.

When a voltage was applied to the obtained organic EL element, organic EL luminescence with a peak at 450 nm was obtained. Luminescence from the element began from 3.0 V, and luminescence of 1000 cd/m² was exhibited at 5.4 V, with a maximum luminous efficiency of 1.34 cd/A.

After setting the current value of the obtained organic EL element for an initial brightness of 100 cd/m², it was driven at constant current and the time-dependent change in brightness was measured. As a result, the brightness was reduced by half after 187.8 hours.

Example 16

A solution of conjugated polymer compound (B-2) dissolved in a xylene solvent to a concentration of 1.2 mass %, and a solution of luminescent organic compound (A-3) dissolved in a xylene solvent to a concentration of 1.2 mass %, were combined at a mass ratio of 95:5 to prepare luminescent composition 16. An organic EL element was fabricated in the same manner as Example 1, except that luminescent composition 16 was used instead of luminescent composition 1. The convolution integral f(g, h) of luminescent composition 16 was 2.970, and f(g, h)×w was 0.149.

When a voltage was applied to the obtained organic EL element, organic EL luminescence with a peak at 445 nm was obtained. Luminescence from the element began from 2.7 V, and luminescence of 1000 cd/m² was exhibited at 4.6 V, with a maximum luminous efficiency of 2.88 cd/A.

After setting the current value of the obtained organic EL element for an initial brightness of 100 cd/m², it was driven at constant current and the time-dependent change in brightness was measured. As a result, the brightness was reduced by half after 382.2 hours.

Example 17

A solution of conjugated polymer compound (B-2) dissolved in a xylene solvent to a concentration of 1.2 mass %, and a solution of luminescent organic compound (A-7) dissolved in a xylene solvent to a concentration of 1.2 mass %, were combined at a mass ratio of 95:5 to prepare luminescent composition 17. An organic EL element was fabricated in the same manner as Example 1, except that luminescent composition 17 was used instead of luminescent composition 1. The convolution integral f(g, h) of luminescent composition 17 was 6.346, and f(g, h)×w was 0.317.

When a voltage was applied to the obtained organic EL element, organic EL luminescence with a peak at 455 nm was obtained. Luminescence from the element began from 3.0 V, and luminescence of 1000 cd/m² was exhibited at 5.2 V, with a maximum luminous efficiency of 2.91 cd/A.

After setting the current value of the obtained organic EL element for an initial brightness of 100 cd/m², it was driven at constant current and the time-dependent change in brightness was measured. As a result, the brightness was reduced by half after 255.2 hours.

Comparative Example 1

A solution of conjugated polymer compound (B-1) dissolved in a xylene solvent to a concentration of 1.2 mass %, and a solution of luminescent organic compound (A-1) dissolved in a xylene solvent to a concentration of 1.2 mass %, were combined at a mass ratio of 97:3 to prepare luminescent composition A. An organic EL element was fabricated in the same manner as Example 1, except that luminescent composition A was used instead of luminescent composition 1. The convolution integral f(g, h) of luminescent composition A was 0.300, and f(g, h)×w was 0.009.

When a voltage was applied to the obtained organic EL element, organic EL luminescence with a peak at 440 nm was obtained. Luminescence from the element began from 3.05 V, and luminescence of 1000 cd/m² was exhibited at 5.8 V, with a maximum luminous efficiency of 0.76 cd/A.

After setting the current value of the obtained organic EL element for an initial brightness of 100 cd/m², it was driven at constant current and the time-dependent change in brightness was measured. As a result, the brightness was reduced by half after 3.1 hours.

Comparative Example 2

A solution of conjugated polymer compound (B-1) dissolved in a xylene solvent to a concentration of 1.2 mass %, and a solution of luminescent organic compound (A-2) dissolved in a xylene solvent to a concentration of 1.2 mass %, were combined at a mass ratio of 99:1 to prepare luminescent composition B. An organic EL element was fabricated in the same manner as Example 1, except that luminescent composition B was used instead of luminescent composition 1. The convolution integral f(g, h) of luminescent composition B was 2.467, and f(g, h)×w was 0.0247.

When a voltage was applied to the obtained organic EL element, organic EL luminescence with a peak at 440 nm was obtained. Luminescence from the element began from 3.05 V, and luminescence of 1000 cd/m² was exhibited at 5.3 V, with a maximum luminous efficiency of 0.95 cd/A.

After setting the current value of the obtained organic EL element for an initial brightness of 100 cd/m², it was driven at constant current and the time-dependent change in brightness was measured. As a result, the brightness was reduced by half after 7.5 hours.

Reference Example 1

An organic EL element was fabricated in the same manner as Example 1, except that a solution of conjugated polymer compound (B-1) dissolved in a xylene solvent to a concentration of 1.2 mass % was used instead of luminescent composition 1. The convolution integral f(g, h) of conjugated polymer compound (B-1) alone was 0, and f(g, h)×w was 0.

When a voltage was applied to the obtained organic EL element, organic EL luminescence with a peak at 440 nm was obtained. Luminescence from the element began from 3.2 V, and luminescence of 1000 cd/m² was exhibited at 6.0 V, with a maximum luminous efficiency of 1.18 cd/A.

After setting the current value of the obtained organic EL element for an initial brightness of 100 cd/m², it was driven at constant current and the time-dependent change in brightness was measured. As a result, the brightness was reduced by half after 3.3 hours.

Figure 2:
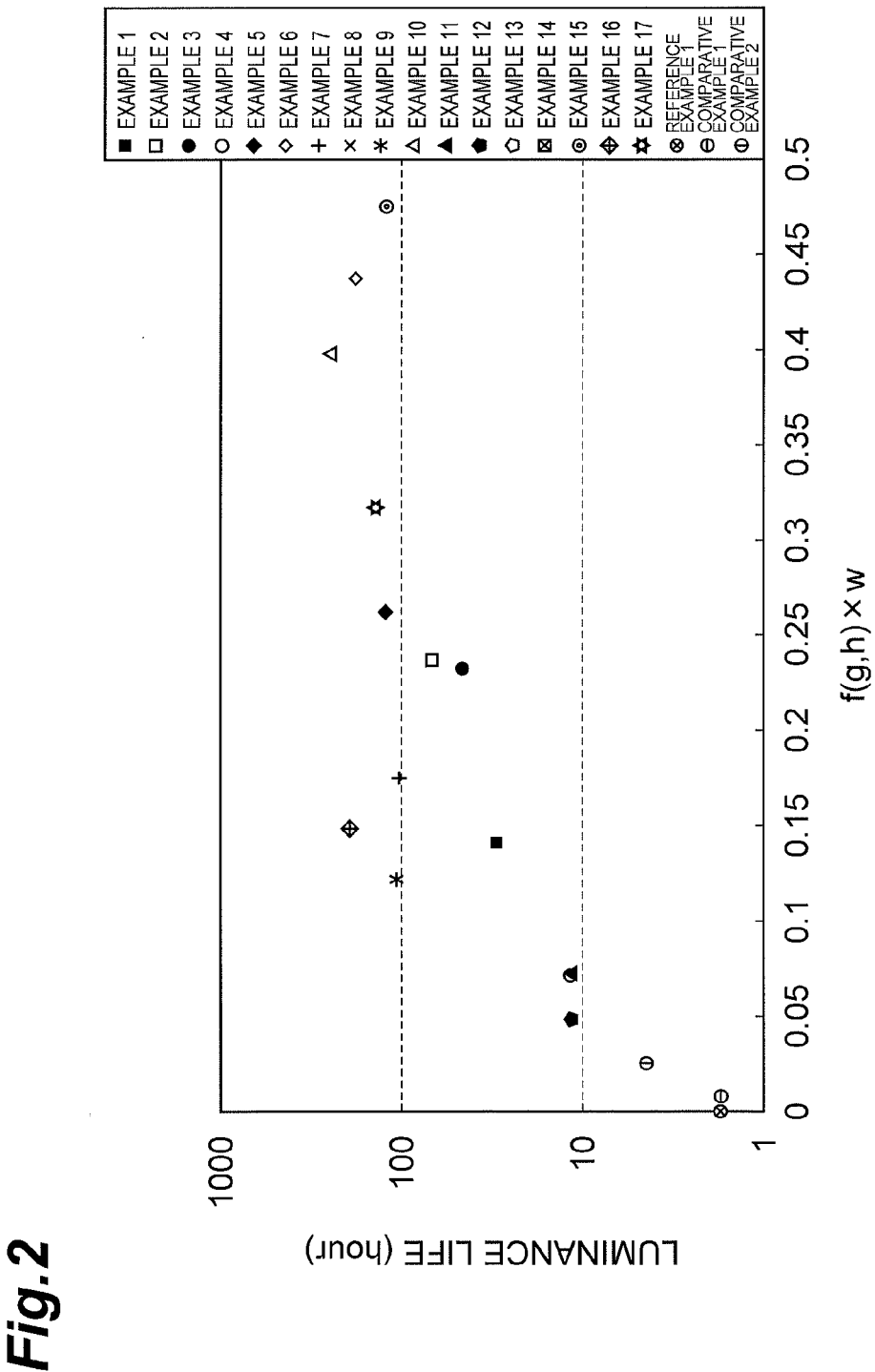
FIG. 2 is a graph showing the luminance life with respect to f(g, h)×w, for Examples 1 to 17, Comparative Examples 1 and 2 and Reference Example 1.

FIG. 2 is a graph showing the luminance life with respect to f(g, h)×w, for Examples 1 to 17, Comparative Examples 1 and 2 and Reference Example 1.

The invention claimed is:

1. A luminescent composition comprising:
    a luminescent organic compound represented by the following formula (5-1), (5-2), (5-3), (5-4), (5-5), (5-6), (5-7), (5-8), (5-9), (5-10) or (5-11)

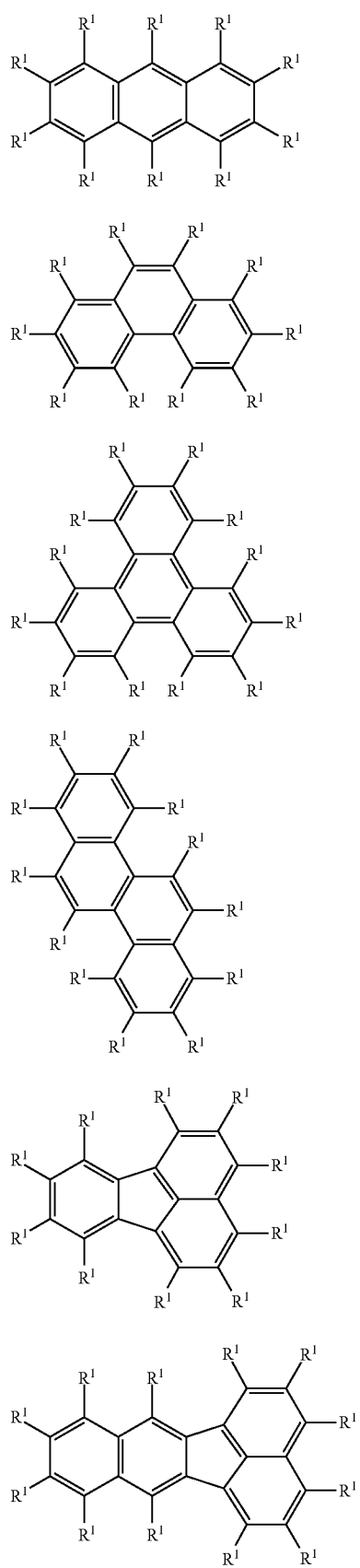
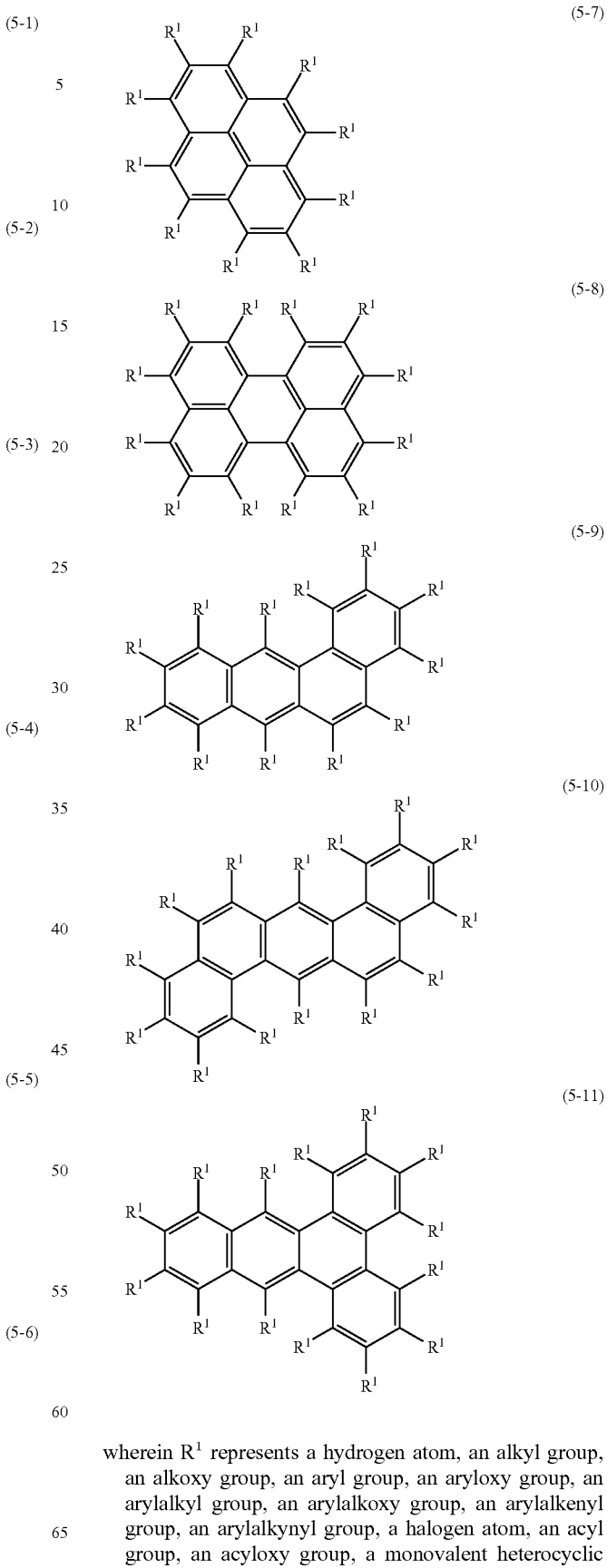
wherein R¹ represents a hydrogen atom, an alkyl group, an alkoxy group, an aryl group, an aryloxy group, an arylalkyl group, an arylalkoxy group, an arylalkenyl group, an arylalkynyl group, a halogen atom, an acyl group, an acyloxy group, a monovalent heterocyclic group or a carboxyl group, multiple R¹ groups may be the same or different, and multiple $R^1$ groups bonded to carbon atoms at adjacent positions may together form a ring, so long as the highest luminescence maximum does not exceed 480 nm, with the proviso that at least one of the $R^1$ groups is a group represented by the following formula (6-11) having at least one substituent selected from the group consisting of alkyl groups and alkoxy groups

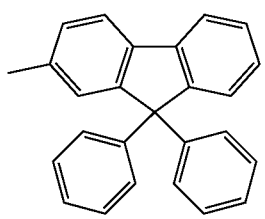

(6-11)

and a conjugated polymer compound having an arylene group as a repeating unit on the main chain, wherein at least 50% of the arylene groups are connected with each other by a direct bond or by a nitrogen atom, a vinylene group or an acetylene group, the conjugated polymer compound having a luminescence maximum further toward the short wavelength end than the luminescence maximum of the luminescent organic compound at 350 nm to 500 nm, and satisfying the following formula (1);

$$f(g,h) \times w \geq 0.12 \qquad (1)$$

in the formula, f(g, h) represents the convolution integral of the emission spectrum of the conjugated polymer compound and the gram absorption coefficient spectrum of the luminescent organic compound (L/g·cm) in the range of 200 nm to 800 nm, in 1 nm steps, and w represents the content of the luminescent organic compound where the total content of the luminescent organic compound and conjugated polymer compound in the luminescent composition is defined as 1 part by mass;

for the emission spectrum, the emission spectrum obtained by excitation of the conjugated polymer compound with 360 nm light was normalized with the maximum luminescence intensity at 350 nm to 500 nm as 1, wherein the conjugated polymer compound has a repeating unit represented by the following formula (2):

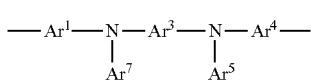

(2)

in the formula, $Ar^1$ and $Ar^4$ each independently represent an optionally substituted arylene group or an optionally substituted divalent heterocyclic group, $Ar^3$ represents an arylene group having a fused ring, and $Ar^5$ and $Ar^7$ each independently represent an optionally substituted aryl group or an optionally substituted monovalent heterocyclic group.

2. The luminescent composition according to claim 1, wherein the conjugated polymer compound has a repeating unit represented by the following formula (3);

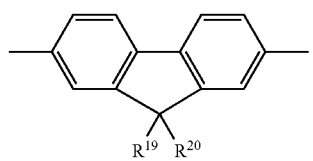

(3)

in the formula, $R^{19}$ and $R^{20}$ each independently represent an optionally substituted alkyl group, an optionally substituted aryl group or an optionally substituted monovalent heterocyclic group.

3. The luminescent composition according to claim 1, wherein the luminescence maximum, representing the maximum luminescence intensity of the conjugated polymer compound, is no longer than 440 nm.

4. The luminescent composition according to claim 1, wherein the luminescent organic compound emits blue luminescence having a highest luminescence maximum between 420 and 480 nm.

5. The luminescent composition according to claim 4, wherein the blue luminescence is blue fluorescence.

6. The luminescent composition according to claim 1, wherein the luminescent organic compound content is 0.002 to 0.30 part by mass, where the total content of the luminescent organic compound and the conjugated polymer compound is defined as 1 part by mass.

7. A liquid composition comprising the luminescent composition according to claim 1, and a solvent or dispersing medium for the luminescent composition.

8. A film comprising the luminescent composition according to claim 1.

9. A light-emitting device provided with an anode, a cathode, and a layer comprising the luminescent composition according to claim 1, formed between them.

10. A planar light source comprising the light-emitting device according to claim 9.

11. A lighting comprising the light-emitting device according to claim 9.

12. A method for producing a light-emitting device with increased luminance life, wherein a luminescent composition comprising a luminescent organic compound represented by the following formula (5-1), (5-2), (5-3), (5-4), (5-5), (5-6), (5-7), (5-8), (5-9), (5-10) or (5-11)

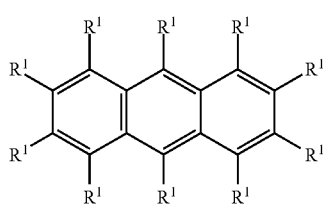

(5-1)

(5-2) 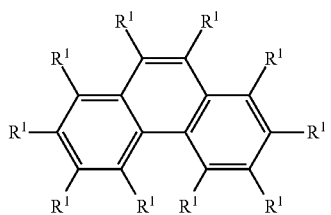
(5-3) 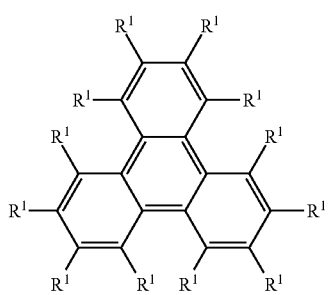
(5-4) 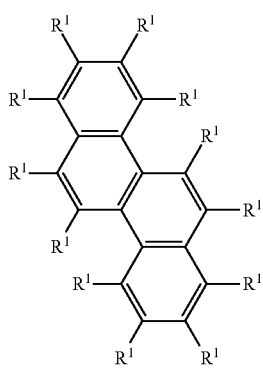
(5-5) 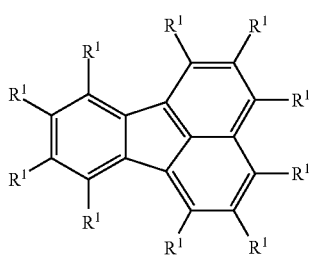
(5-6) 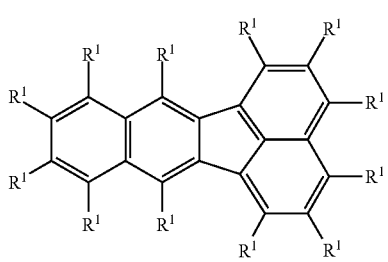
(5-7) 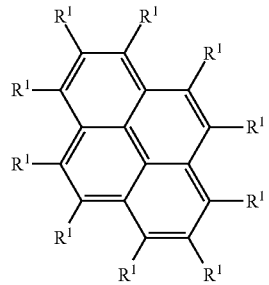
(5-8) 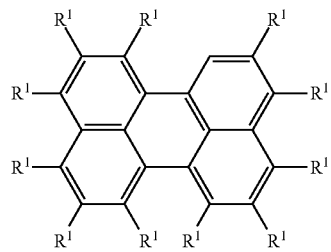
(5-9) 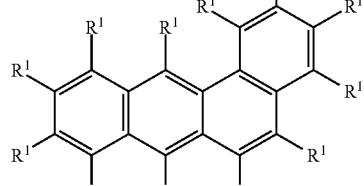
(5-10) 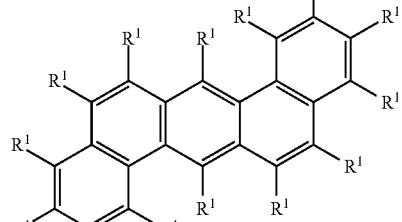
(5-11) 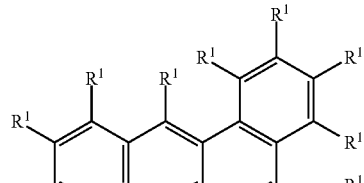
wherein $R^1$ represents a hydrogen atom, an alkyl group, an alkoxy group, an aryl group, an aryloxy group, an arylalkyl group, an arylalkoxy group, an arylalkenyl group, an arylalkynyl group, a halogen atom, an acyl group, an acyloxy group, a monovalent heterocyclic group or a carboxyl group, multiple $R^1$ groups may be the same or different, and multiple $R^1$ groups bonded to carbon atoms at adjacent positions may together form a ring, so long as the highest luminescence maximum does not exceed 480 nm, with the proviso that at least one of the $R^1$ groups is a group represented by the following formula (6-11) having at least one substituent selected from the group consisting of alkyl groups and alkoxy groups

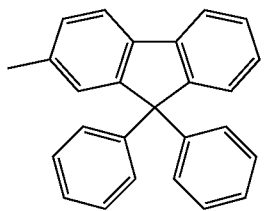
(6-11)

and a conjugated polymer compound having an arylene group as a repeating unit on the main chain, wherein at least 50% of the arylene groups are connected with each other by a direct bond or by a nitrogen atom, a vinylene group or an acetylene group, the conjugated polymer compound having a luminescence maximum further toward the short wavelength end than the luminescence maximum of the luminescent organic compound at 350 nm to 500 nm, and satisfying the following formula (1), is added to a luminescent layer in the aforementioned light-emitting device;

$$f(g,h) \times w \geq 0.12 \qquad (1)$$

in the formula, f(g, h) represents the convolution integral of the emission spectrum of the conjugated polymer compound and the gram absorption coefficient spectrum of the luminescent organic compound (L/g·cm) in the range of 200 nm to 800 nm, in 1 nm steps, and w represents the content of the luminescent organic compound where the total content of the luminescent organic compound and conjugated polymer compound in the luminescent composition is defined as 1 part by mass;

for the emission spectrum, the emission spectrum obtained by excitation of the conjugated polymer compound with 360 nm light was normalized with the maximum luminescence intensity at 350 nm to 500 nm as 1, wherein the conjugated polymer compound has a repeating unit represented by the following formula (2):

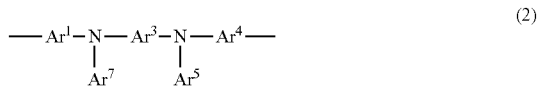
(2)

in the formula, $Ar^1$ and $Ar^4$ each independently represent an optionally substituted arylene group or an optionally substituted divalent heterocyclic group, $Ar^3$ represents an arylene group having a fused ring, and $Ar^5$ and $Ar^7$ each independently represent an optionally substituted aryl group or an optionally substituted monovalent heterocyclic group.

* * * * *